(12) United States Patent
Lin et al.

(10) Patent No.: US 12,199,157 B2
(45) Date of Patent: Jan. 14, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Shih-Che Lin, Hsinchu (TW); Tzu-Yang Ho, Hsinchu (TW); Chen-Ming Lee, Taoyuan (TW); Fu-Kai Yang, Hsinchu (TW); Mei-Yun Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 404 days.

(21) Appl. No.: 17/700,357

(22) Filed: Mar. 21, 2022

(65) Prior Publication Data
US 2023/0317805 A1   Oct. 5, 2023

(51) Int. Cl.
*H01L 21/768* (2006.01)
*H01L 29/417* (2006.01)
*H01L 29/66* (2006.01)
*H01L 29/78* (2006.01)

(52) U.S. Cl.
CPC .. *H01L 29/41791* (2013.01); *H01L 21/76843* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |

(Continued)

FOREIGN PATENT DOCUMENTS

| | | |
|---|---|---|
| TW | 201926433 A | 7/2019 |
| TW | 202018764 A | 5/2020 |
| TW | 202107545 A | 2/2021 |

OTHER PUBLICATIONS

U.S. Appl. No. 17/461,638, filed Aug. 30, 2021.
U.S. Appl. No. 17/546,598, filed Dec. 9, 2021.

*Primary Examiner* — Xiaoming Liu
(74) *Attorney, Agent, or Firm* — NZ CARR LAW OFFICE

(57) ABSTRACT

A semiconductor device structure, along with methods of forming such, are described. The semiconductor device structure includes a gate electrode layer disposed over a substrate, a source/drain epitaxial feature disposed over the substrate, a first hard mask layer disposed over the gate electrode layer, and a contact etch stop layer (CESL) disposed over the source/drain epitaxial feature. The structure further includes a first interlayer dielectric (ILD) layer disposed on the CESL and a first treated portion of a second hard mask layer disposed on the CESL and the first ILD layer. A top surface of the first hard mask layer and a top surface of the first treated portion of the second mask layer are substantially coplanar. The structure further includes an etch stop layer disposed on the first hard mask layer and the first treated portion of the second mask layer.

20 Claims, 49 Drawing Sheets

(56) References Cited

U.S. PATENT DOCUMENTS

| | | |
|---|---|---|
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,249,729 B1 | 4/2019 | Chen et al. |
| 2014/0103454 A1 | 4/2014 | Fung et al. |
| 2020/0105609 A1 | 4/2020 | Wang et al. |

SEMICONDUCTOR DEVICE STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the dimensions of features in the front-end-of-line (FEOL) get smaller, conductive contacts in the middle-of-line (MOL) and the metal gate may get too close to create a short circuit. Therefore, an improved semiconductor device structure and methods of forming the same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-10A are cross-sectional side views of various stages of manufacturing the semiconductor device structure of FIG. 4 taken along line A-A, in accordance with some embodiments.

FIGS. 5B-10B are cross-sectional side views of various stages of manufacturing the semiconductor device structure of FIG. 4 taken along line B-B, in accordance with some embodiments.

FIGS. 5C-10C are cross-sectional side views of various stages of manufacturing the semiconductor device structure of FIG. 4 taken along line C-C, in accordance with some embodiments.

DETAILED DESCRIPTION

Figure 1:
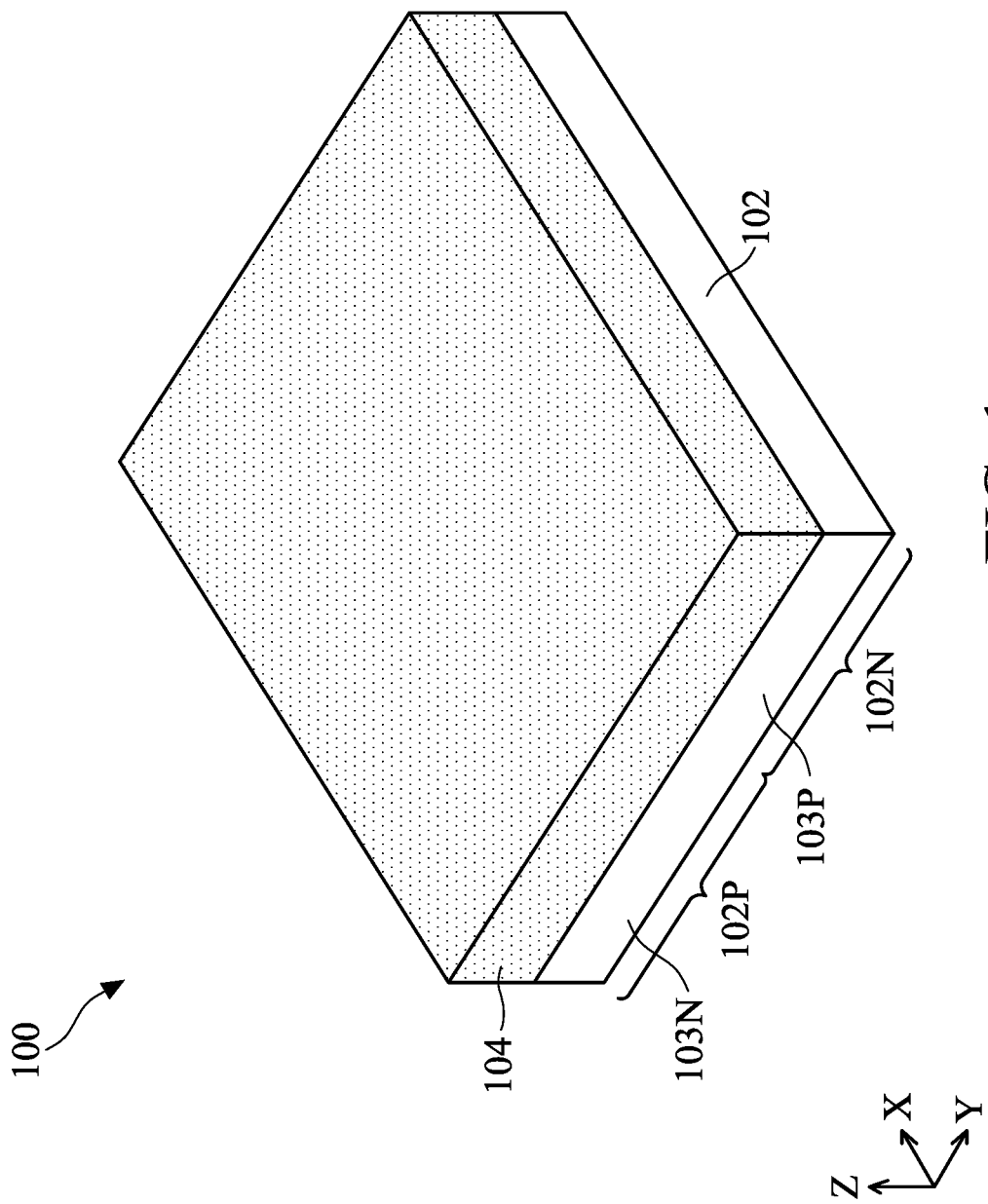
FIGS. 1-4 are perspective views of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-12Z illustrate various stages of manufacturing a semiconductor device structure 100 in accordance with various embodiments of this disclosure. It is understood that additional operations can be provided before, during, and after processes shown by FIGS. 1-12Z and some of the operations described below can be replaced or eliminated, for additional embodiments of the method. The order of the operations/processes may be interchangeable.

FIGS. 1-4 are perspective views of the semiconductor device structure 100, in accordance with some embodiments. In FIG. 1, a first semiconductor layer 104 is formed on a substrate 102. The substrate may be a part of a chip in a wafer. In some embodiments, the substrate 102 is a bulk semiconductor substrate, such as a semiconductor wafer. For example, the substrate 102 is a silicon wafer. The substrate 102 may include silicon or another elementary semiconductor material such as germanium. In some other embodiments, the substrate 102 includes a compound semiconductor. The compound semiconductor may include gallium arsenide, silicon carbide, indium arsenide, indium phosphide, another suitable semiconductor material, or a combination thereof. In some embodiments, the substrate 102 is a semiconductor-on-insulator (SOI) substrate. The SOI substrate may be fabricated using a separation by implantation of oxygen (SIMOX) process, a wafer bonding process, another applicable method, or a combination thereof.

The substrate 102 may be doped with P-type or N-type impurities. As shown in FIG. 1, the substrate 102 has a P-type metal-oxide-semiconductor region 102P (PMOS region 102P) and an N-type metal-oxide-semiconductor region 102N (NMOS region 102N) adjacent to the PMOS region 102P, in accordance with some embodiments. While not shown in scale in some figures, the PMOS region 102P and NMOS region 102N belong to a continuous substrate 102. In some embodiments of the present disclosure, the PMOS region 102P is used to form a PMOS structure thereon, whereas the NMOS region 102N is used to form an NMOS structure thereon. In some embodiments, an N-well region 103N and a P-well region 103P are formed in the substrate 102, as shown in FIG. 1. For example, the N-well region 103N is formed in the substrate 102 in the PMOS region 102P, whereas the P-well region 103P is formed in the substrate 102 in the NMOS region 102N. The P-well region 103P and the N-well region 103N may be formed by any suitable technique, for example, by separate ion implantation processes in some embodiments. By using two different implantation mask layers (not shown), the P-well region 103P and the N-well region 103N can be sequentially formed in different ion implantation processes.

The first semiconductor layer 104 is deposited over the substrate 102, as shown in FIG. 1. The first semiconductor layer 104 may be made of any suitable semiconductor material, such as silicon, germanium, III-V semiconductor material, or combinations thereof. In some embodiments, the first semiconductor layer 104 is substantially made of silicon. The first semiconductor layer 104 may be formed by an epitaxial growth process, such as metal-organic chemical vapor deposition (MOCVD), metal-organic vapor phase epitaxy (MOVPE), plasma-enhanced chemical vapor deposition (PECVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable process.

Figure 2:
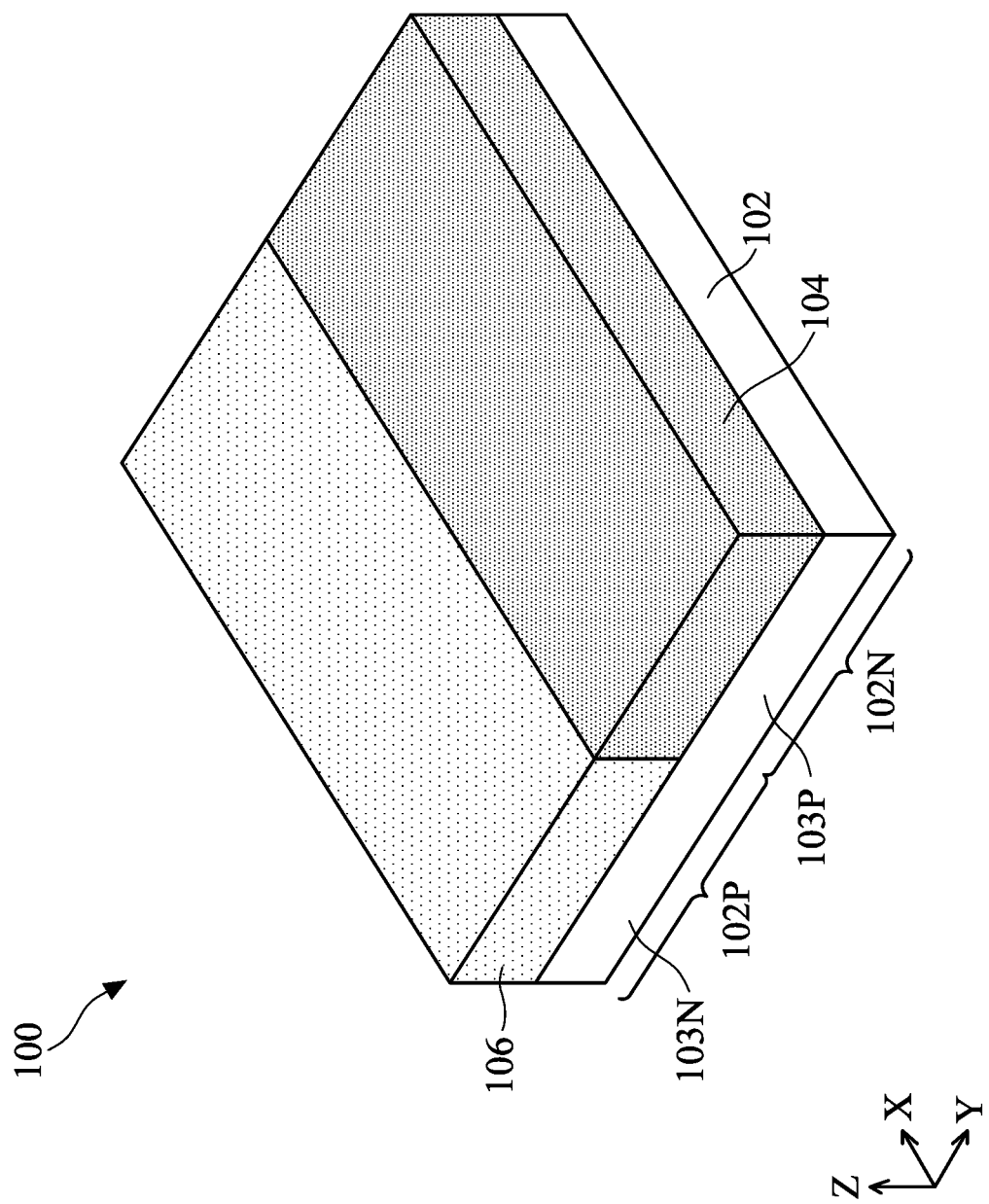

In FIG. 2, the portion of the first semiconductor layer 104 disposed over the N-well region 103N is removed, and a second semiconductor layer 106 is formed over the N-well region 103N and adjacent the portion of the first semiconductor layer 104 disposed over the P-well region 103P. A patterned mask layer (not shown) may be first formed on the portion of the first semiconductor layer 104 disposed over the P-well region 103P, and the portion of the first semiconductor layer 104 disposed over the N-well region 103N may be exposed. A removal process, such as a dry etch, wet etch, or a combination thereof, may be performed to remove the portion of the first semiconductor layer 104 disposed over the N-well region 103N, and the N-well region 103N may be exposed. The removal process does not substantially affect the mask layer (not shown) formed on the portion of the first semiconductor layer 104 disposed over the P-well region 103P, which protects the portion of the first semiconductor layer 104 disposed over the P-well region 103P. Next, the second semiconductor layer 106 is formed on the exposed N-well region 103N. The second semiconductor layer 106 may be made of any suitable semiconductor material, such as silicon, germanium, III-V semiconductor material, or combinations thereof. In some embodiments, the second semiconductor layer 106 is substantially made of silicon germanium. The second semiconductor layer 106 may be formed by the same process as the first semiconductor layer 104. For example, the second semiconductor layer 106 may be formed on the exposed N-well region 103N by an epitaxial growth process, which does not form the second semiconductor layer 106 on the mask layer (not shown) disposed on the first semiconductor layer 104. As a result, the first semiconductor layer 104 is disposed over the P-well region 103P in the NMOS region 102N, and the second semiconductor layer 106 is disposed over the N-well region 103N in the PMOS region 102P.

Portions of the first semiconductor layer 104 may serve as channels in the subsequently formed NMOS structure in the NMOS region 102N. Portions of the second semiconductor layer 106 may serve as channels in the subsequently formed PMOS structure in the PMOS region 102P. In some embodiments, the NMOS structure and the PMOS structure are FinFETs. While embodiments described in this disclosure are described in the context of FinFETs, implementations of some aspects of the present disclosure may be used in other processes and/or in other devices, such as planar FETs, nanostructure FETs, Horizontal Gate All Around (HGAA) FETs, Vertical Gate All Around (VGAA) FETs, and other suitable devices.

Figure 3:
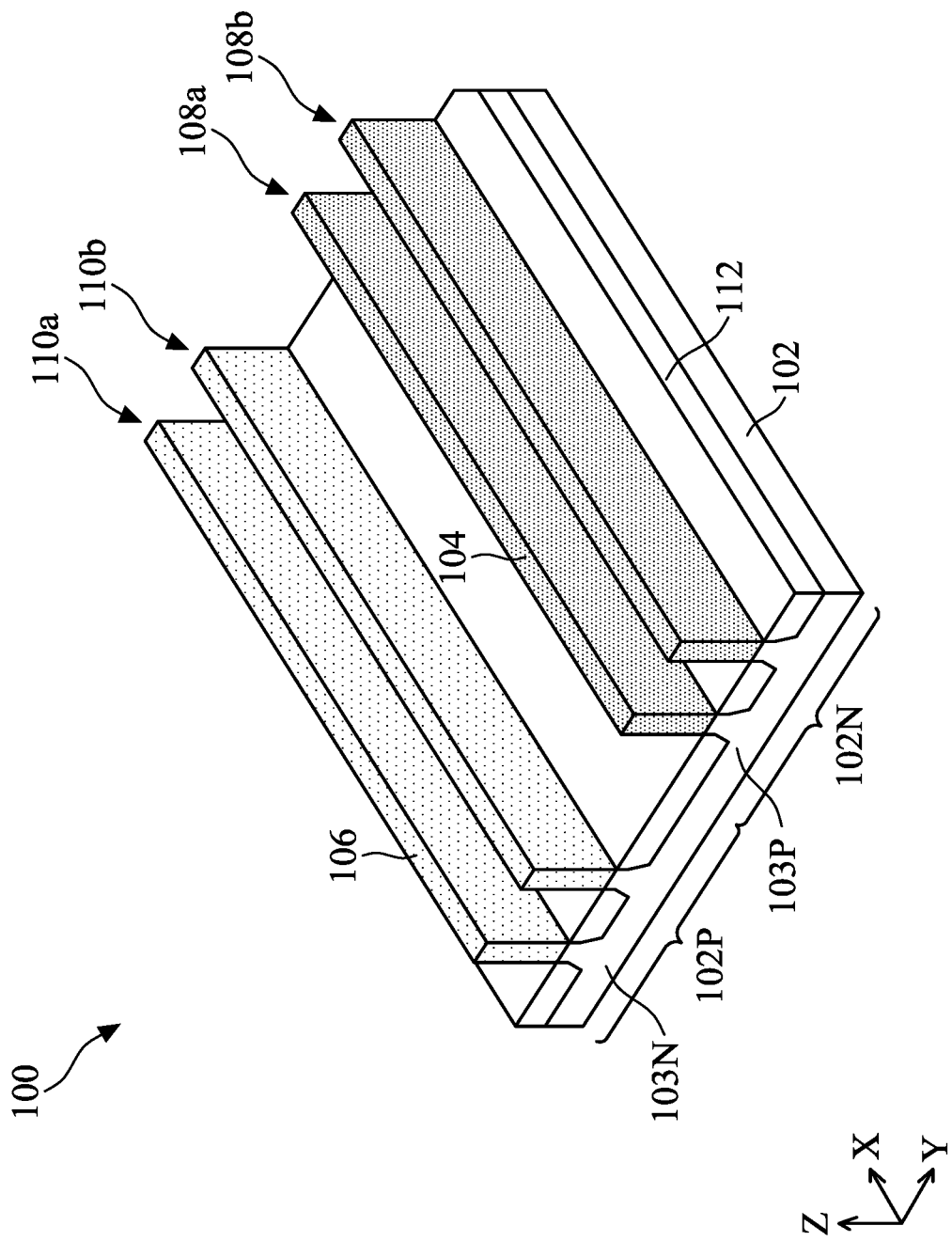

In FIG. 3, a plurality of fins 108a, 108b, 110a, 110b are formed from the first and second semiconductor layers 104, 106. The fins 108a, 108b, 110a, 110b may be patterned by any suitable method. For example, the fins 108a, 108b, 110a, 110b may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer (not shown) is formed over a substrate and patterned using a photolithography process. Spacers (not shown) are formed alongside the patterned sacrificial layer using a self-aligned process. The sacrificial layer is then removed, and the remaining spacers may then be used to pattern the substrate and form the fins.

The fins 108a, 108b may each include the first semiconductor layer 104, and a portion of the first semiconductor layer 104 may serve as an NMOS channel. Each fin 108a, 108b may also include the P-well region 103P. Likewise, the fins 110a, 110b may each include the second semiconductor layer 106, and a portion of the second semiconductor layer 106 may serve as a PMOS channel. Each fin 110a, 110b may also include the N-well region 103N. A mask (not shown) may be formed on the first and second semiconductor layers 104, 106, and may remain on the fins 108a-b and 110a-b.

Next, an insulating structure 112 is formed between adjacent fins 108a-b, 110a-b. The insulating structure 112 may be first formed between adjacent fins 108a-b, 110a-b and over the fins 108a-b, 110a-b, so the fins 108a-b, 110a-b are embedded in the insulating structure 112. The insulating structure 112 may include an oxygen-containing material, such as silicon oxide, carbon or nitrogen doped oxide, or fluorine-doped silicate glass (FSG); a nitrogen-containing material, such as silicon nitride, silicon oxynitride (SiON), SiOCN, SiCN; a low-K dielectric material (e.g., a material having a K value lower than that of silicon dioxide); or any suitable dielectric material. The insulating structure 112 may be formed by any suitable method, such as low-pressure chemical vapor deposition (LPCVD), plasma enhanced CVD (PECVD) or flowable CVD (FCVD).

Next, a planarization process, such as a chemical-mechanical polishing (CMP) process may be performed to expose the top of the fins 108a-b, 110a-b. In some embodiments, the planarization process exposes the top of the mask (not shown) disposed on the fins 108a-b and 110a-b. The insulating structure 112 is then recessed by removing portions of the insulating structure 112 located on both sides of each fin 108a-b, 110a-b. The recessed insulating structure 112 may be shallow trench isolation (STI) region.

The insulating structure 112 may be recessed by any suitable removal process, such as dry etch or wet etch that selectively removes portions of the insulating structure 112 but does not substantially affect the semiconductor materials of the fins 108a-b, 110a-b.

Figure 4:
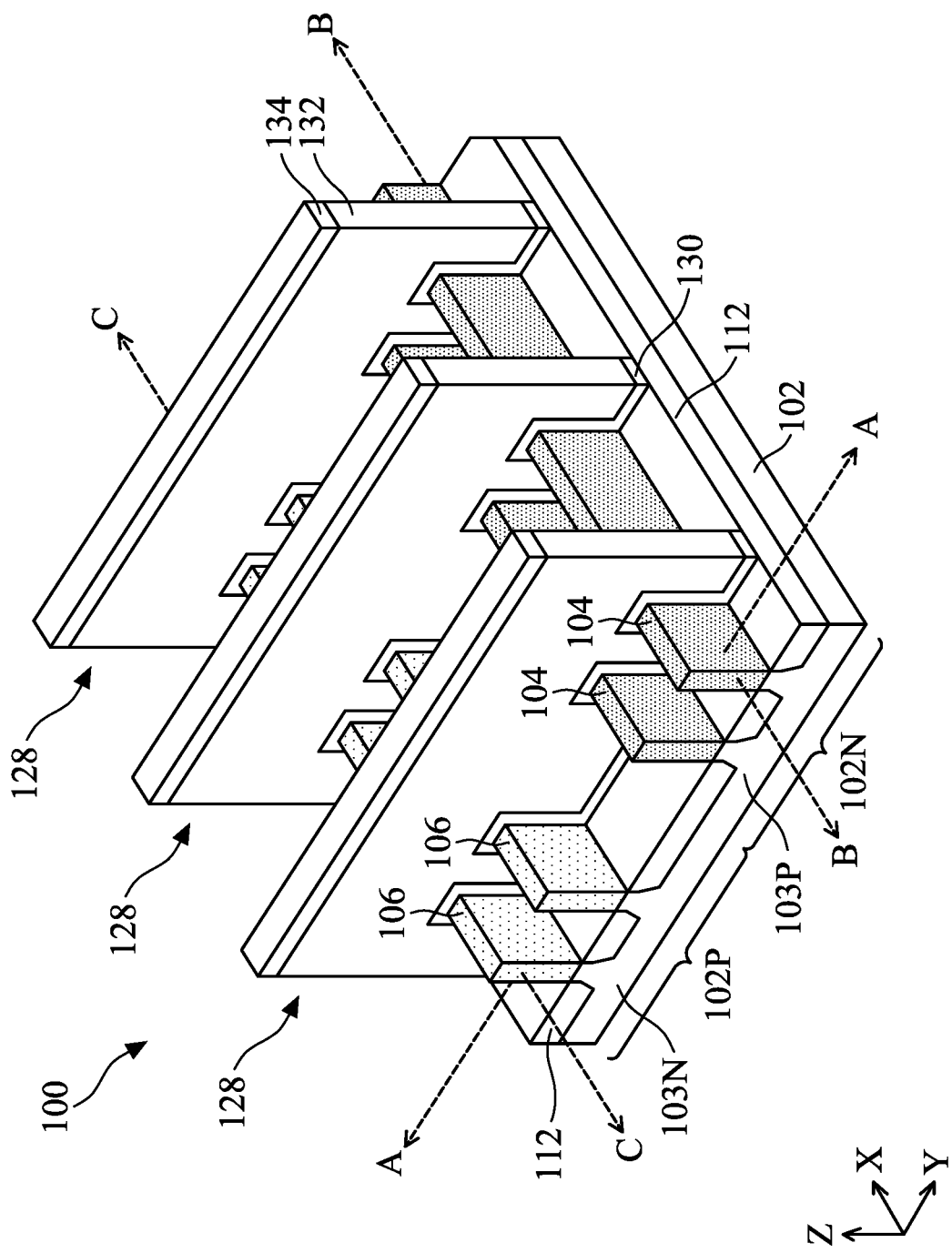

In FIG. 4, one or more sacrificial gate stacks 128 are formed on a portion of the fins 108a-b, 110a-b. Each sacrificial gate stack 128 may include a sacrificial gate dielectric layer 130, a sacrificial gate electrode layer 132, and a mask structure 134. The sacrificial gate dielectric layer 130 may include one or more layers of dielectric material, such as $SiO_2$, SiN, a high-K dielectric material, and/or other suitable dielectric material. In some embodiments, the sacrificial gate dielectric layer 130 may be deposited by a CVD process, a sub-atmospheric CVD (SACVD) process, a FCVD process, an ALD process, a PVD process, or other suitable process. The sacrificial gate electrode layer 132 may include polycrystalline silicon (polysilicon). The mask structure 134 may include an oxygen-containing layer and a nitrogen-containing layer. In some embodiments, the sacrificial gate electrode layer 132 and the mask structure 134 are formed by various processes such as layer deposition, for example, CVD (including both LPCVD and PECVD), PVD, ALD, thermal oxidation, e-beam evaporation, or other suitable deposition techniques, or combinations thereof.

The sacrificial gate stacks 128 may be formed by first depositing blanket layers of the sacrificial gate dielectric layer 130, the sacrificial gate electrode layer 132, and the mask structure 134, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stacks 128, the fins 108a-b, 110a-b are partially exposed on opposite sides of the sacrificial gate stacks 128. Portions of the insulating structure 112 are exposed as a result of the etch process(es) to form the sacrificial gate stacks 128. While three sacrificial gate stacks 128 are shown in FIG. 4, it can be appreciated that they are for illustrative purpose only and any number of the sacrificial gate stacks 128 may be formed.

FIGS. 5A-10A are cross-sectional side views of various stages of manufacturing the semiconductor device structure 100 of FIG. 4 taken along line A-A, in accordance with some embodiments. FIGS. 5B-10B are cross-sectional side views of various stages of manufacturing the semiconductor device structure 100 of FIG. 4 taken along line B-B, in accordance with some embodiments. FIGS. 5C-10C are cross-sectional side views of various stages of manufacturing the semiconductor device structure 100 of FIG. 4 taken along line C-C, in accordance with some embodiments.

Figure 5A:
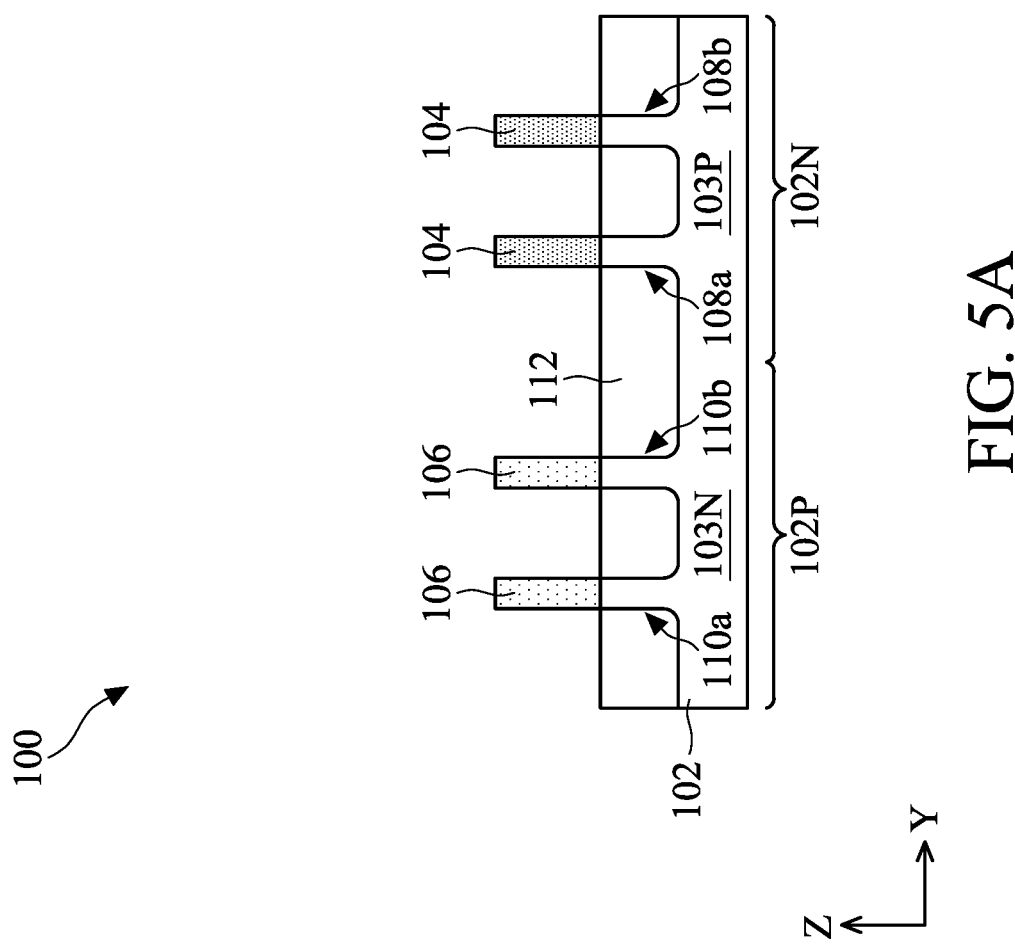
Figure 5B:
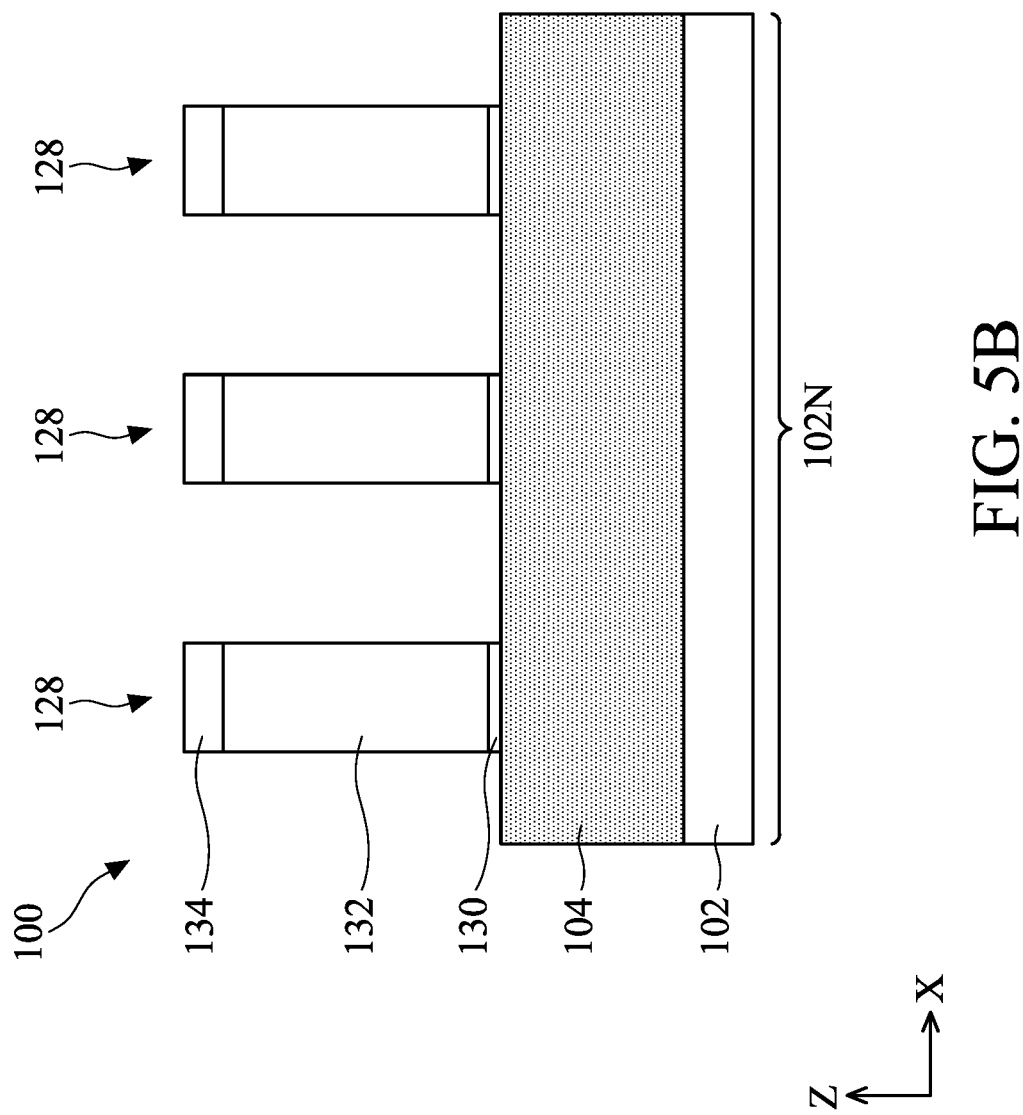
Figure 5C:
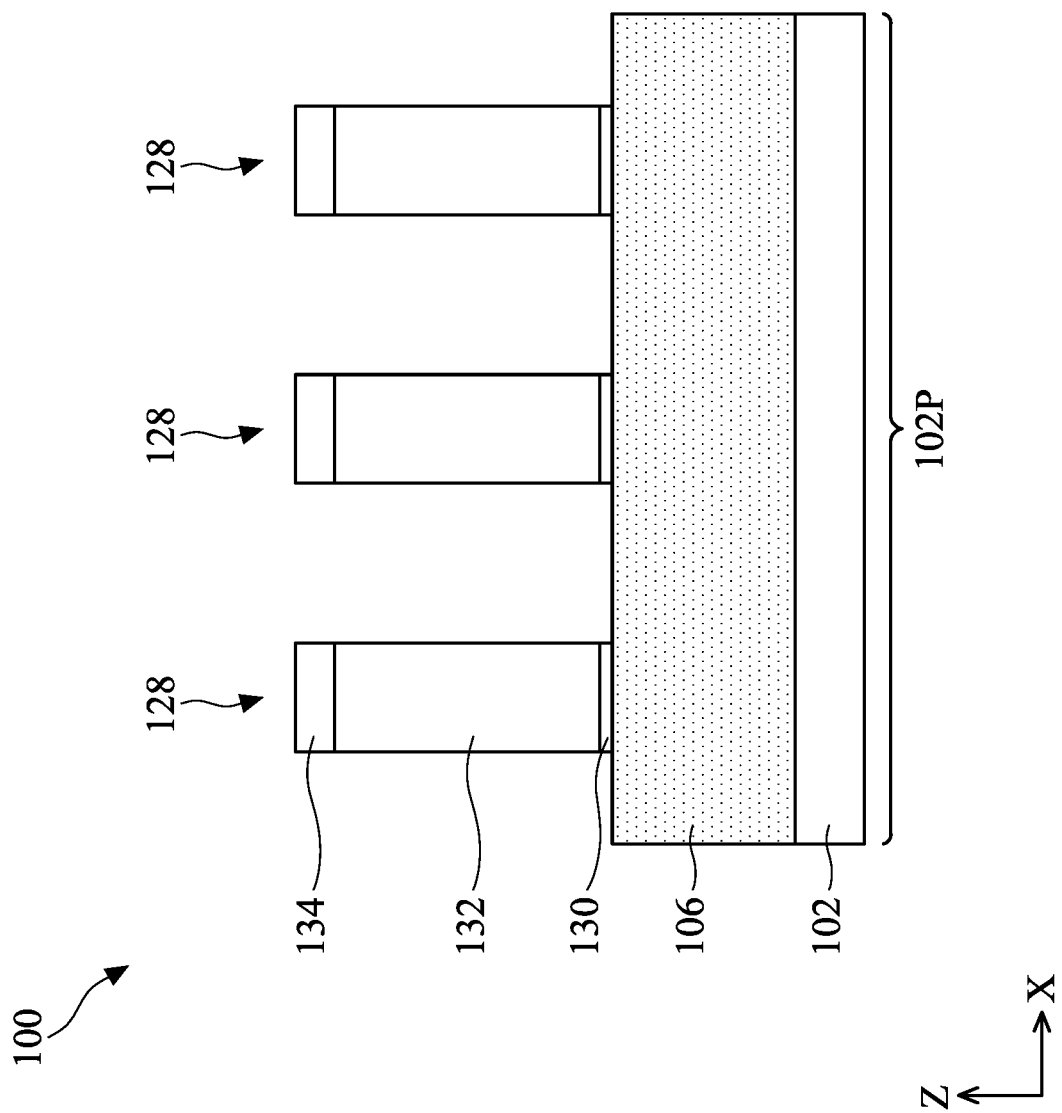
Figure 6A:
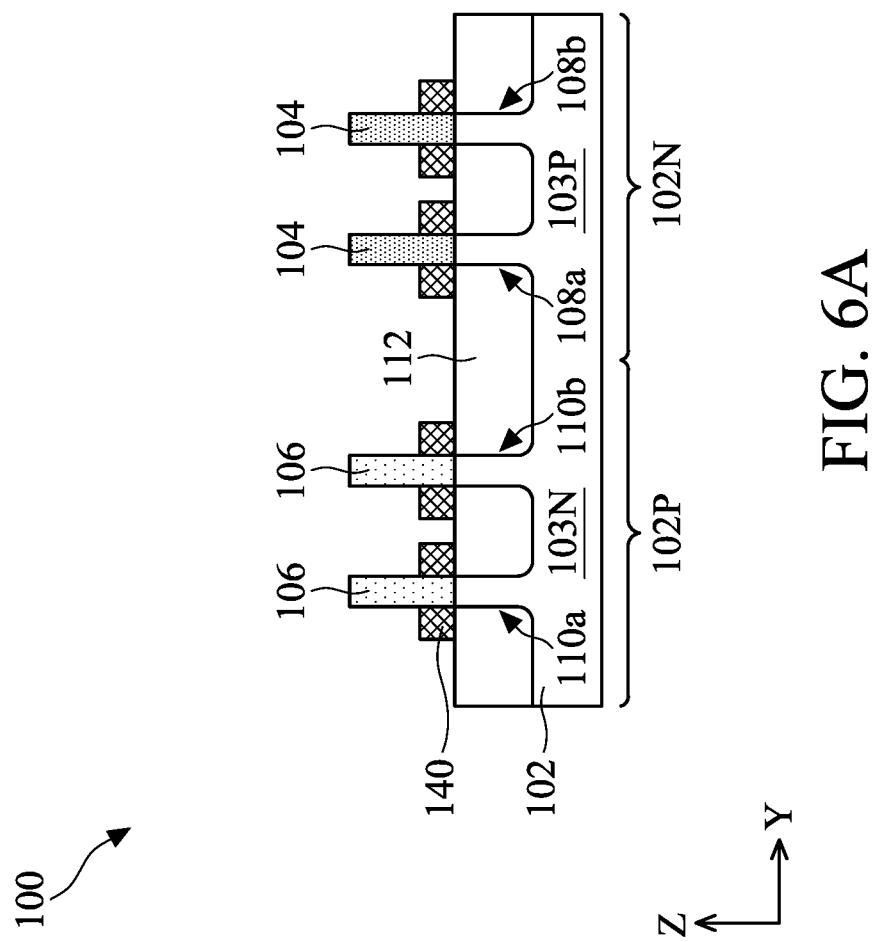
Figure 6B:
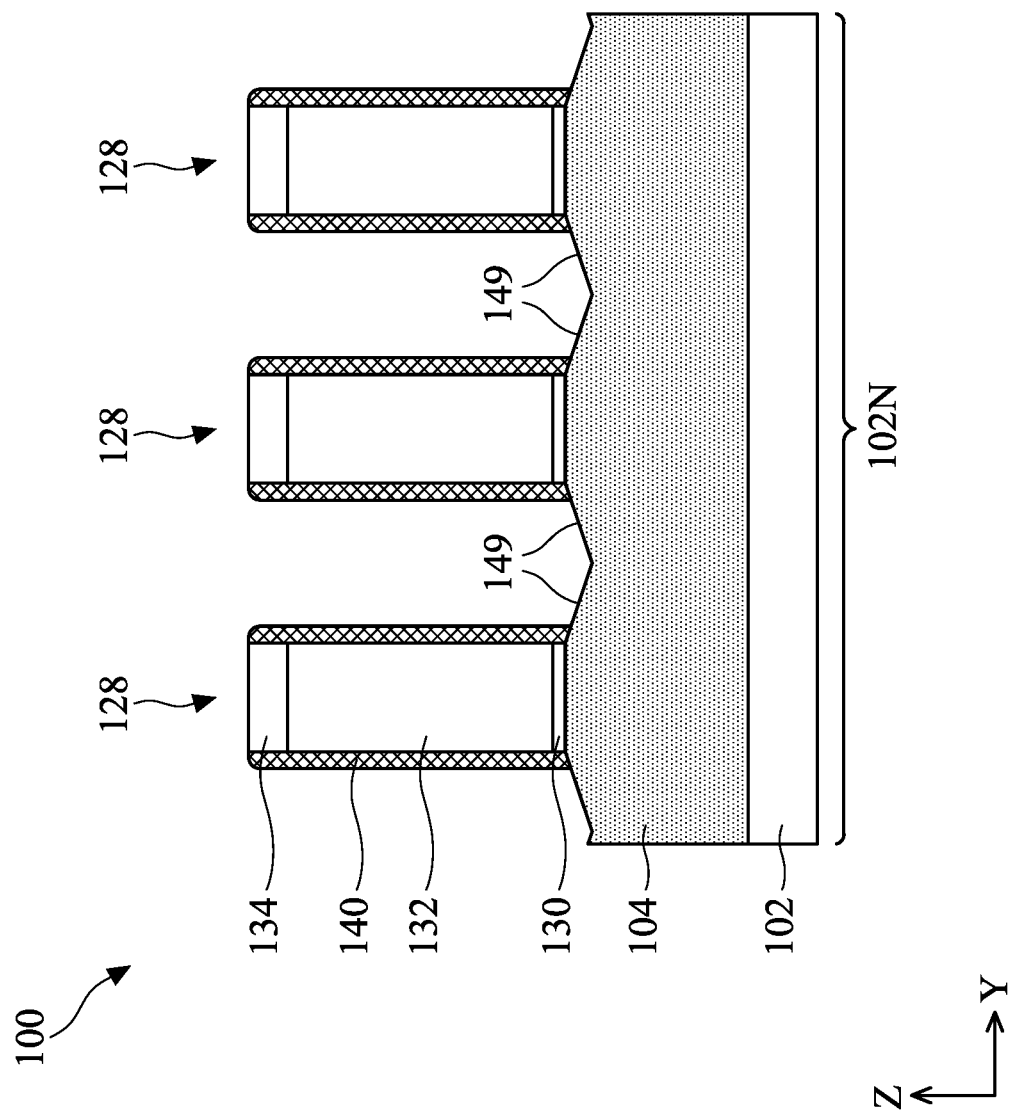
Figure 6C:
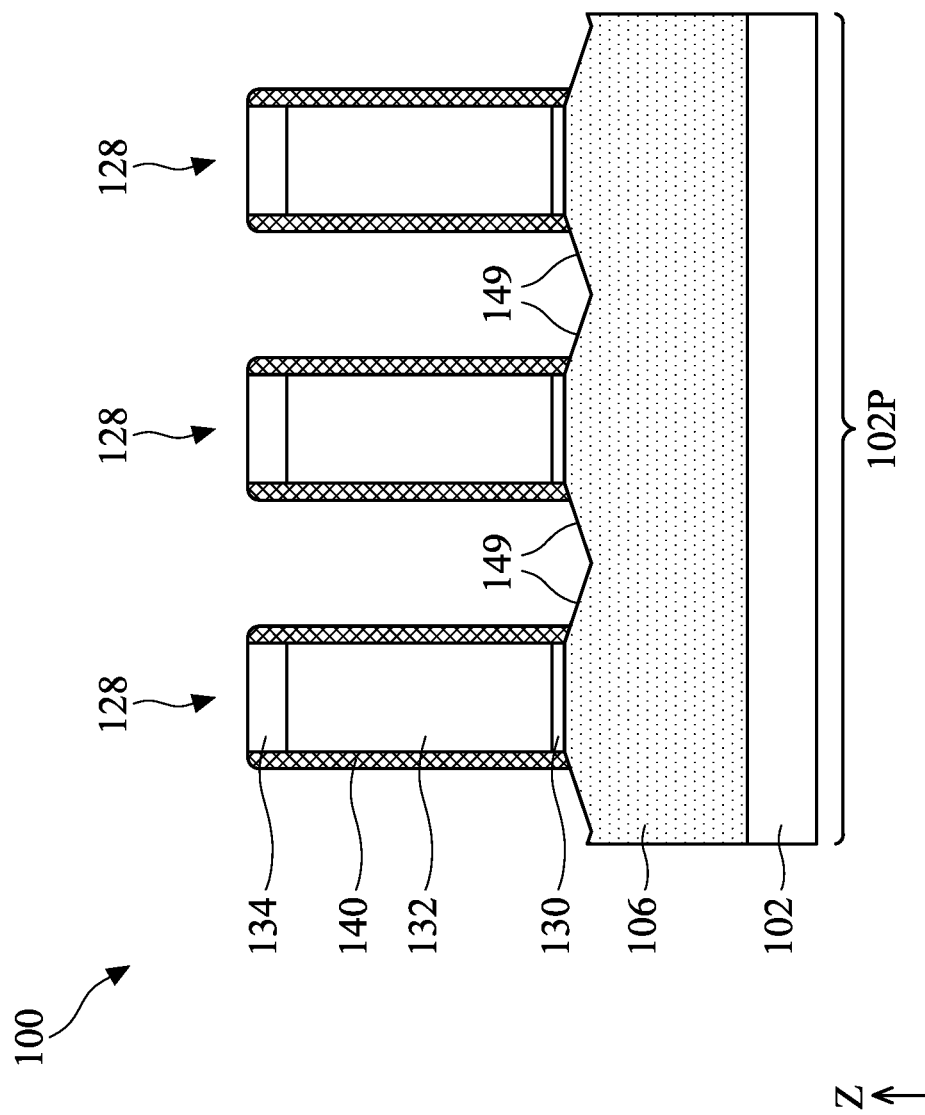

FIGS. 5A-5C illustrate a stage after the sacrificial gate stacks 128 are formed on a portion of the fins 108a-b, 110a-b. In FIGS. 6A-6C, a spacer 140 is formed on the sacrificial gate stacks 128 and the exposed portions of the first and second semiconductor layers 104, 106. The spacer 140 may be conformally deposited on the exposed surfaces of the semiconductor device structure 100. The conformal spacer 140 may be formed by ALD or any suitable processes. The term "conformal" may be used herein for ease of description upon a layer having substantial same thickness over various regions. An anisotropic etch is then performed on the spacer 140 using, for example, RIE. During the anisotropic etch process, most of the spacer 140 is removed from horizontal surfaces, such as tops of the sacrificial gate stacks 128 and tops of the fins 108a-b, 110a-b, leaving the spacer 140 on the vertical surfaces, such as on opposite sidewalls of the sacrificial gate stacks 128. The spacers 140 may partially remain on opposite sidewalls of the fins 108a-b, 110a-b, as shown in FIG. 6A. In some embodiments, the spacers 140 formed on the source/drain regions of the fins 108a-b, 110a-b are fully removed.

The spacer 140 may be made of a dielectric material such as silicon oxide ($SiO_2$), silicon nitride ($Si_3N_4$), silicon carbide (SiC), silicon oxynitride (SiON), silicon carbon-nitride (SiCN), silicon oxycarbide (SiOC), silicon oxycarbonitride (SiOCN), air gap, and/or any combinations thereof. In some embodiments, the spacer 140 include one or more layers of the dielectric material discussed above.

In various embodiments where the spacer 140 includes multiple layers, the top portion of the fins 108a-b, 110a-b not covered by the sacrificial gate stacks 128 may have a taper profile 149, as shown in FIGS. 6B, 6C. The taper profile 149 may be formed as a result of multiple exposure of the first and second semiconductor layers 104, 106 to etchants used during formation of the spacer 140. The taper profile 149 between adjacent sacrificial gate stacks 128 forms a shallow V-shaped top surface in the first and second semiconductor layers 104, 106, respectively.

Figure 7A:
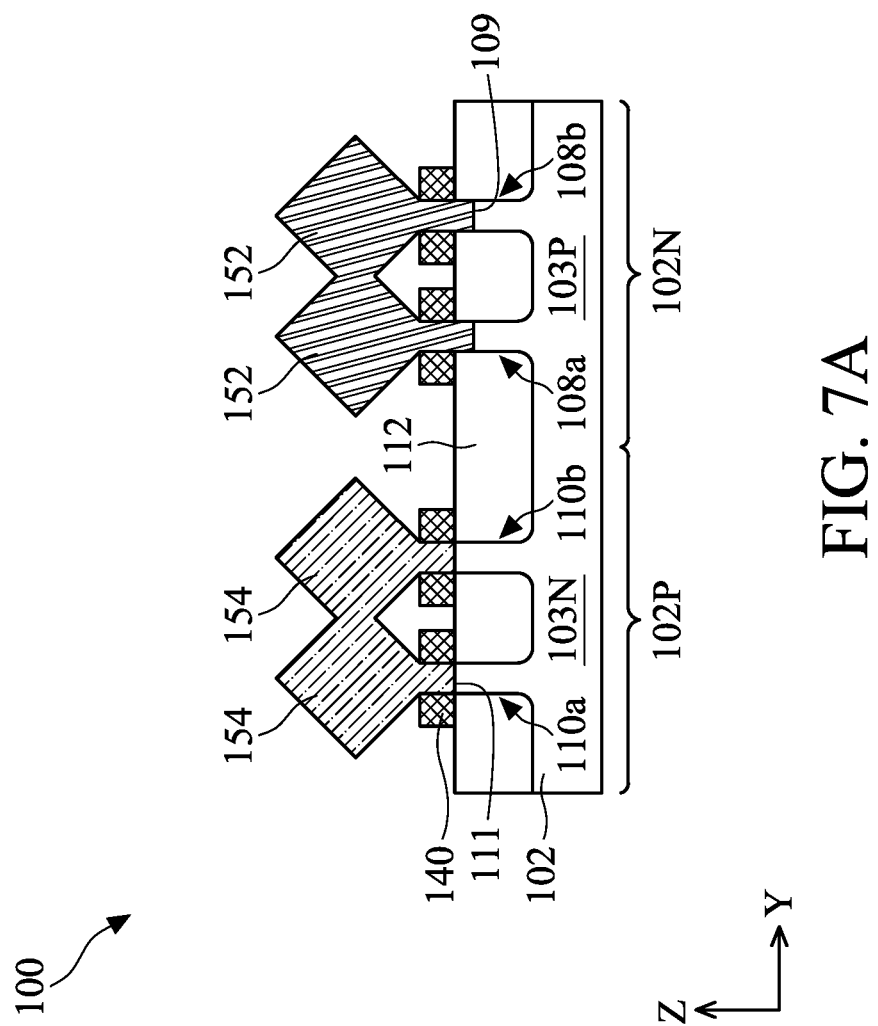
Figure 7B:
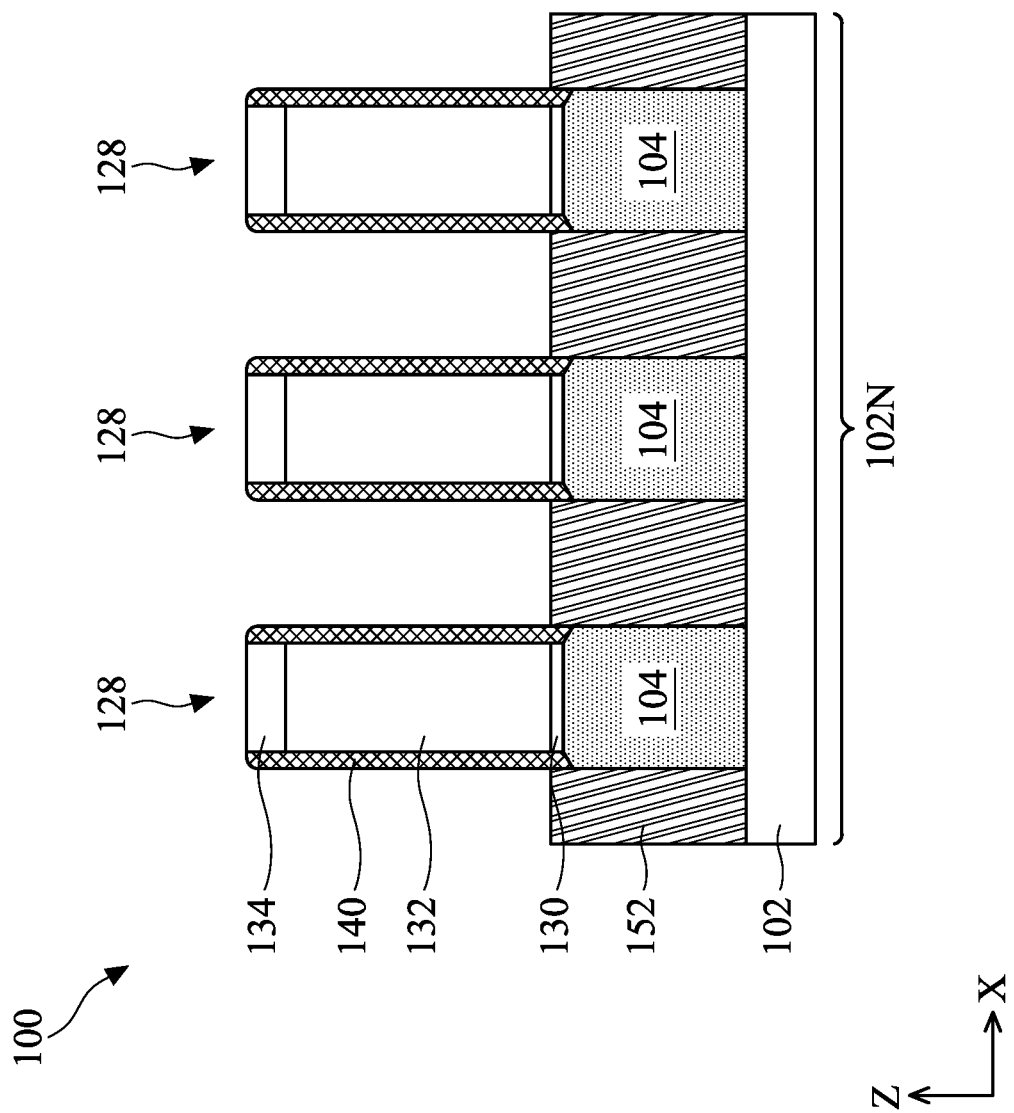
Figure 7C:
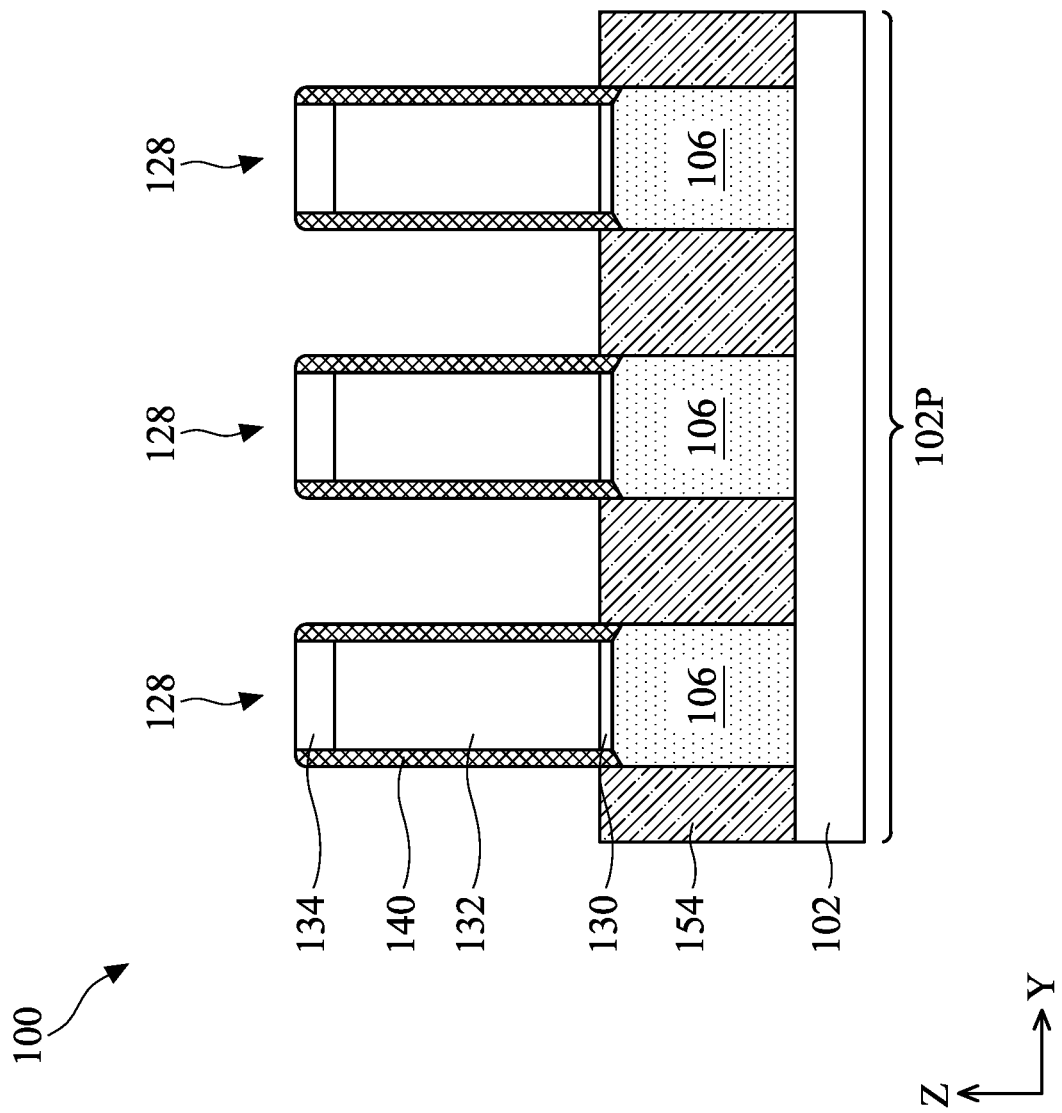

In FIGS. 7A-7C, the first and second semiconductor layers 104, 106 of the fins 108a-b, 110a-b not covered by the sacrificial gate stacks 128 and the spacers 140 are recessed, and source/drain (S/D) epitaxial features 152, 154 are formed. The etchant for recessing of the first and second semiconductor layers 104, 106 is selected so different materials have different etch rates. For example, the first semiconductor layer 104 of the fins 108a-b may have a first etch rate by the etchant, and the second semiconductor layer 106 of the fins 110a-b may have a second etch rate by the etchant. In the embodiments where the first semiconductor layer 104 in the NMOS region 102N and the second semiconductor layer 106 in the PMOS region 102P each includes different materials (e.g., first semiconductor layer 104 in the NMOS region 102N is SiGe and second semiconductor layer 106 in the PMOS region 102P is Si), the first etch rate is faster than the second etch rate. A portion of the P-well region 103P of the fins 108a-b can be slightly etched before the second semiconductor layer 106 in the PMOS region 102P is fully etched away. As a result, a top surface 109 of the fins 108a-b at the NMOS region 102N is at a level below (e.g., about 2 nm to about 10 nm below) a top surface 111 of the fins 110a-b at the PMOS region 102P, resulting in a deeper S/D junction depth in the NMOS region 102N than that of the PMOS region 102P. While not shown, it is contemplated that such a difference between the top surface 109 and the top surface 111 is applicable to various embodiments of this disclosure.

For devices in the NMOS region 102N, each S/D epitaxial features 152 may include one or more layers of Si, SiP, SiC, SiCP, SiAs, or a group III-V material (InP, GaAs, AlAs, InAs, InAlAs, InGaAs). In some embodiments, each S/D epitaxial feature 152 includes two or more layers of Si, SiP, SiC, SiCP or the group III-V material, and each layer may have a different silicon concentration. Each S/D epitaxial feature 152 may include N-type dopants, such as phosphorus (P), arsenic (As), or other suitable N-type dopants. The S/D epitaxial features 152 may be formed by any suitable method, such as CVD, CVD epitaxy, MBE, or other suitable method. The S/D epitaxial features 152 may be formed on the exposed surface of the fins 108a-b on both sides of each sacrificial gate stack 128, as shown in FIG. 7B. In some embodiments, the portions of the first semiconductor layer 104 on both sides of each sacrificial gate stack 128 are completely removed, and the S/D epitaxial features 152 are formed on the P-well region 103P of the fins 108a-b. The S/D epitaxial features 152 may grow both vertically and horizontally to form facets, which may correspond to crystalline planes of the material used for the substrate 102. In some embodiments, the S/D epitaxial features 152 formed on the P-well region 103P of the fins 108a and 108b are merged, as shown in FIG. 7A. The S/D epitaxial features 152 may each have a top surface at a level higher than a top surface of the first semiconductor layer 104, as shown in FIG. 7B.

For devices in the PMOS region 102P, each S/D epitaxial features 154 may include one or more layers of Si, SiGe, SiGeB, Ge, or a group III-V material (InSb, GaSb, InGaSb), and each layer may have a different silicon or germanium concentration. Each S/D epitaxial feature 154 may include P-type dopants, such as boron (B) or other suitable P-type dopants. In some embodiments, the S/D epitaxial features 152 in the NMOS region 102N and the S/D epitaxial features 154 in the PMOS region 102P are both Si. In some embodiments, the S/D epitaxial features 152 in the NMOS region 102N are Si and the S/D epitaxial features 154 in the PMOS region 102P are SiGe. The S/D epitaxial features 154 may be formed by any suitable method, such as CVD, CVD epitaxy, MBE, or other suitable method. In some embodiments, the portions of the second semiconductor layer 106 on both sides of each sacrificial gate stack 128 are completely removed, and the S/D epitaxial features 154 are formed on the N-well region 103N of the fins 110*a-b*. The S/D epitaxial features 154 may grow both vertically and horizontally to form facets, which may correspond to crystalline planes of the material used for the substrate 102. In some embodiments, the S/D epitaxial features 154 formed on the N-well region 103N of the fins 110*a* and 110*b* are merged, as shown in FIG. 7A. The S/D epitaxial features 154 may each have a top surface at a level higher than a top surface of the second semiconductor layer 106, as shown in FIG. 7C.

Figure 8A:
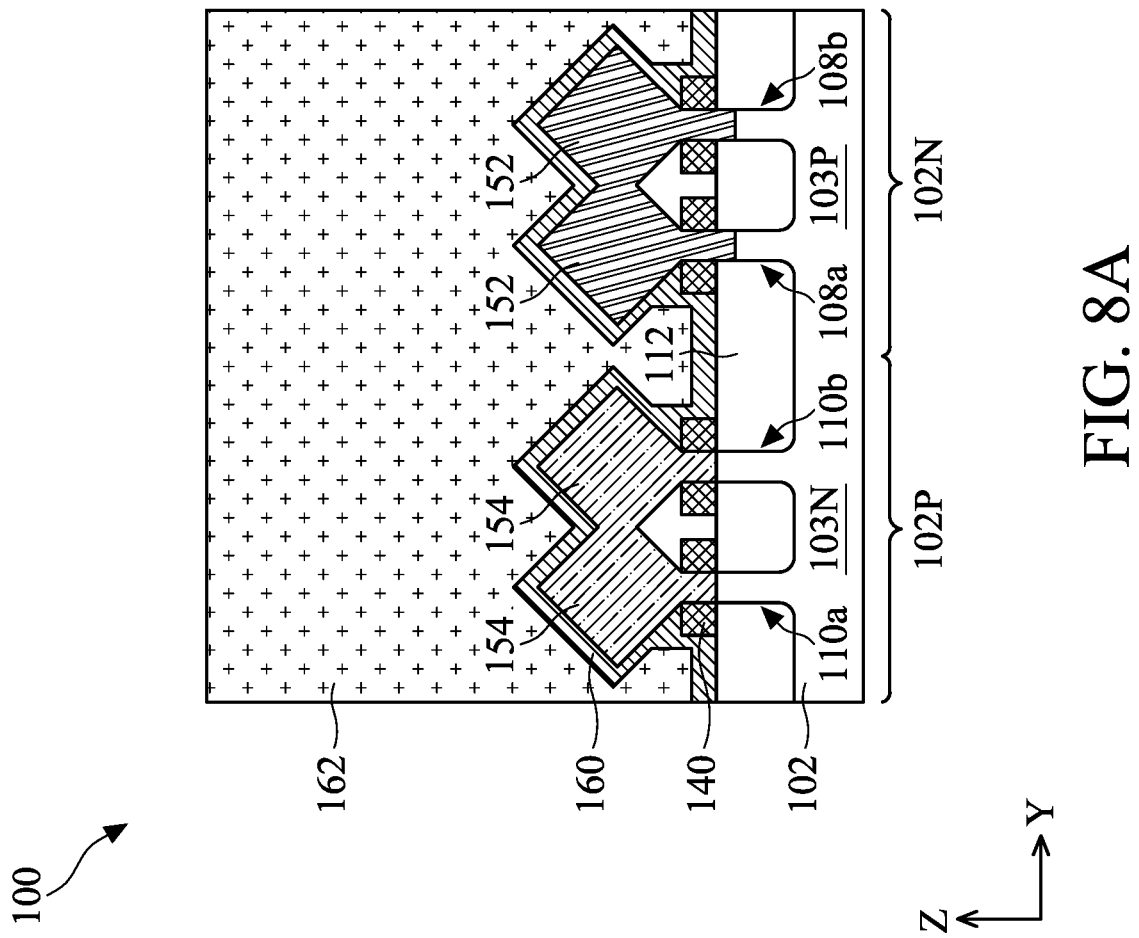
Figure 8B:
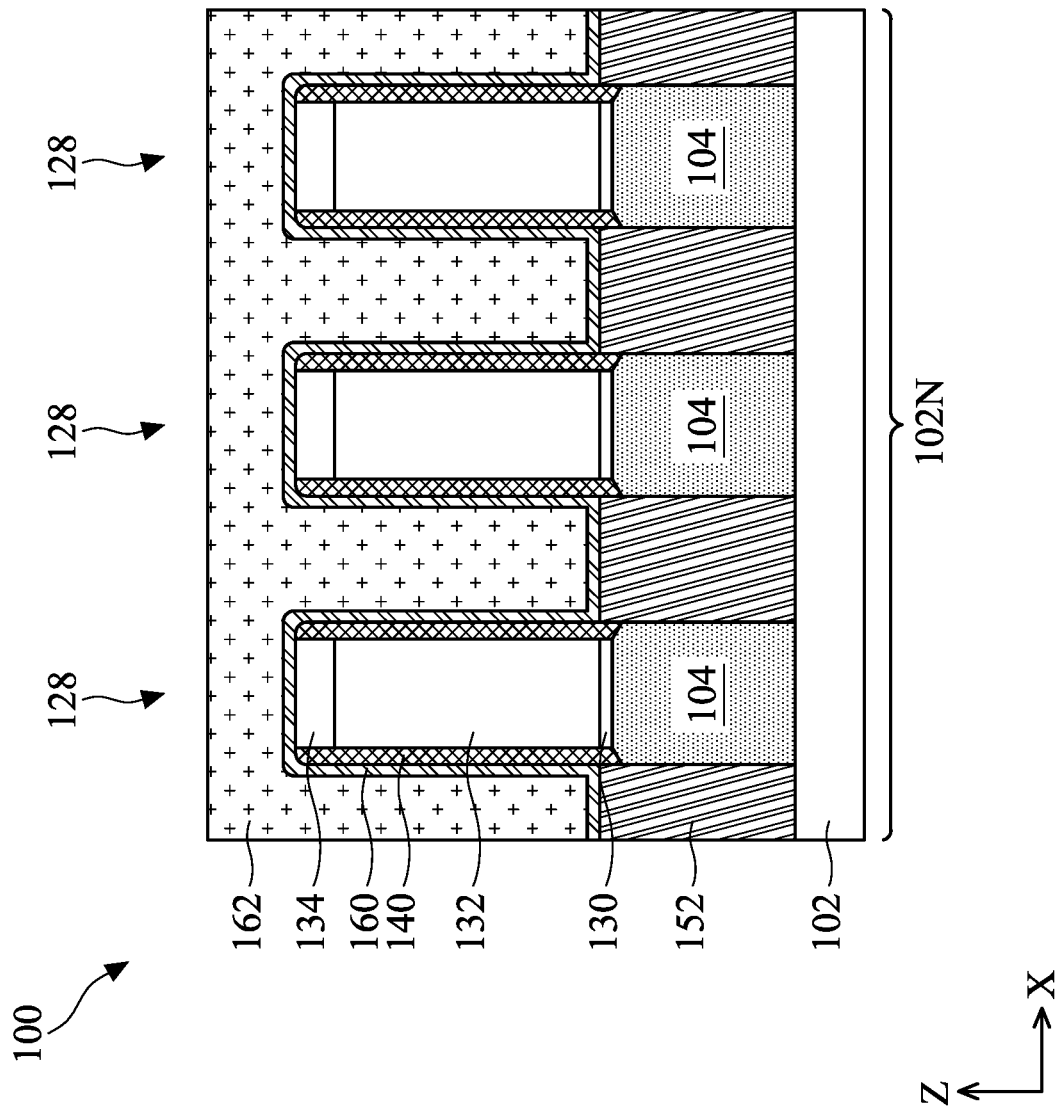
Figure 8C:
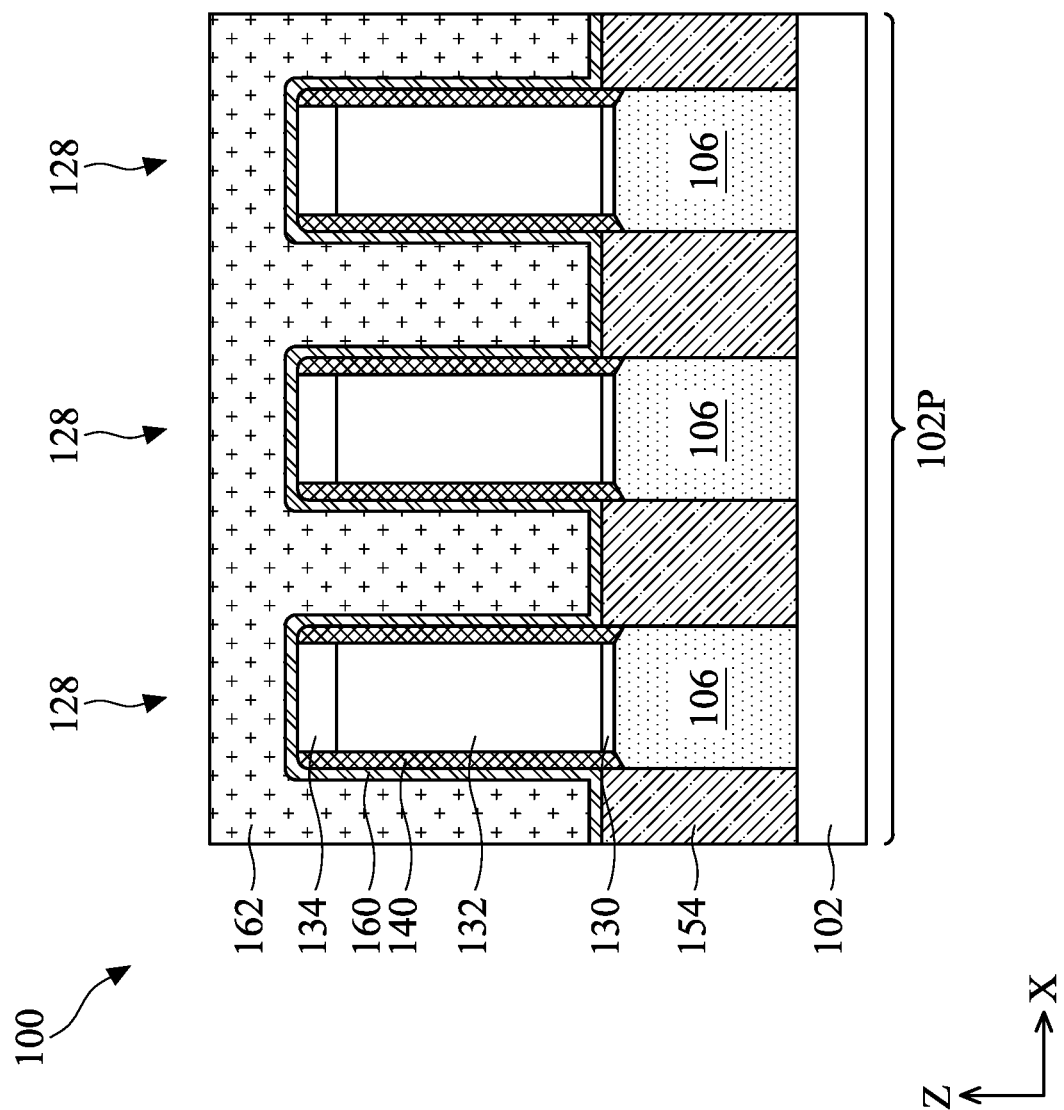

In FIGS. 8A-8C, a contact etch stop layer (CESL) 160 is conformally formed on the exposed surfaces of the semiconductor device structure 100. The CESL 160 covers the sidewalls of the sacrificial gate stacks 128, the insulating structure 112, and the S/D epitaxial features 152, 154. The CESL 160 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 162 is formed on the CESL 160. The materials for the ILD layer 164 may include compounds comprising Si. O. C. and/or H, such as SiOCH, oxide formed using tetraethylorthosilicate (TEOS), un-doped silicate glass, silicon oxide, or doped silicon oxide such as borophosphosilicate glass (BPSG), fused silica glass (FSG), phosphosilicate glass (PSG), boron doped silicon glass (BSG), and/or other suitable dielectric materials. The first ILD layer 162 may be deposited by a PECVD process or other suitable deposition technique.

After the formation of the first ILD layer 162, a planarization process is performed to expose the sacrificial gate electrode layer 132. The planarization process may be any suitable process, such as a CMP process. The planarization process removes portions of the first ILD layer 162 and the CESL 160 disposed on the sacrificial gate stacks 128. The planarization process may also remove the mask structure 134.

Figure 9A:
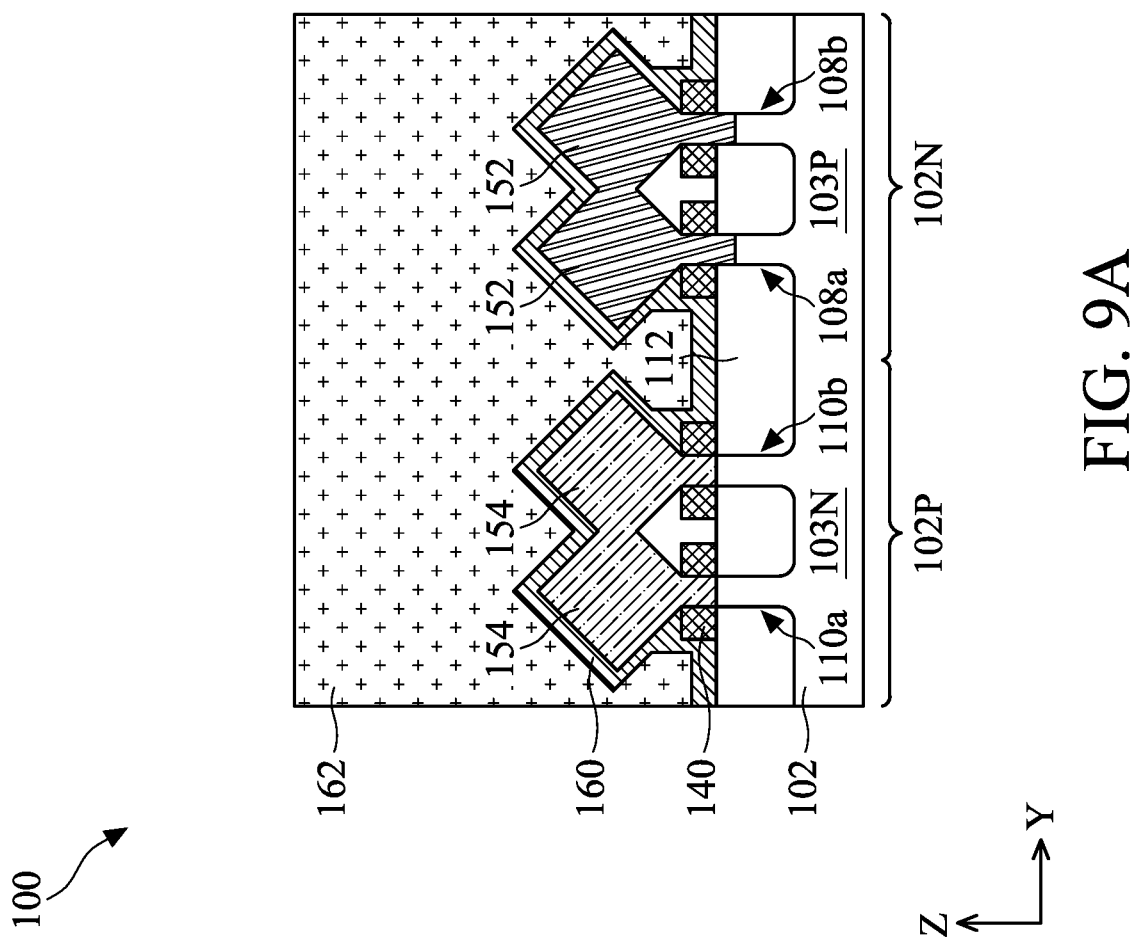
Figure 9B:
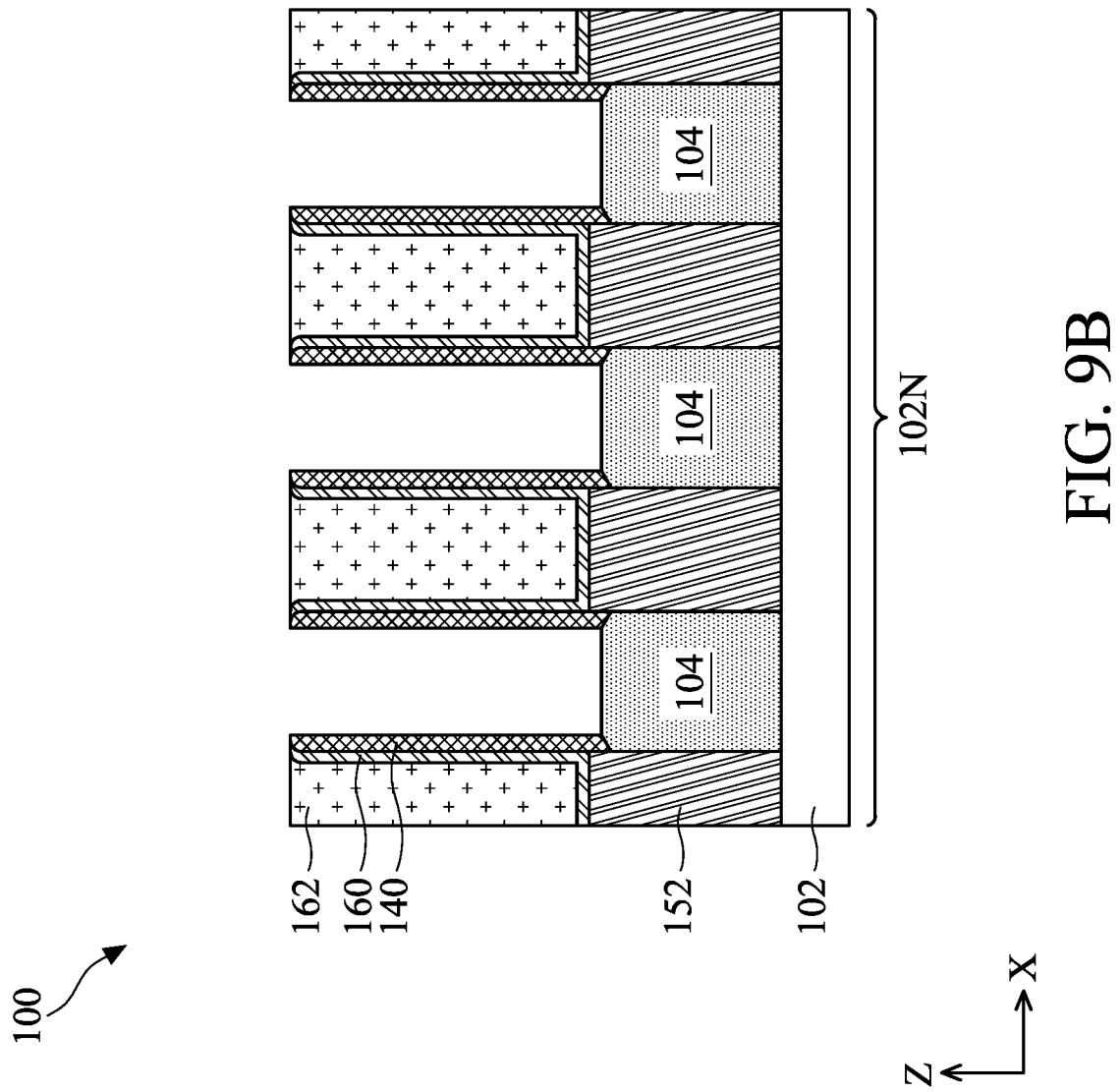
Figure 9C:
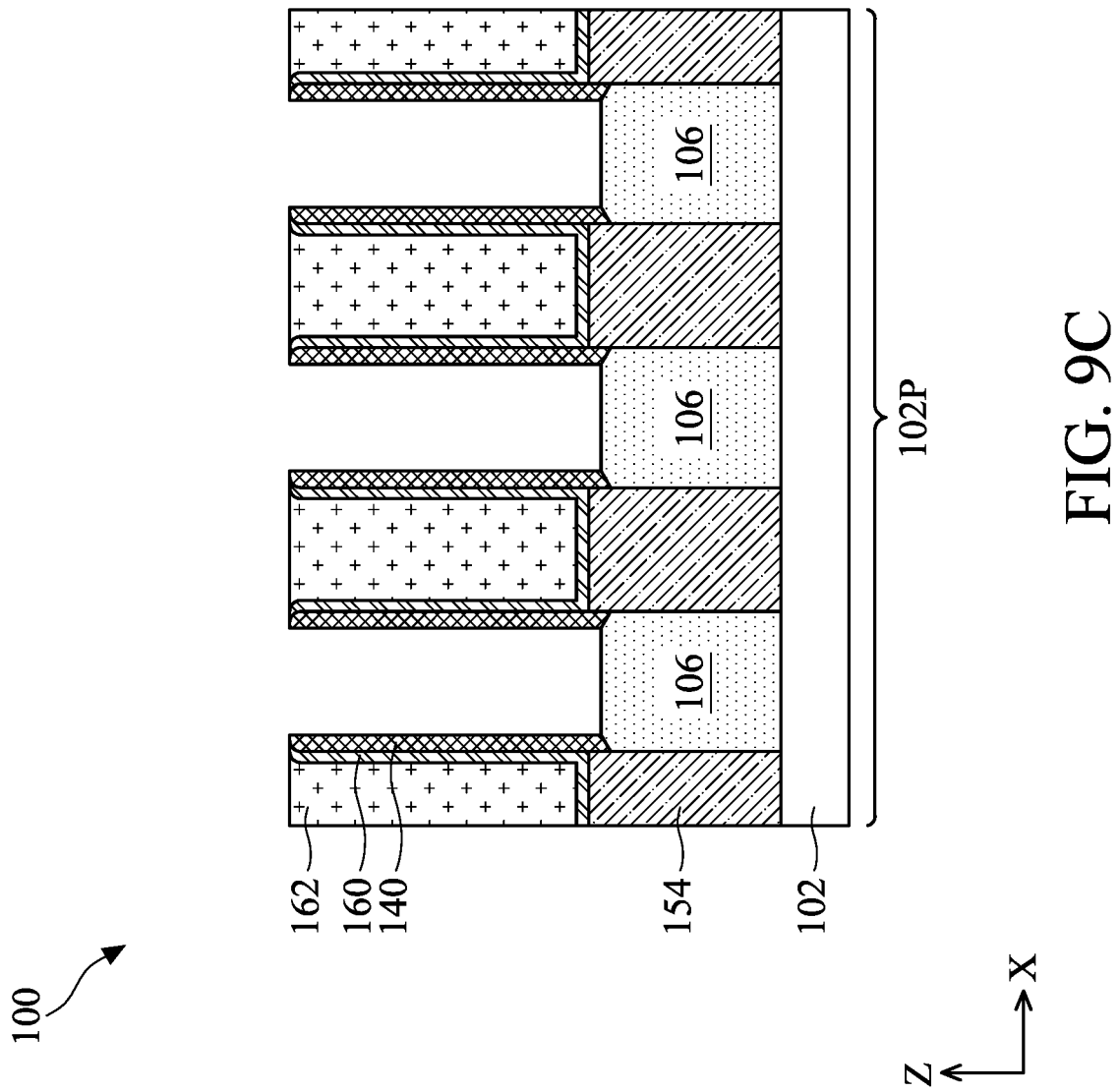

In FIGS. 9A-9C, the mask structure 134 (if not removed during CMP process), the sacrificial gate electrode layers 132 (FIG. 8B), and the sacrificial gate dielectric layers 130 (FIG. 8B) are removed. The sacrificial gate electrode layers 132 and the sacrificial gate dielectric layers 130 may be removed by one or more etch processes, such as dry etch process, wet etch process, or a combination thereof. The one or more etch processes selectively remove the sacrificial gate electrode layers 132 and the sacrificial gate dielectric layers 130 without substantially affects the spacer 140, the CESL 160, and the first ILD layer 162. The removal of the sacrificial gate electrode layers 132 and the sacrificial gate dielectric layers 130 exposes a top portion of the first and second semiconductor layers 104, 106 in the channel region.

Figure 10A:
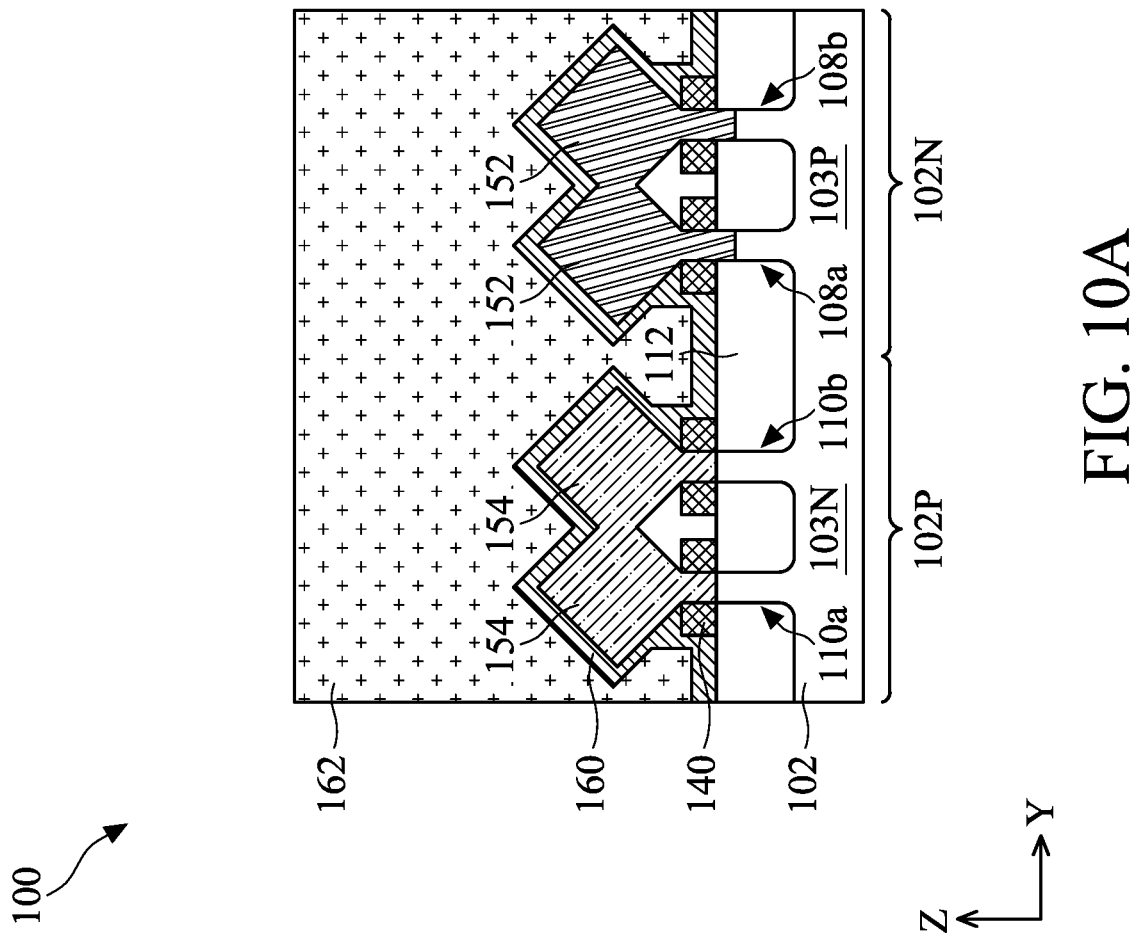
Figure 10B:
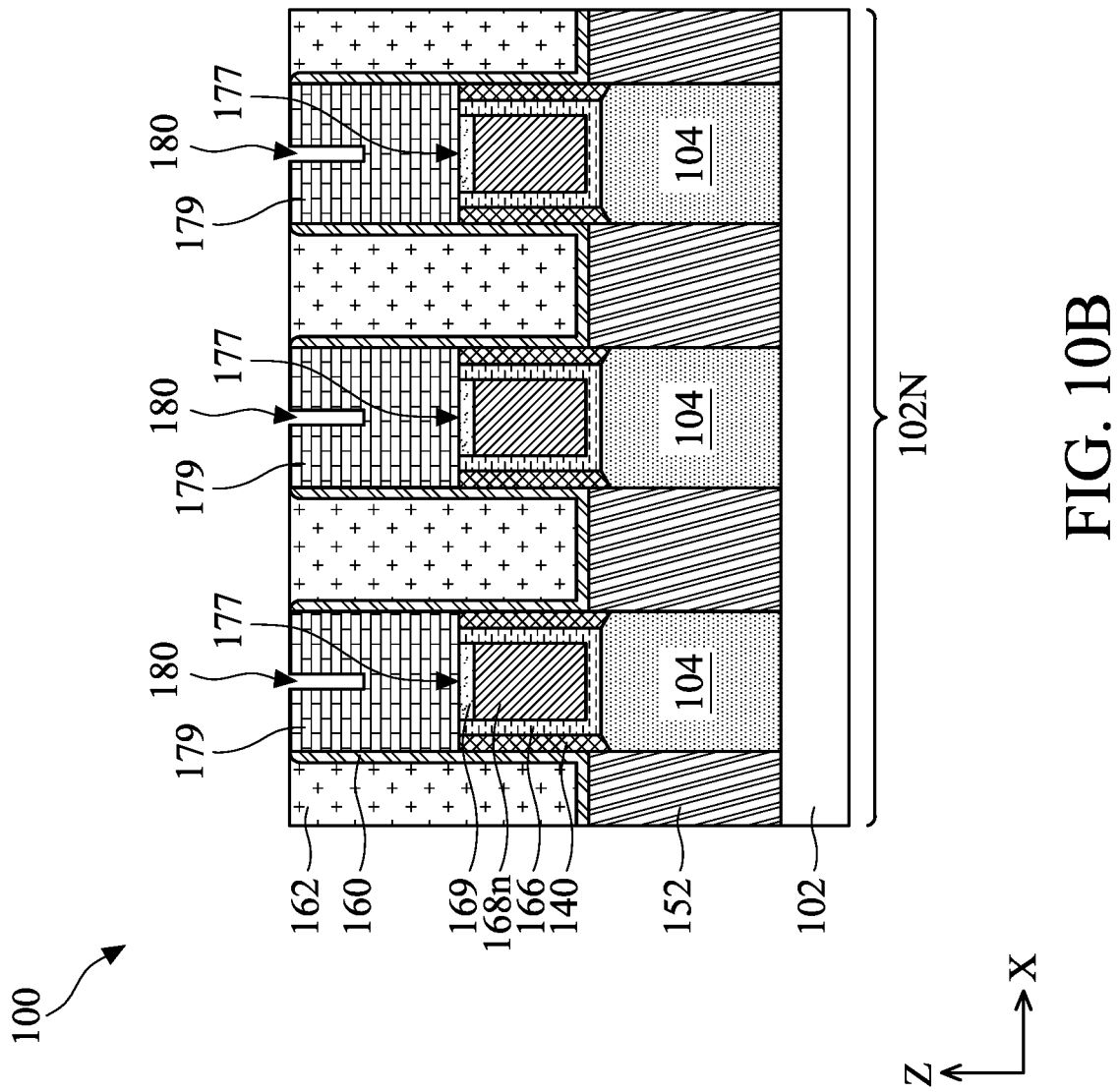
Figure 10C:
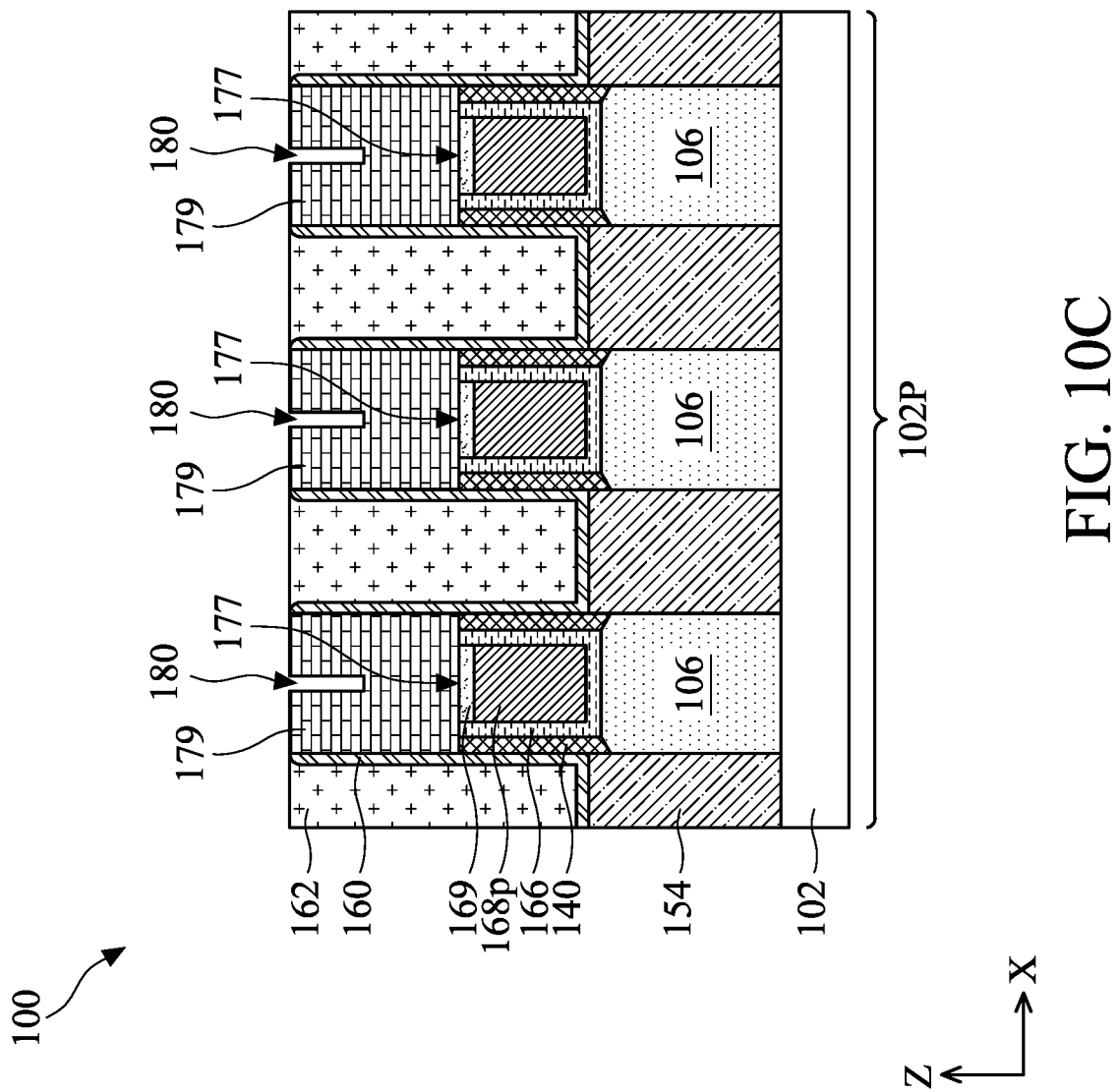

In FIGS. 10A-10C, replacement gate structures 177 are formed. The replacement gate structure 177 may include a gate dielectric layer 166 and a gate electrode layer 168*p*, 168*n* formed on the gate dielectric layer 166. As can be seen in FIGS. 10B and 10C, the gate dielectric layer 166 is formed on the first and second semiconductor layers 104, 106. The gate dielectric layer 166 may include one or more dielectric layers and may include the same material(s) as the sacrificial gate dielectric layer 130. In some embodiments, the gate dielectric layers 166 may be deposited by one or more ALD processes or other suitable processes. The gate electrode layer 168*p*, 186*n* may include one or more layers of electrically conductive material, such as polysilicon, aluminum, copper, titanium, tantalum, tungsten, cobalt, molybdenum, tantalum nitride, nickel silicide, cobalt silicide, TiN, WN, AlTi, AlTiO, AlTiC, AlTiN, TaCN, TaC, TaSiN, metal alloys, other suitable materials, and/or combinations thereof. For devices in the NMOS region 102N, the gate electrode layer 168*n* may be AlTiO. AlTiC, or a combination thereof. For devices in the PMOS region 102P, the gate electrode layer 168*p* may be AlTiO, AlTiC, AlTiN, or a combination thereof. The gate electrode layers 168 may be formed by PVD, CVD, ALD, electro-plating, or other suitable method.

A metal gate etching back (MGEB) process is performed to remove portions of the spacer 140, the gate dielectric layer 166, and the gate electrode layer 168*p*, 168*n*. The MGEB process may be a plasma etching process employing one or more etchants such as chlorine-containing gas, a bromine-containing gas, and/or a fluorine-containing gas. After the MGEB process, a top surface of the gate electrode layer 168*p*, 168*n* may be lower than a top surface of the gate dielectric layer 166. In some embodiments, as shown in FIGS. 10B and 10C, the spacers 140 and the gate dielectric layer 166 are at the same level after the MGEB process. In some embodiments, portions of the spacers 140 are etched back so that the top surface of the spacers 140 is higher than the top surfaces of the gate dielectric layer 166 and the gate electrode layers 168*p*, 168*n*. A cap layer 169 is selectively formed on the gate electrode layers 168*p*, 168*n* after the MGEB process. The cap layer 169 may include an electrically conductive material, such as a metal. In some embodiments, the cap layer 169 includes fluorine-free tungsten (FFW).

Then, trenches formed above the spacers 140, the gate dielectric layer 166, and the gate electrode layer 168*p*, 168*n* as a result of the MGEB processes are filled with a mask layer 179. The mask layer 179 can be formed of any material that has different etch selectivity than the CESL 160 and the first ILD layer 162. In some embodiments, the mask layer 179 includes silicon, SiN, or a low-K dielectric material. The mask layer 179 may be formed by any suitable process. In some embodiments, the mask layer 179 is formed by ALD, and a scam 180 may be formed in the mask layer 179 as a result of the ALD process. The seam 180 may have a width ranging from about 0 nm to about 3 nm. A CMP process is then performed to remove excess deposition of the mask layer 179 until the top surface of the first ILD layer 162 is exposed.

Figure 11:
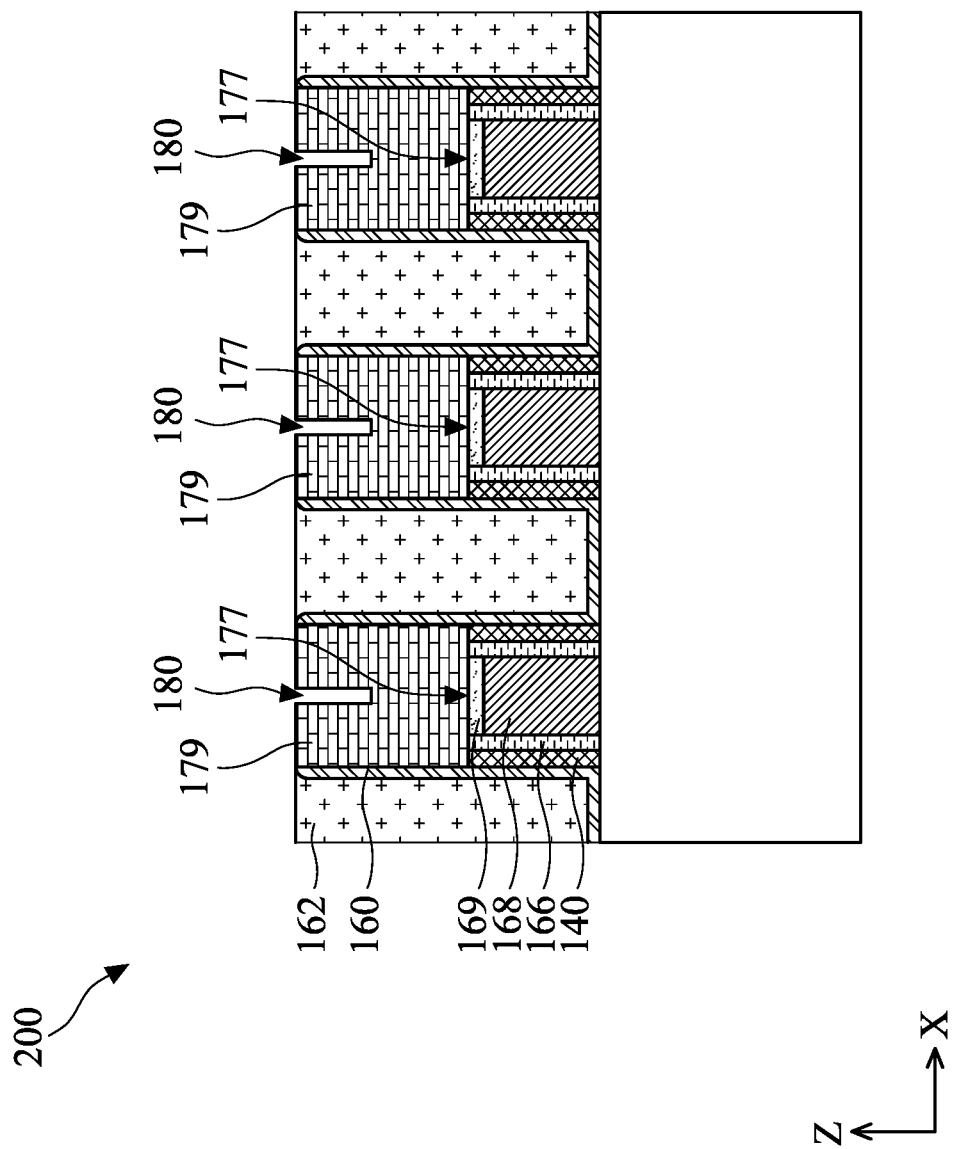
FIG. 11 is a cross-sectional view of one of various stages of manufacturing a semiconductor device structure, in accordance with some embodiments.

FIG. 11 is a cross-sectional view of one of various stages of manufacturing a semiconductor device structure 200, in accordance with some embodiments. As shown in FIG. 11, the semiconductor device structure 200 includes a substrate 202, the gate electrode layers 168, the gate dielectric layers 166, the spacers 140, the cap layer 169, the mask layer 179, the CESL 160, and the first ILD layer 162. The substrate 202 includes a plurality of devices (not shown) formed thereon. In some embodiments, the plurality of devices are FinFETs. For example, the semiconductor device structure 200 is the semiconductor device structure 100 shown in FIGS. 11A-11C, and the substrate 202 includes the first semiconductor layer 104 and the S/D epitaxial features 152 (or the second semiconductor layer 106 and the S/D epitaxial features 154). In some embodiments, the plurality of devices of nanostructure FETs, such as nanosheet FETs. For example, the substrate 202 includes channel regions each includes a stack of semiconductor layers, and the gate electrode layer 168 surrounds each semiconductor layer. In some embodiments, other types of the devices are disposed on the substrate 202.

Figure 12A:
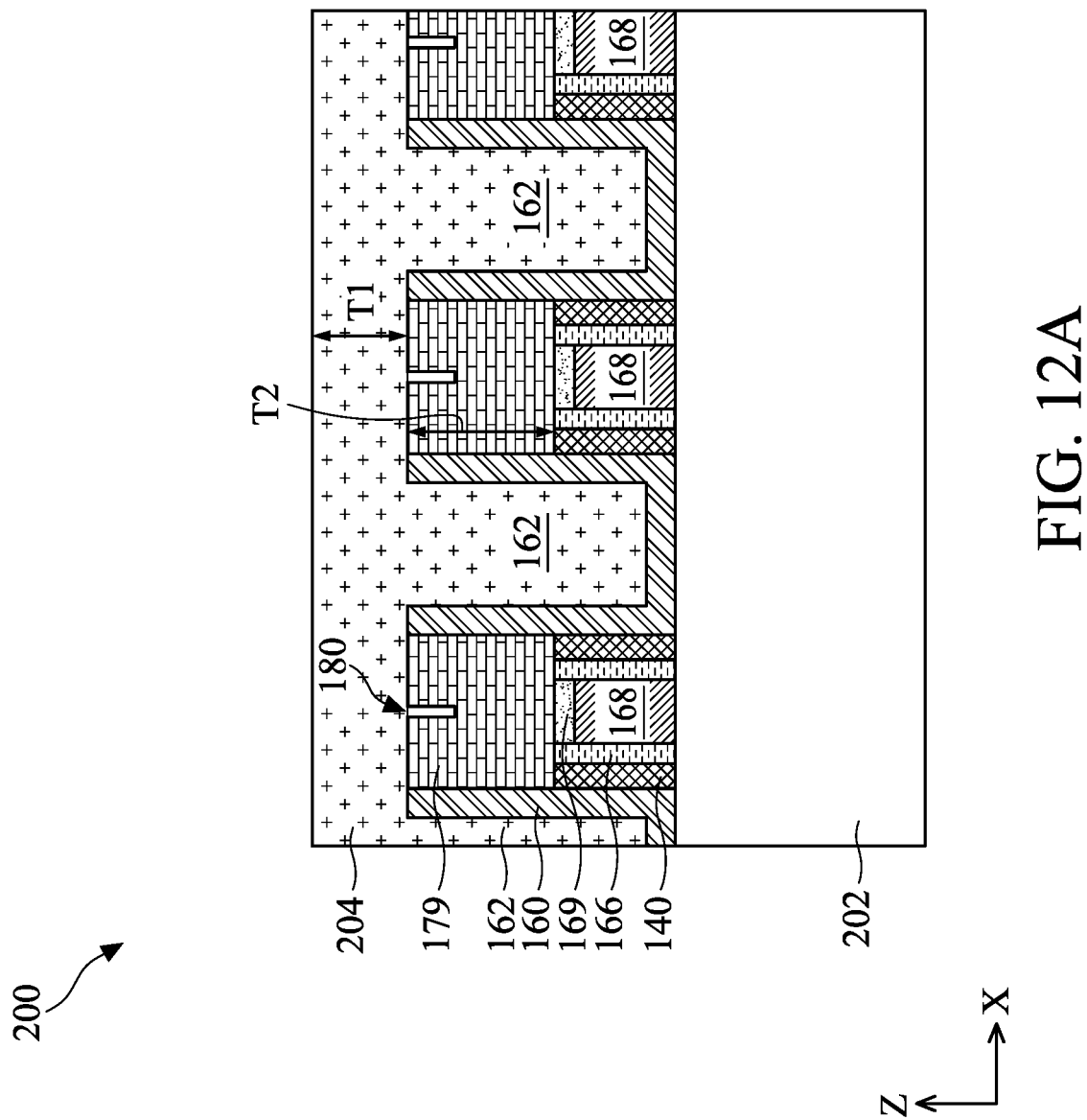
FIGS. 12A-12Z are cross-sectional views of various stages of manufacturing the semiconductor device structure of FIG. 11, in accordance with some embodiments.
Figure 12B:
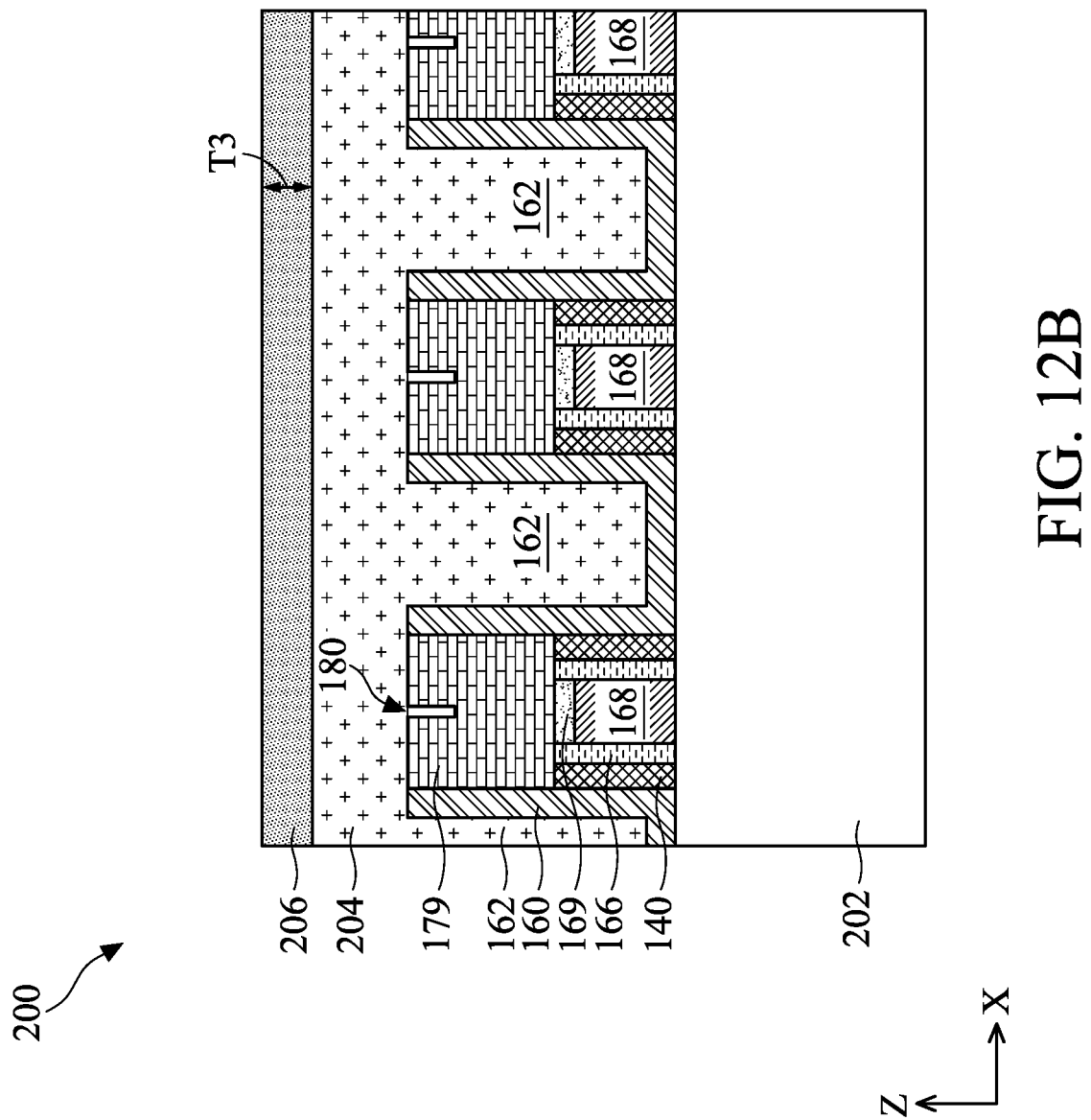
Figure 12C:
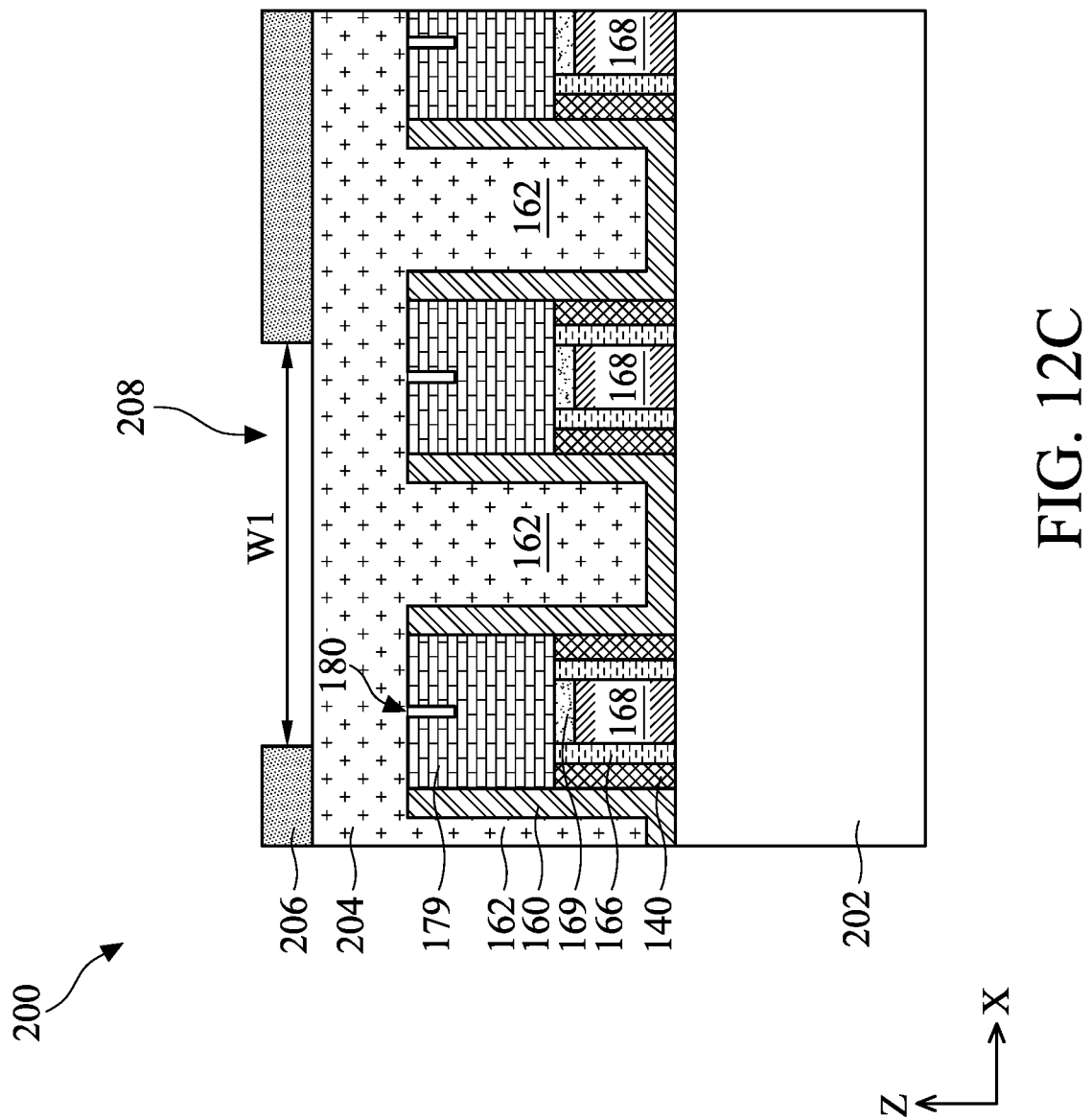
Figure 12D:
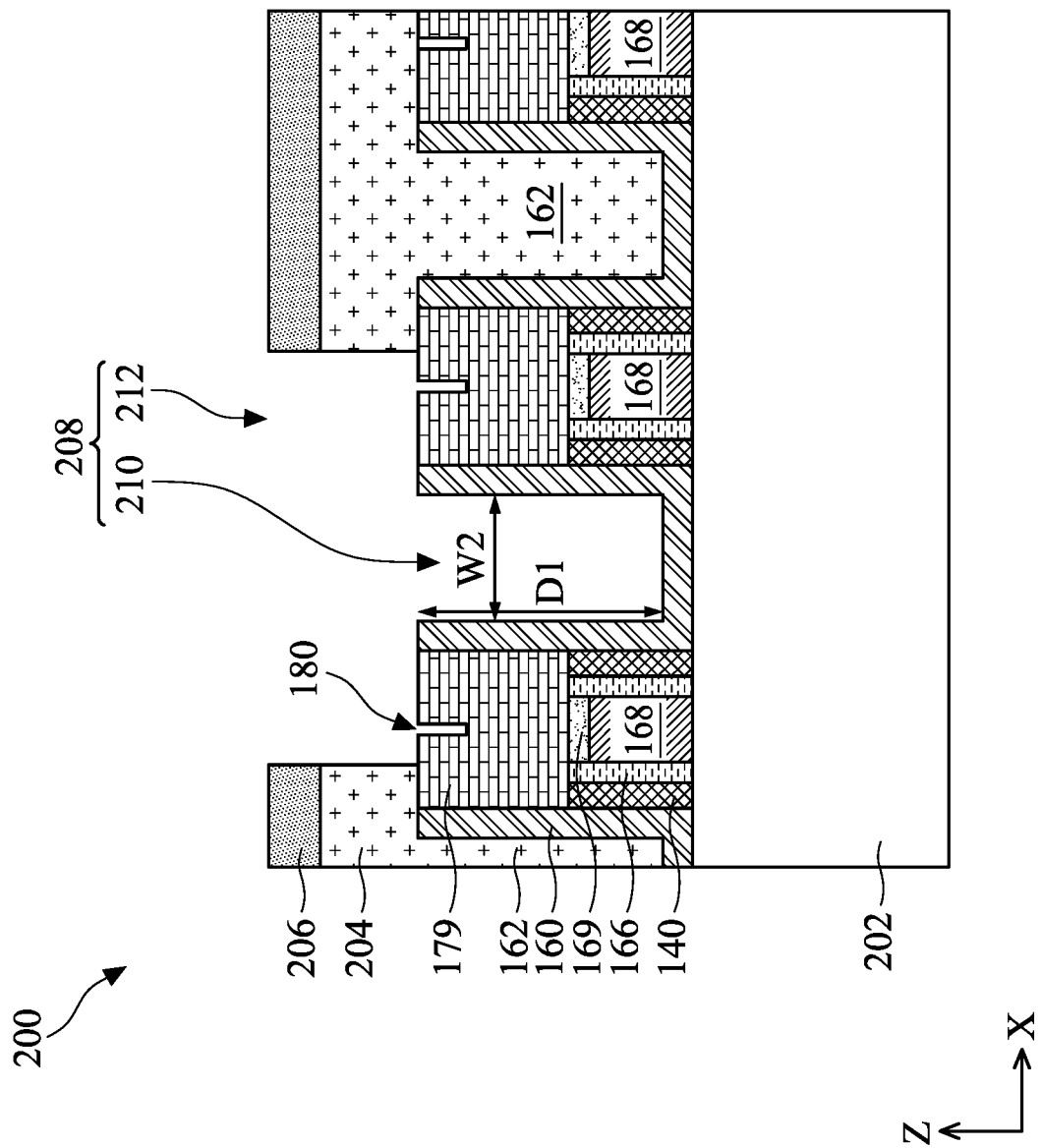
Figure 12E:
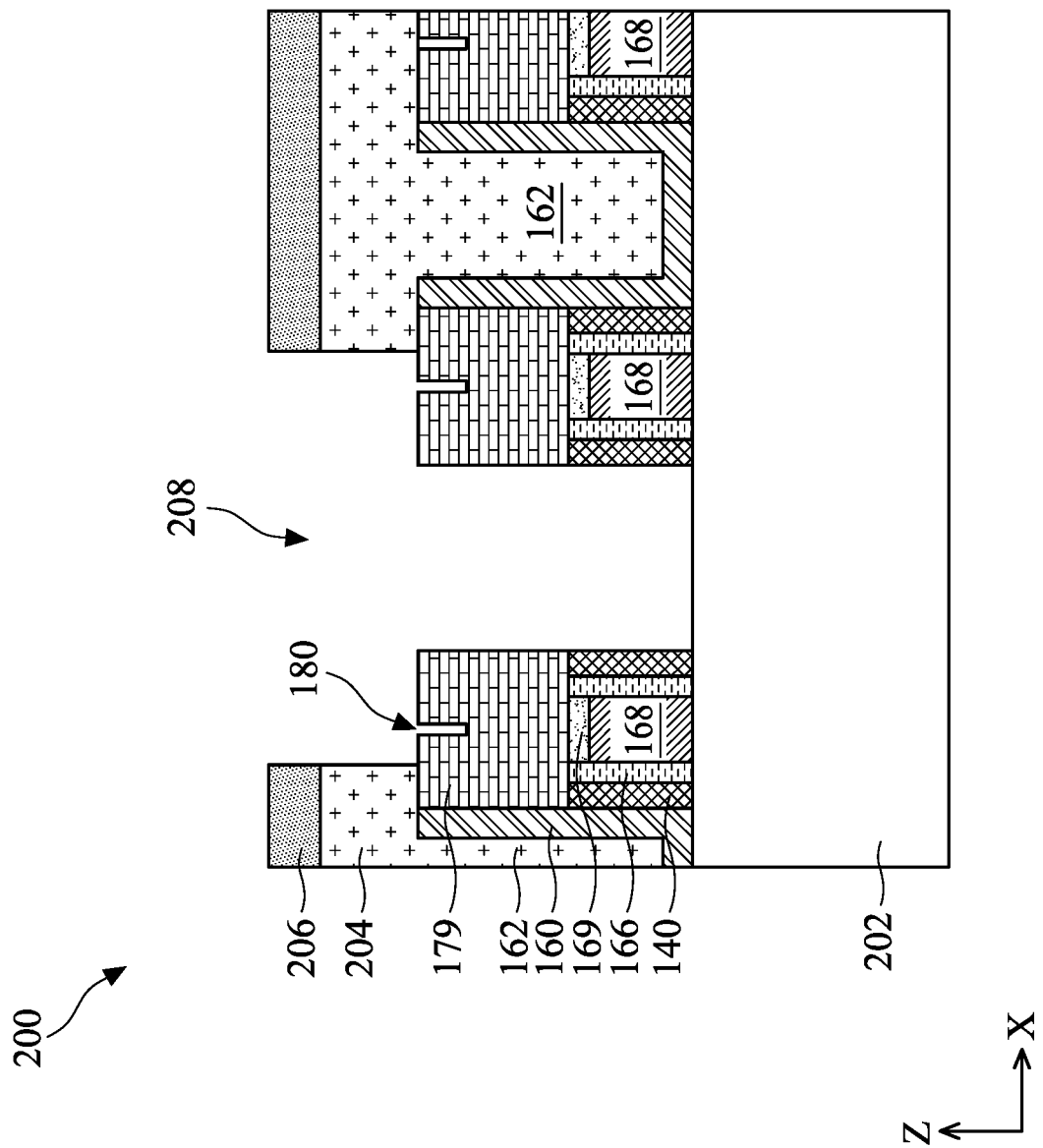
Figure 12F:
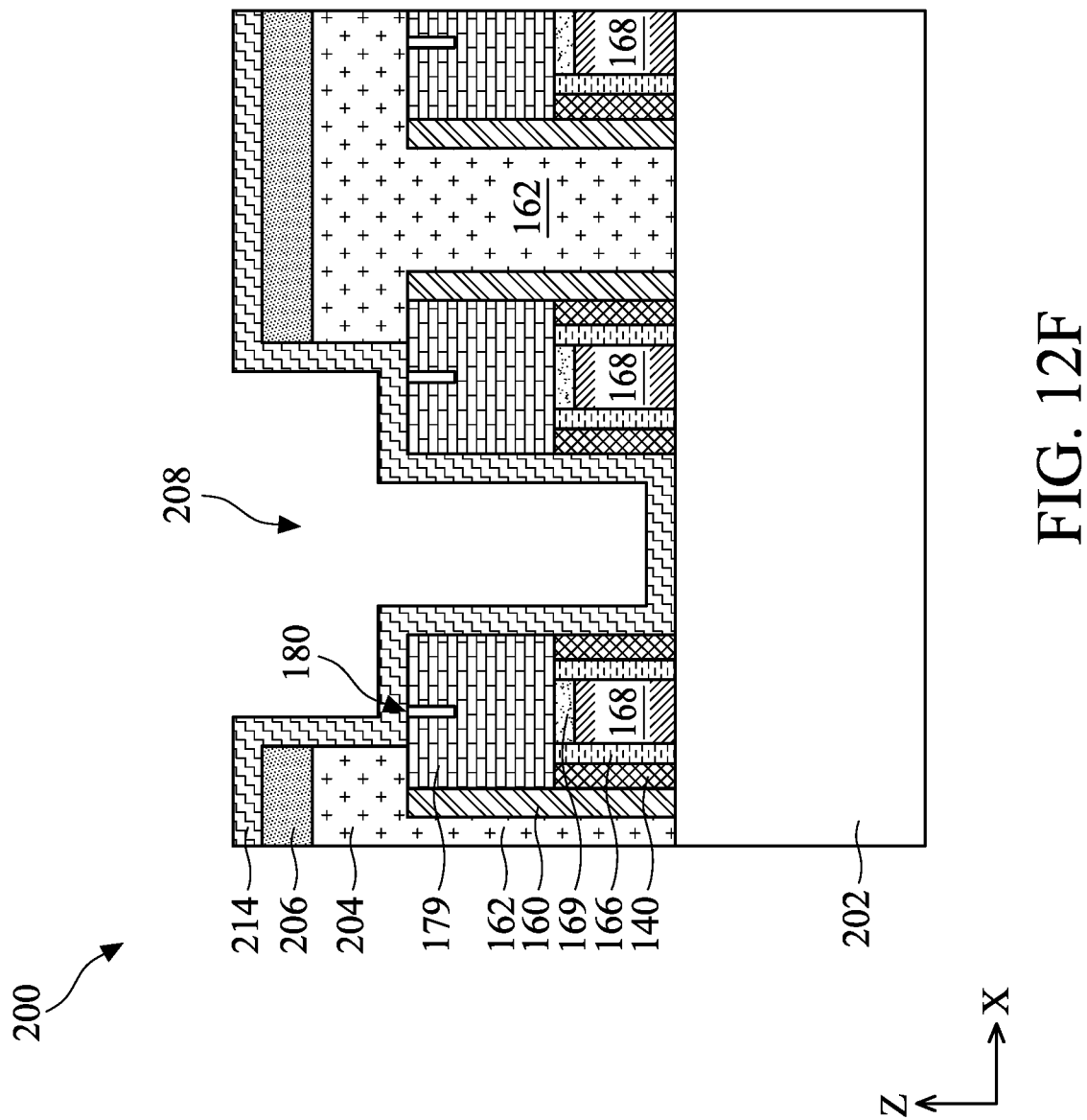
Figure 12G:
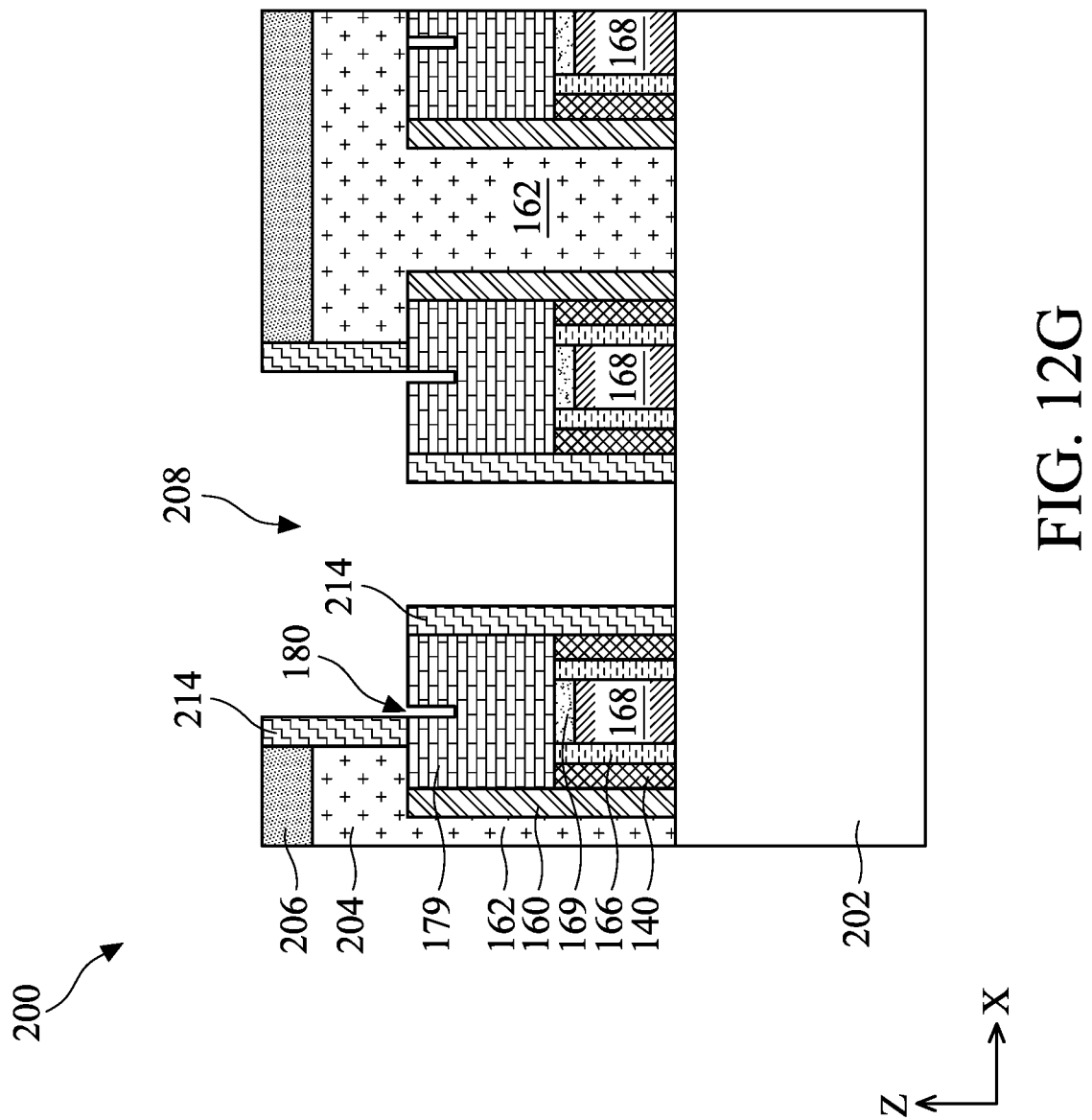
Figure 12H:
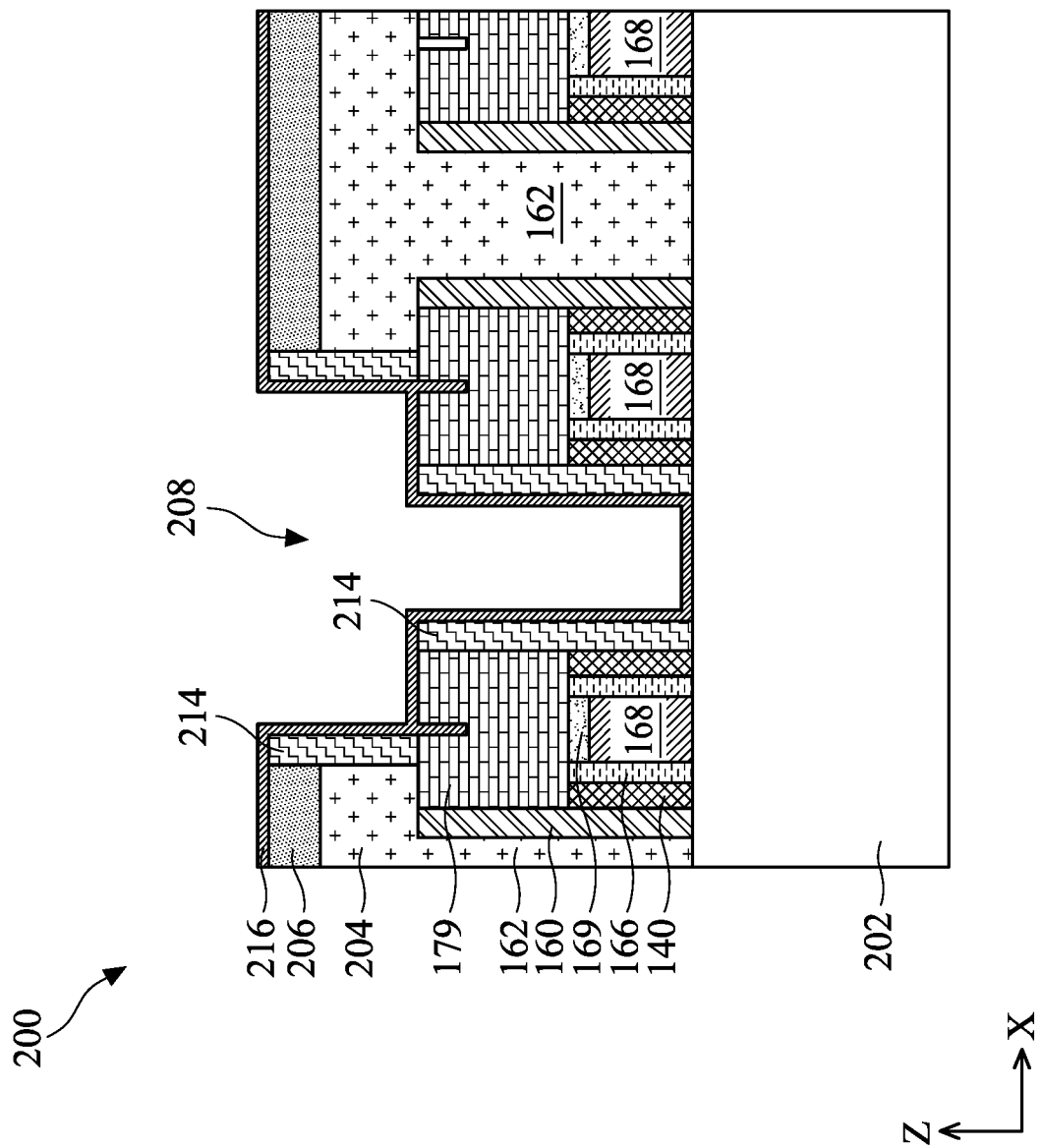
Figure 12I:
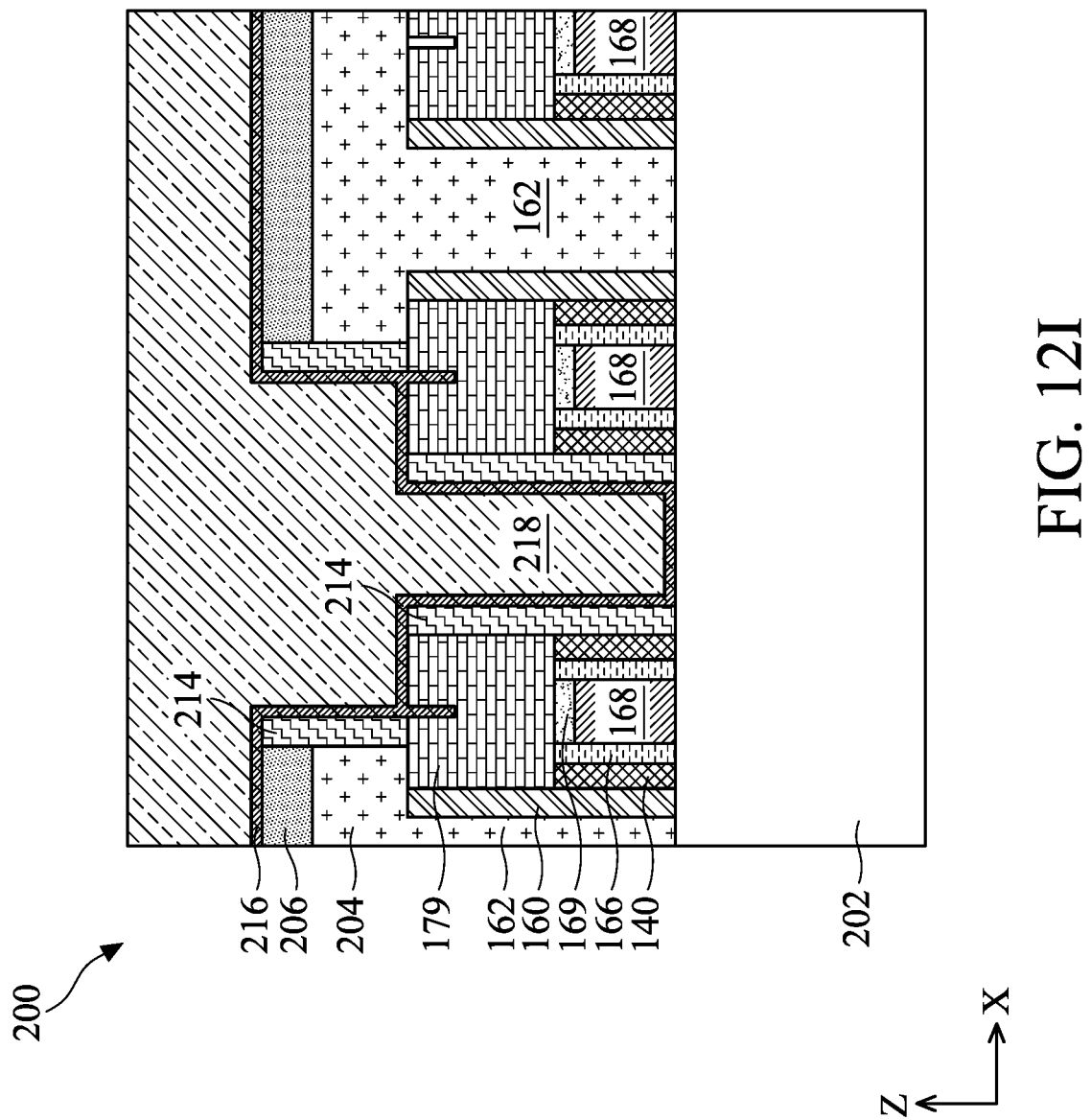
Figure 12J:
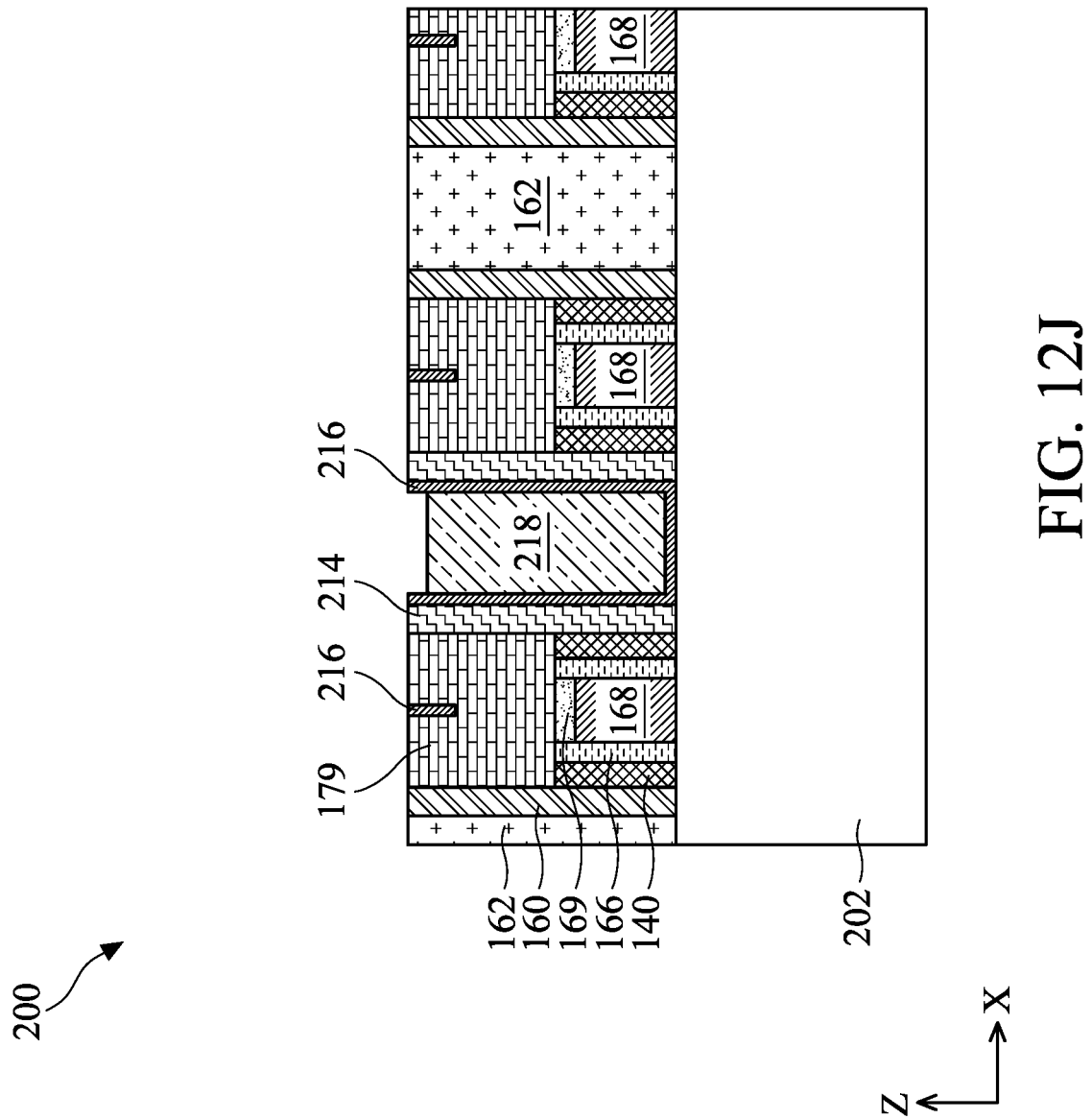
Figure 12K:
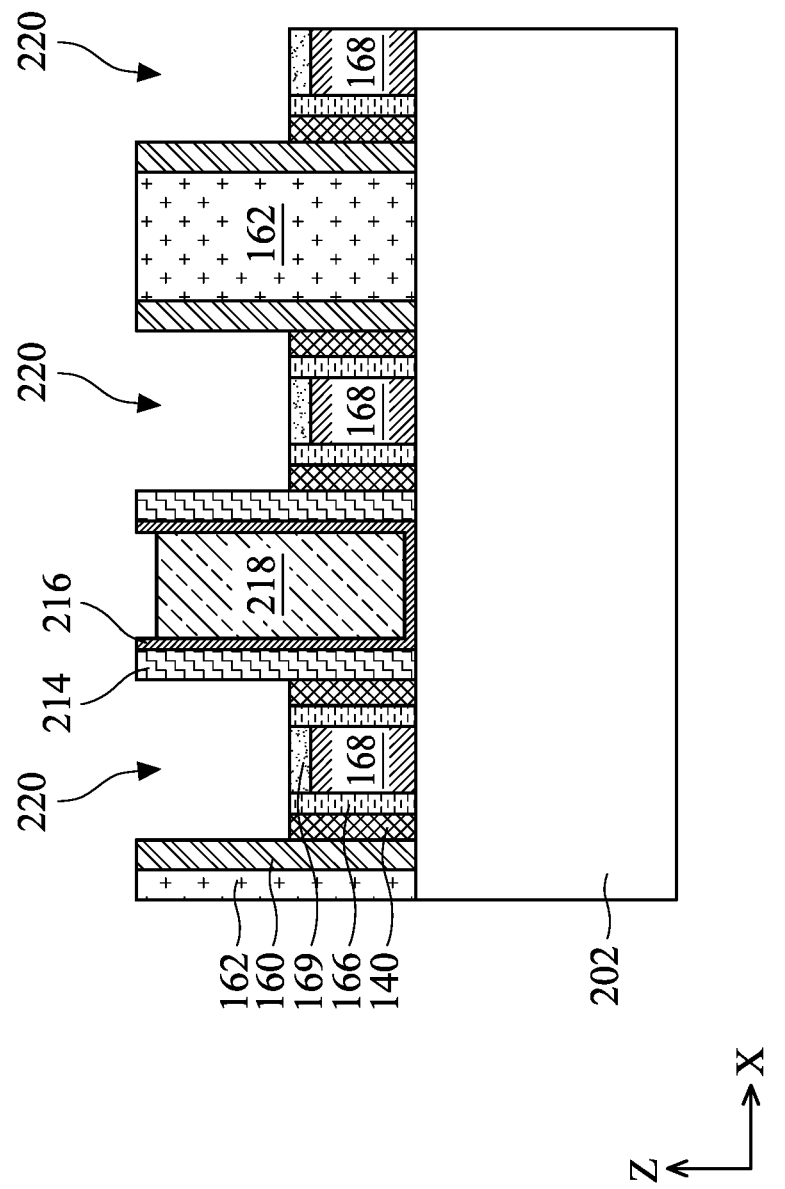
Figure 12L:
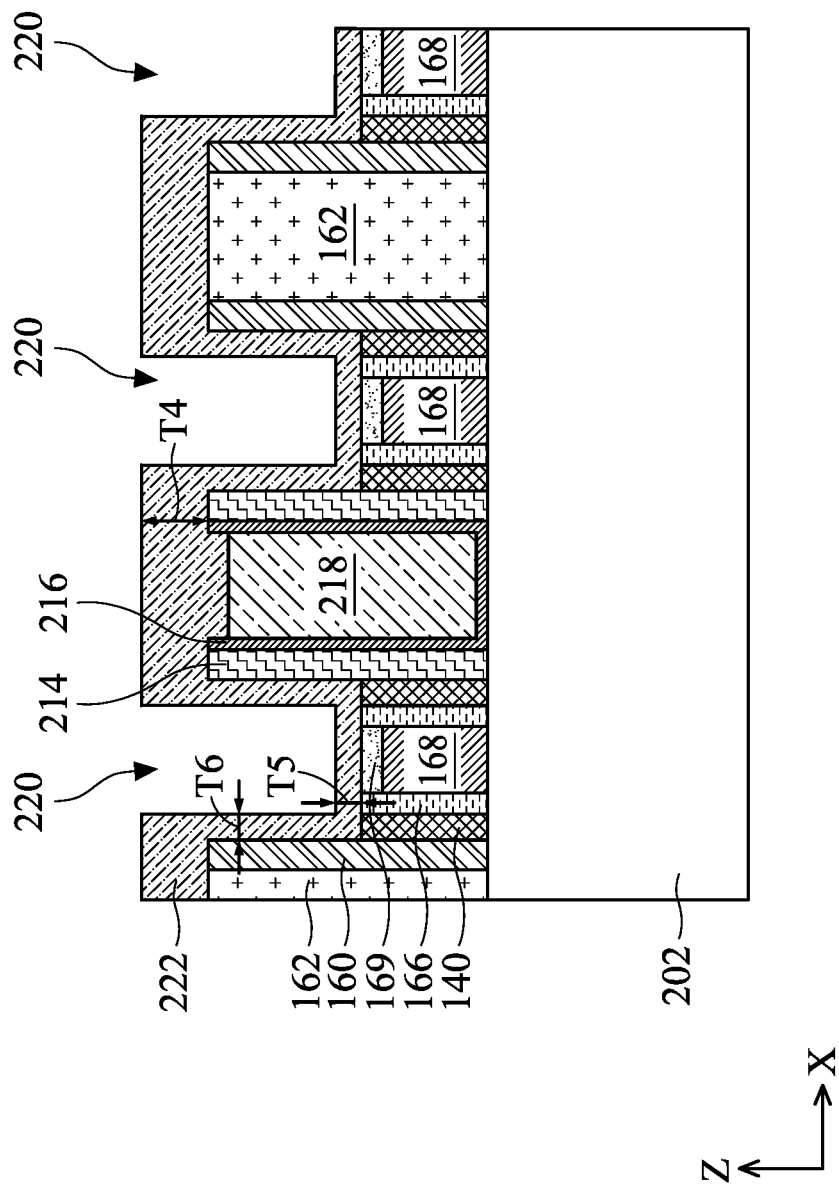
Figure 12M:
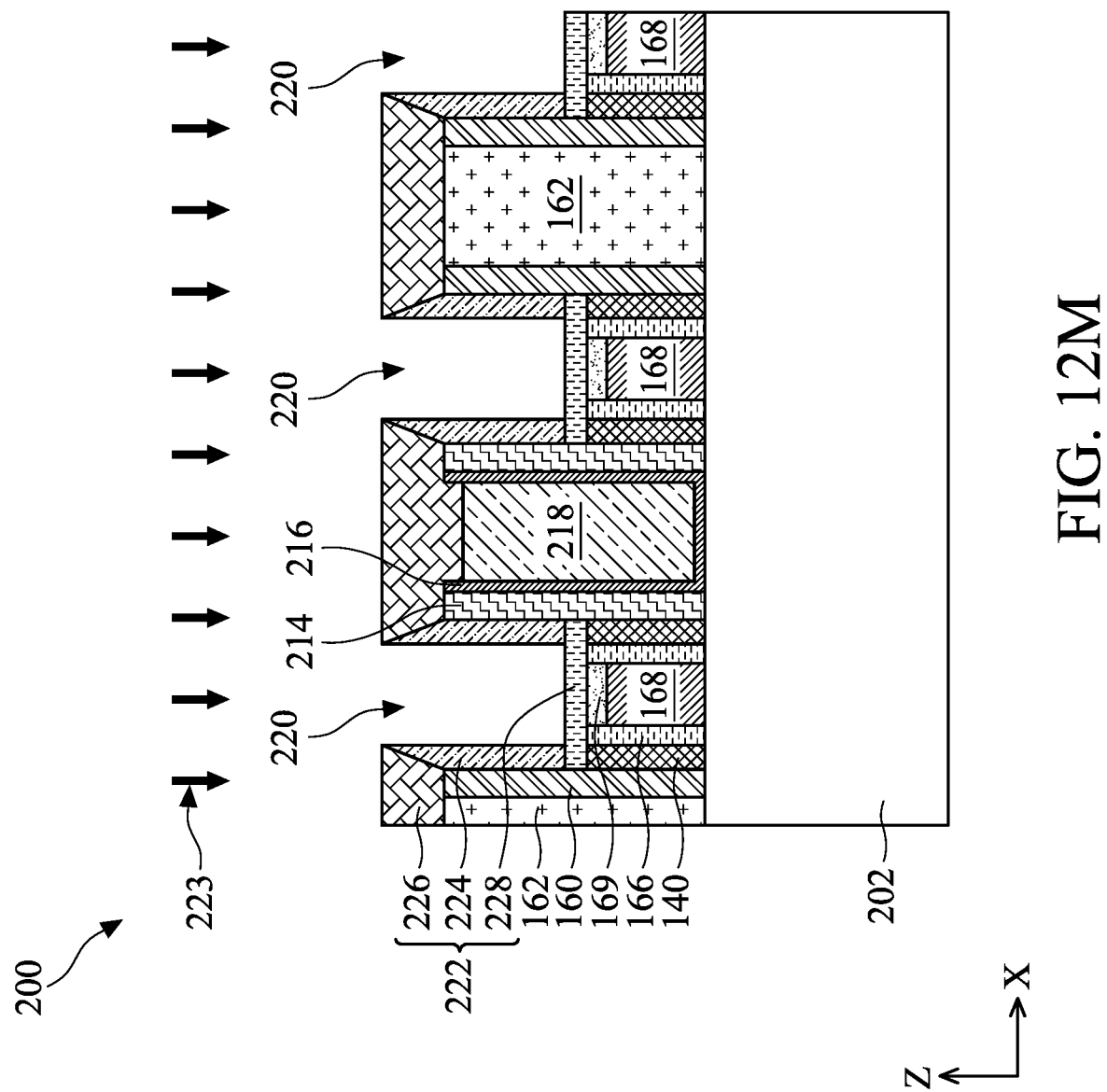
Figure 12N:
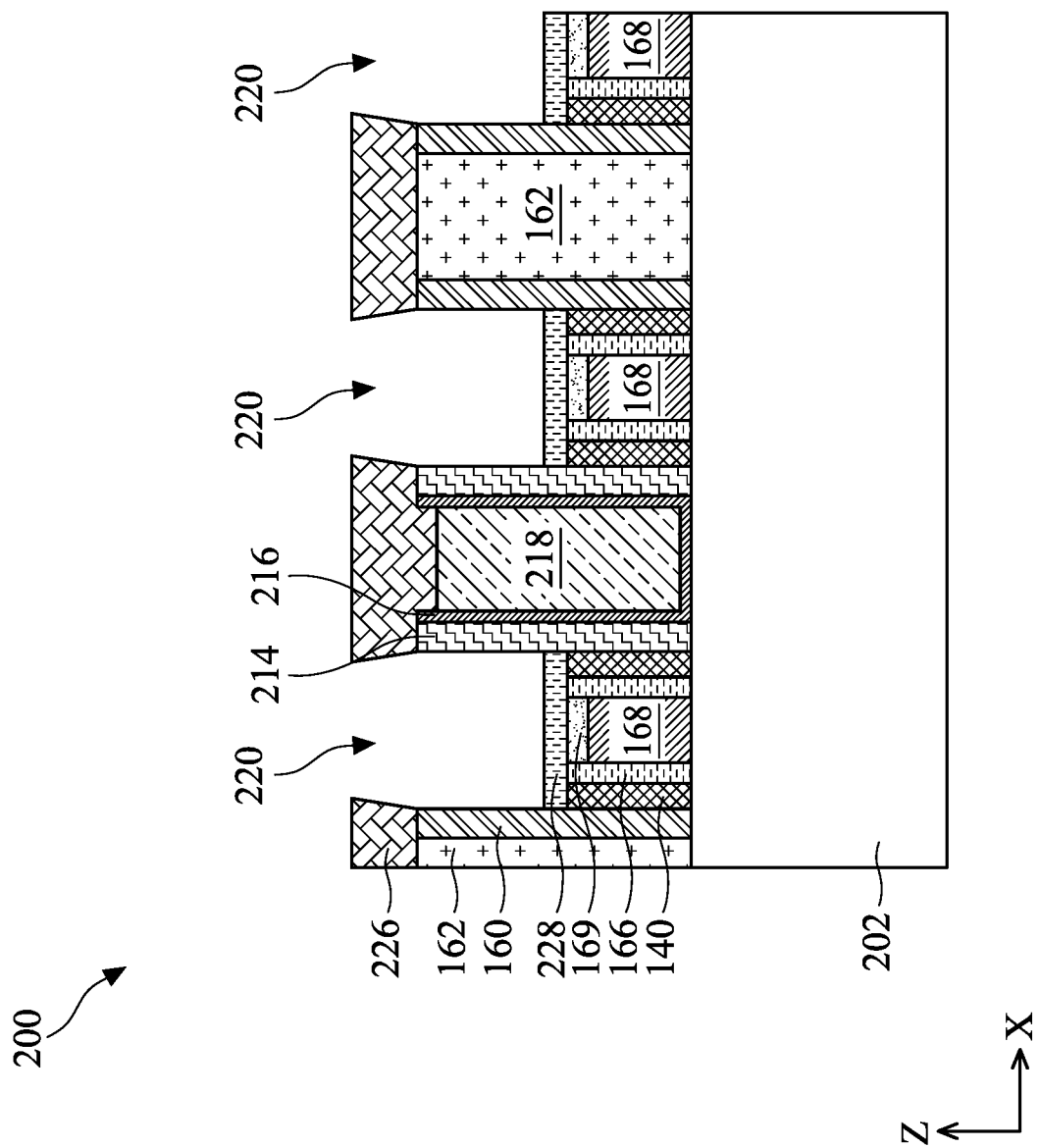
Figure 12O:
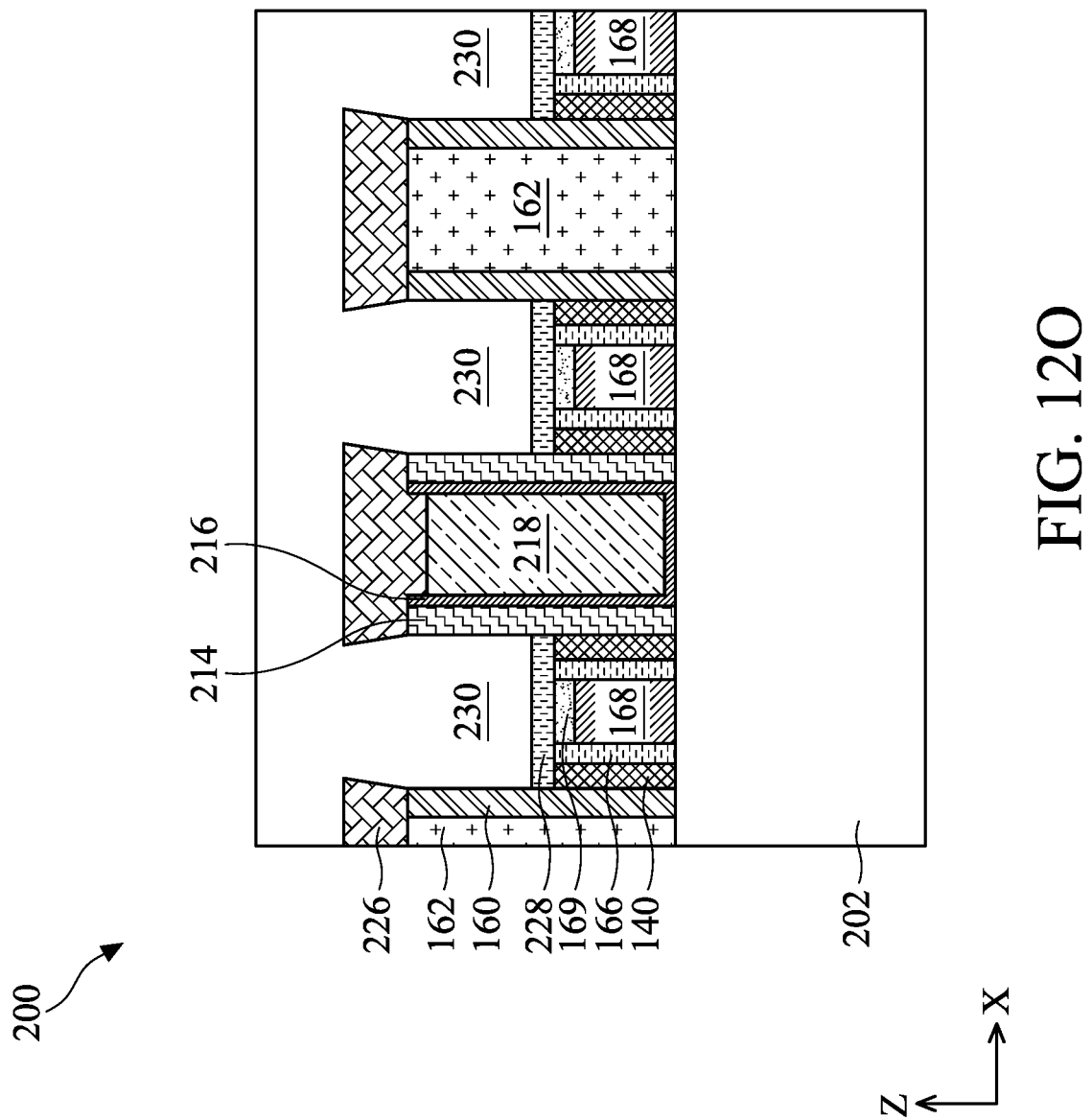
Figure 12P:
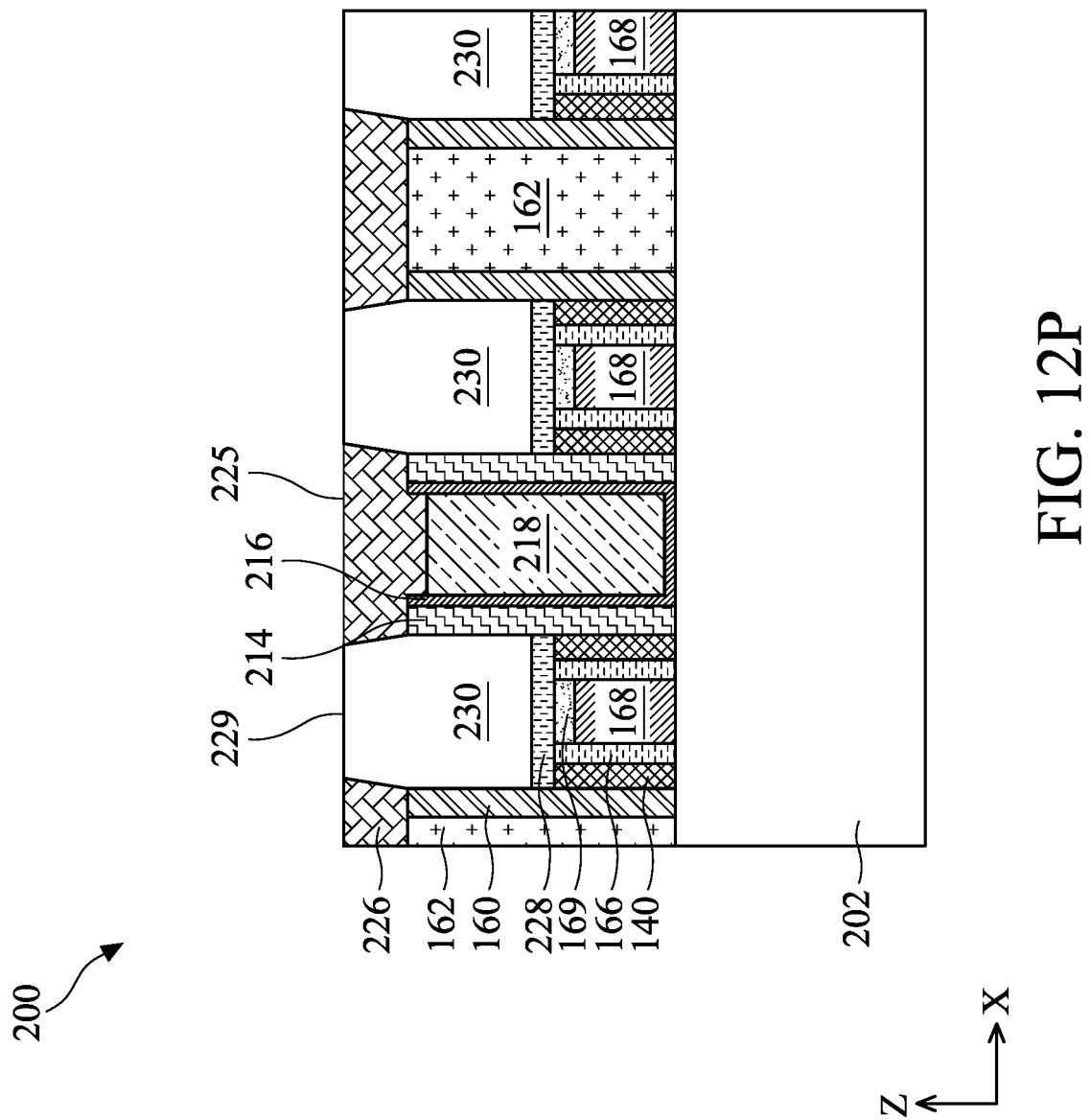
Figure 12Q:
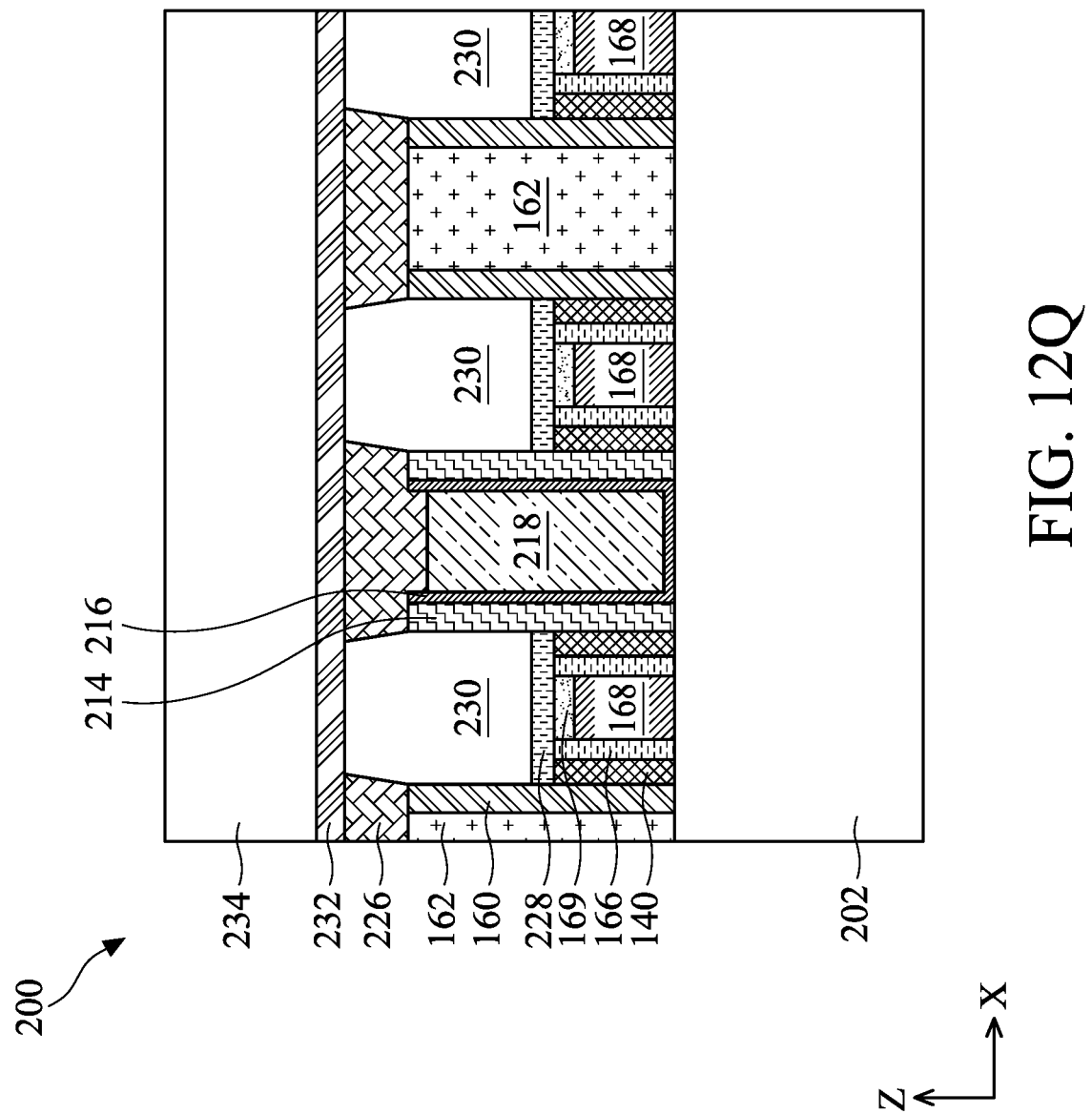
Figure 12R:
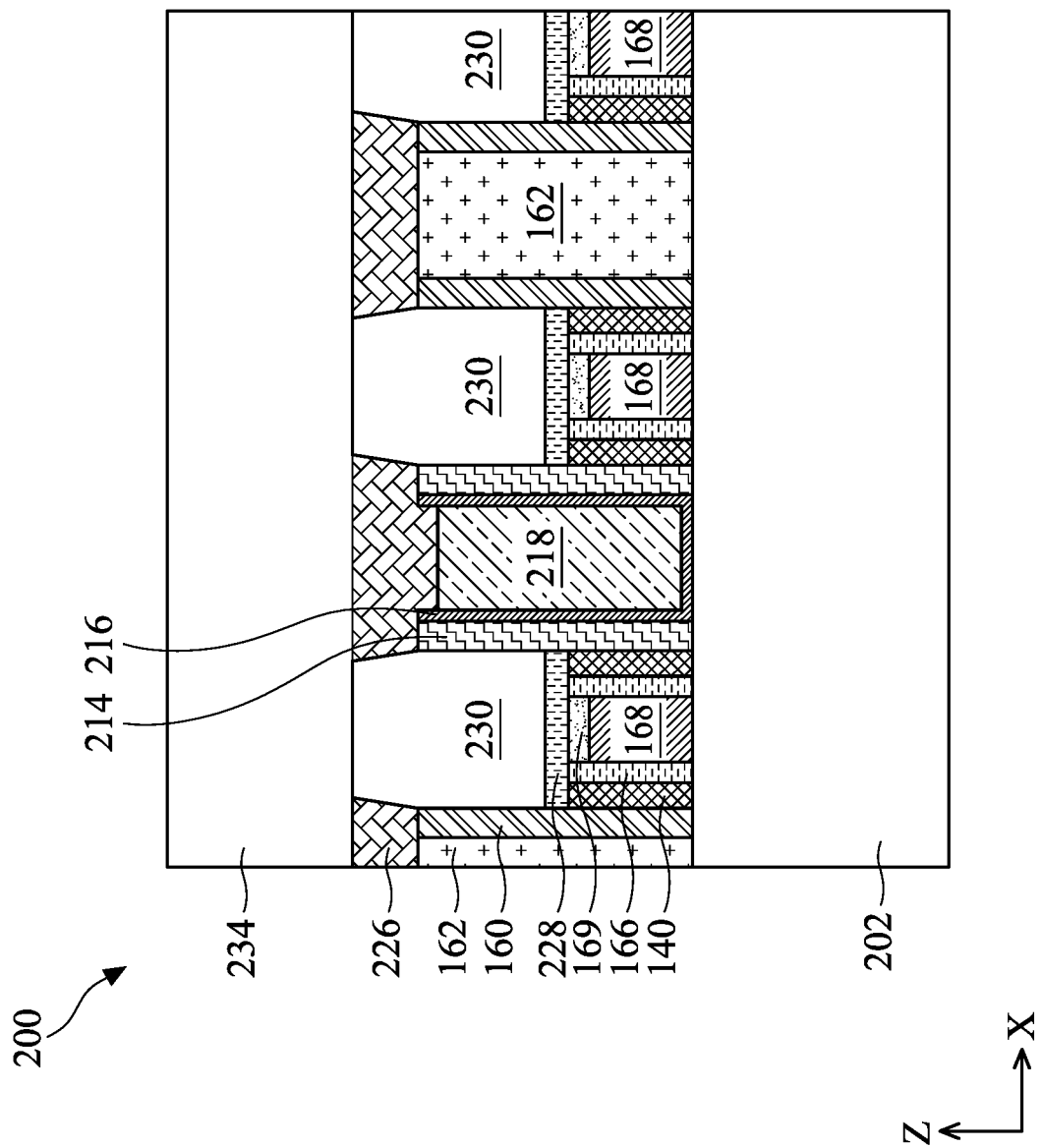
Figure 12S:
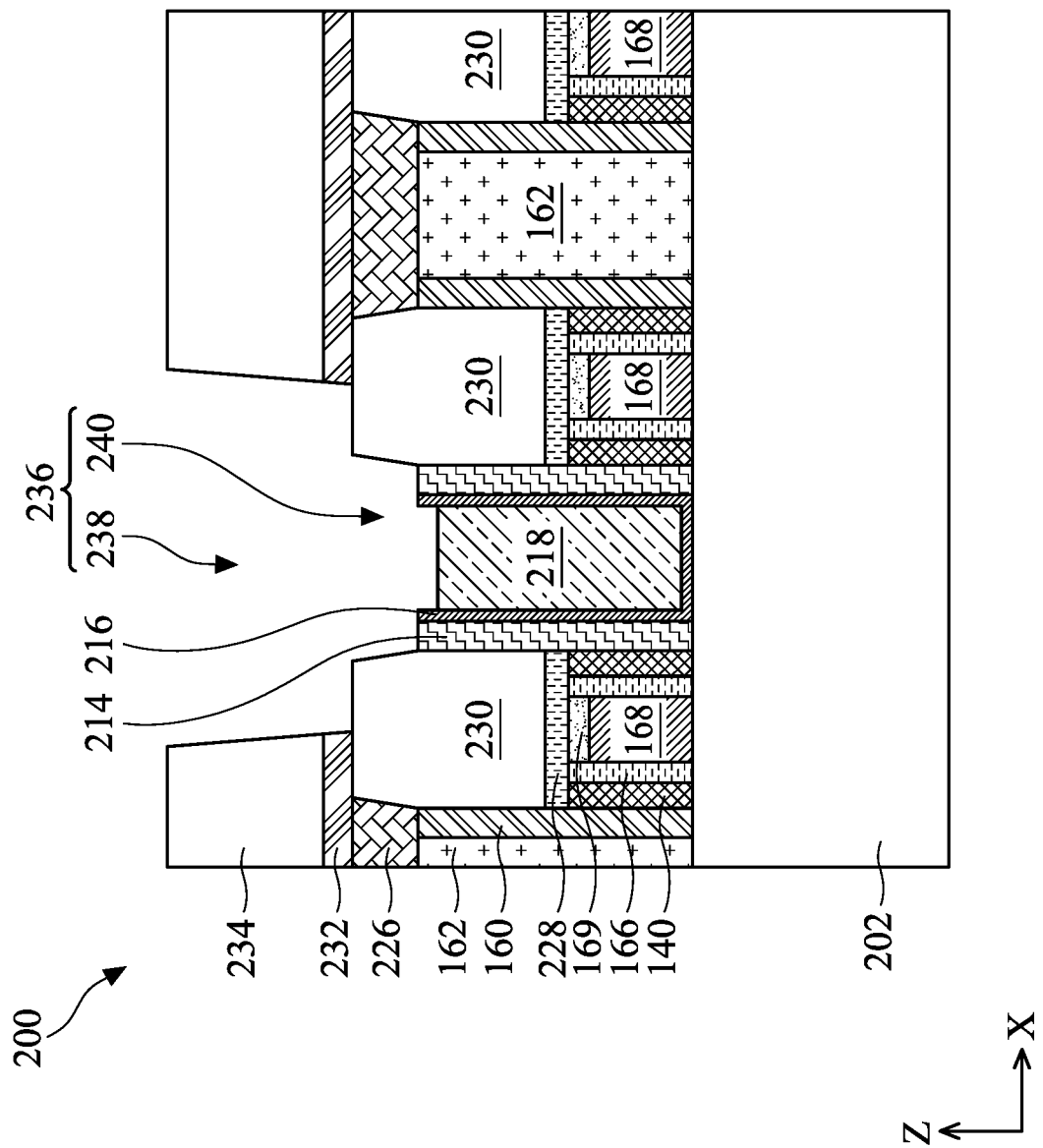
Figure 12T:
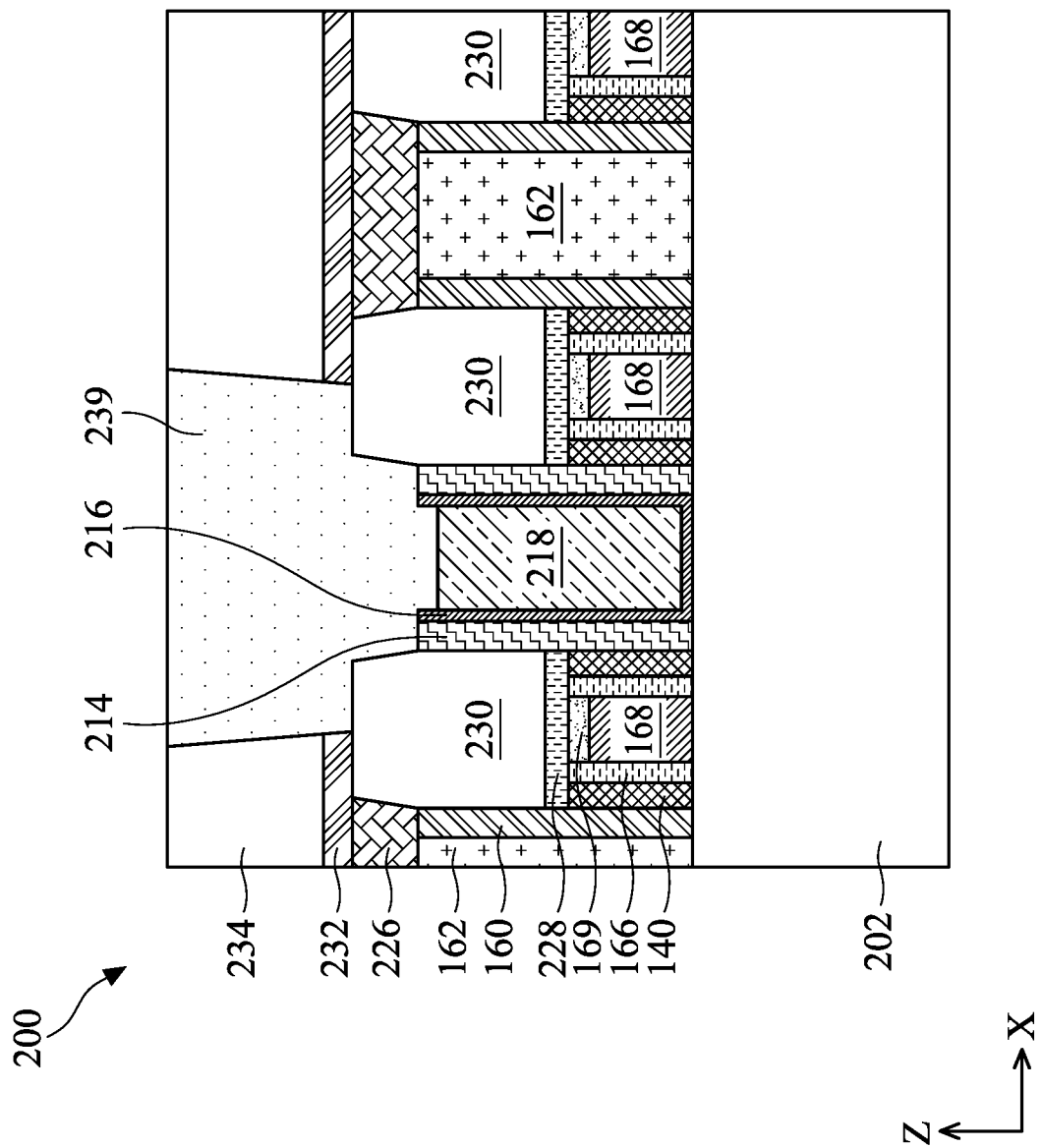
Figure 12U:
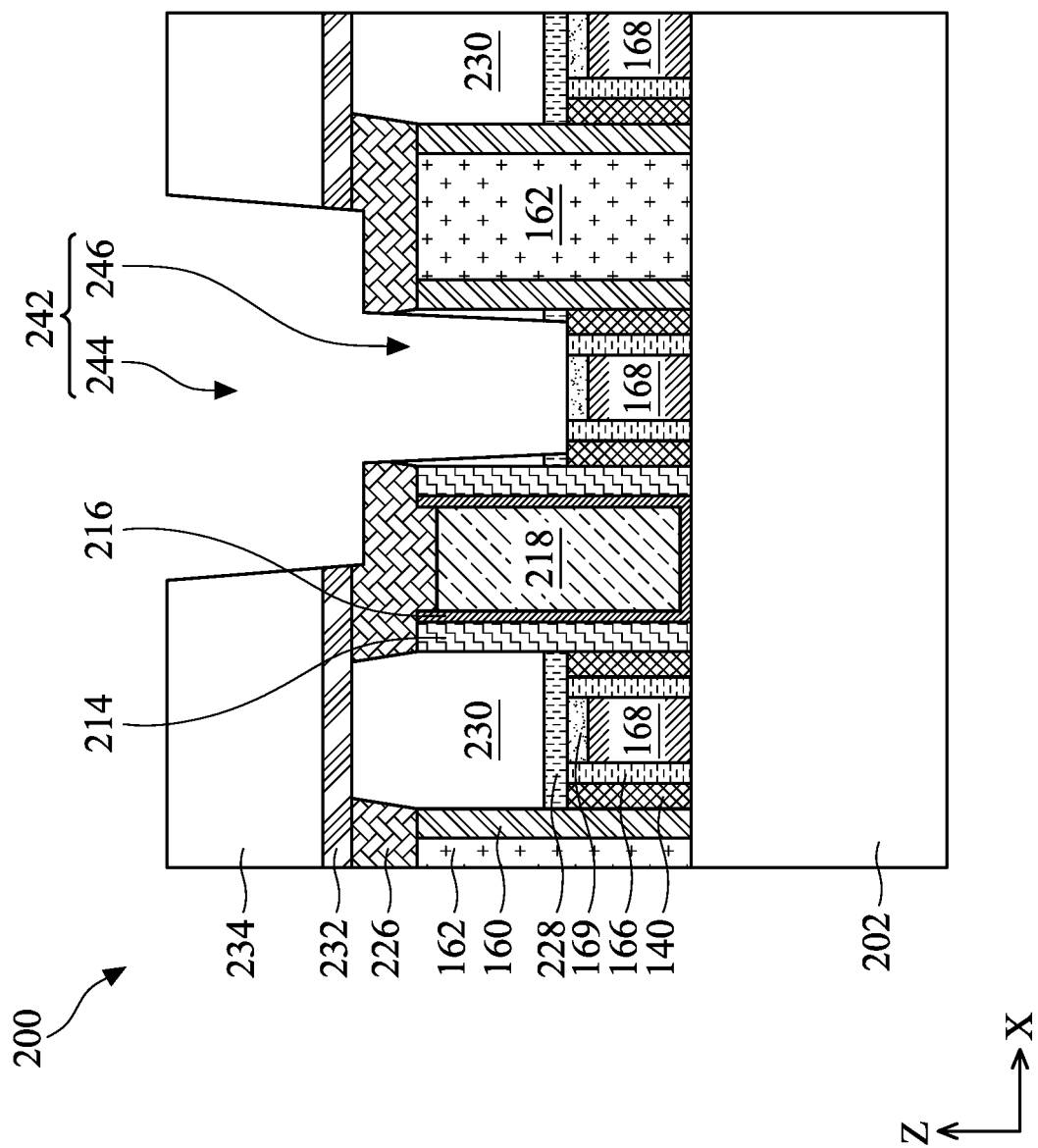
Figure 12V:
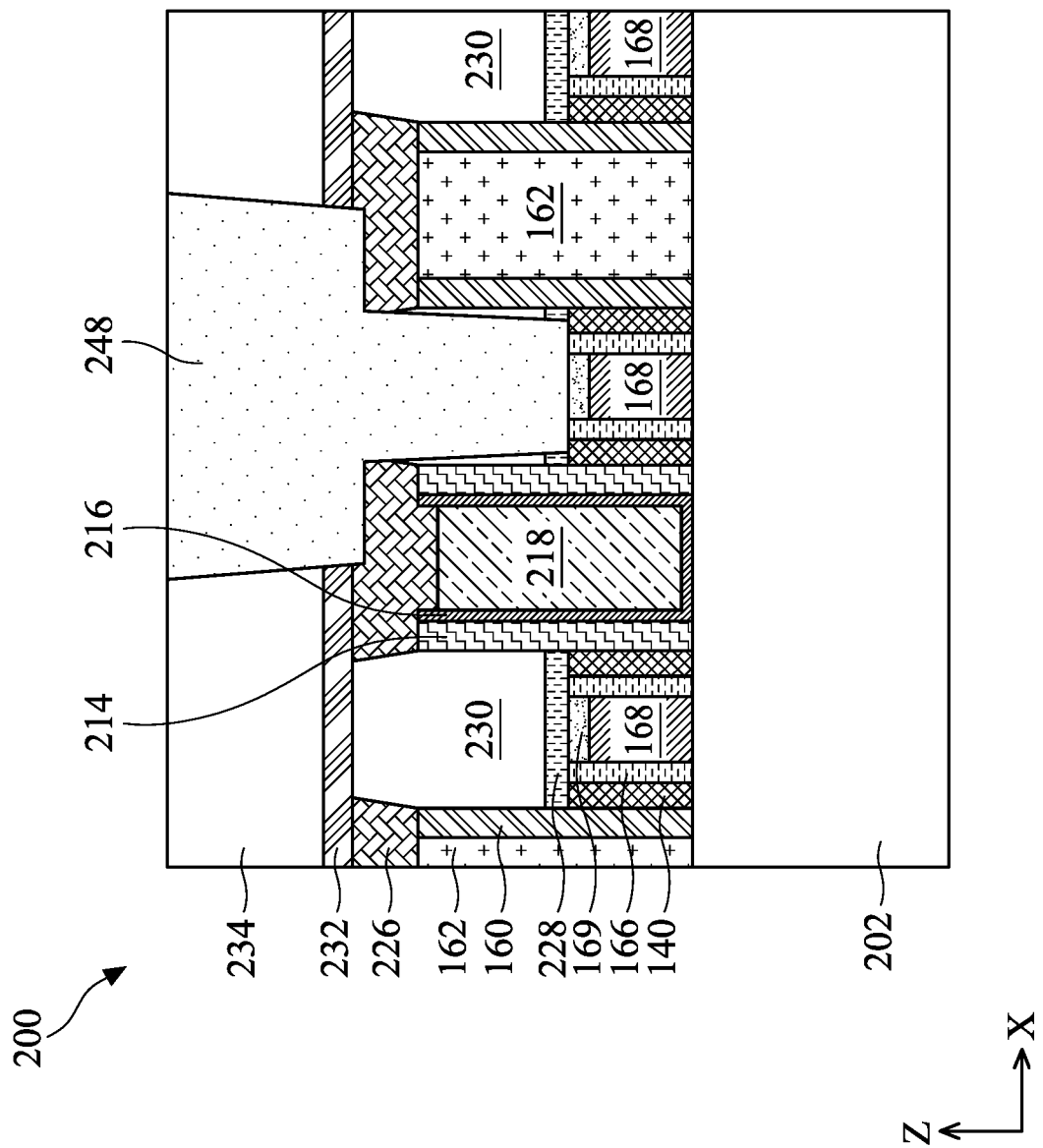
Figure 12W:
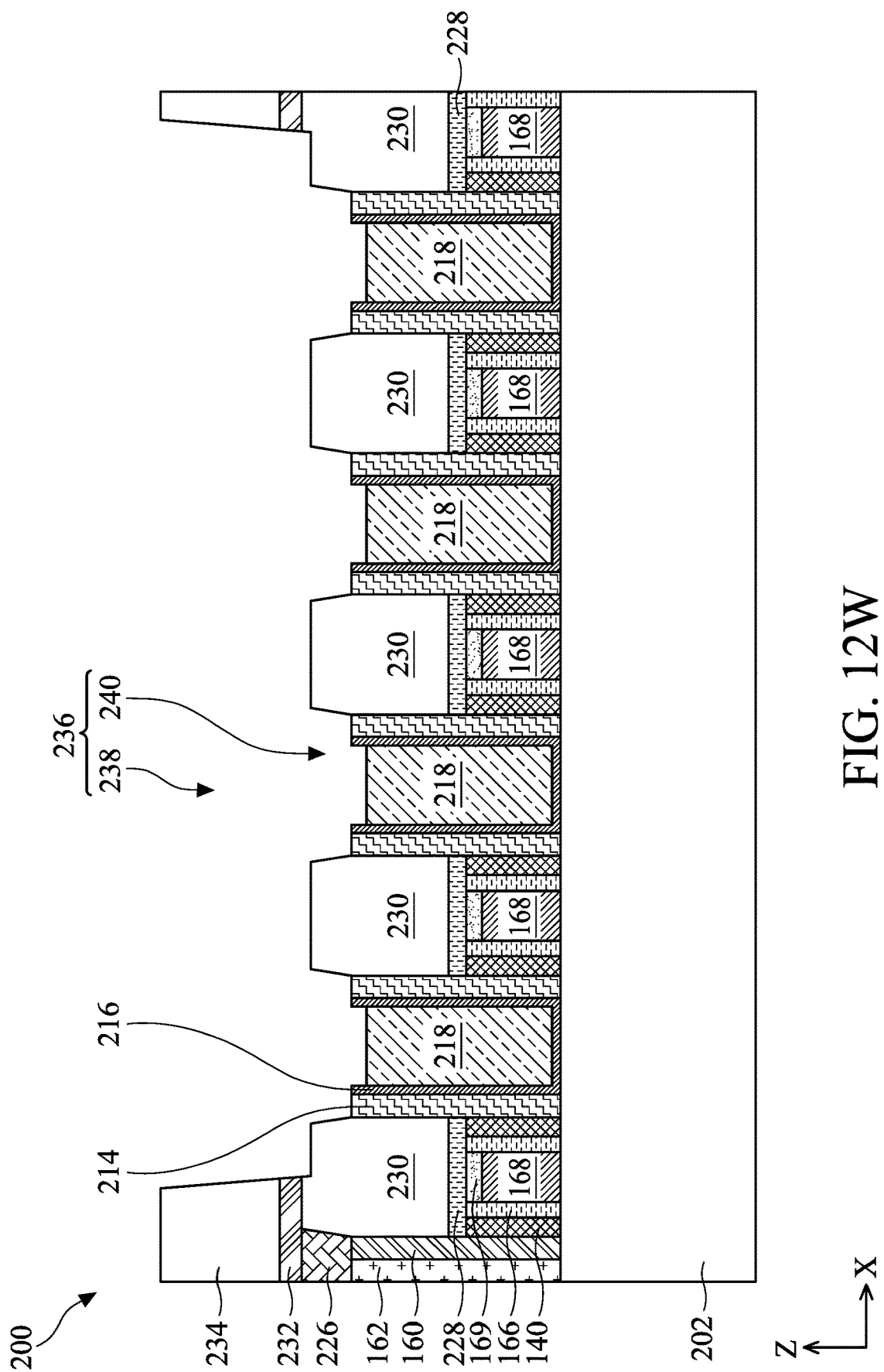
Figure 12X:
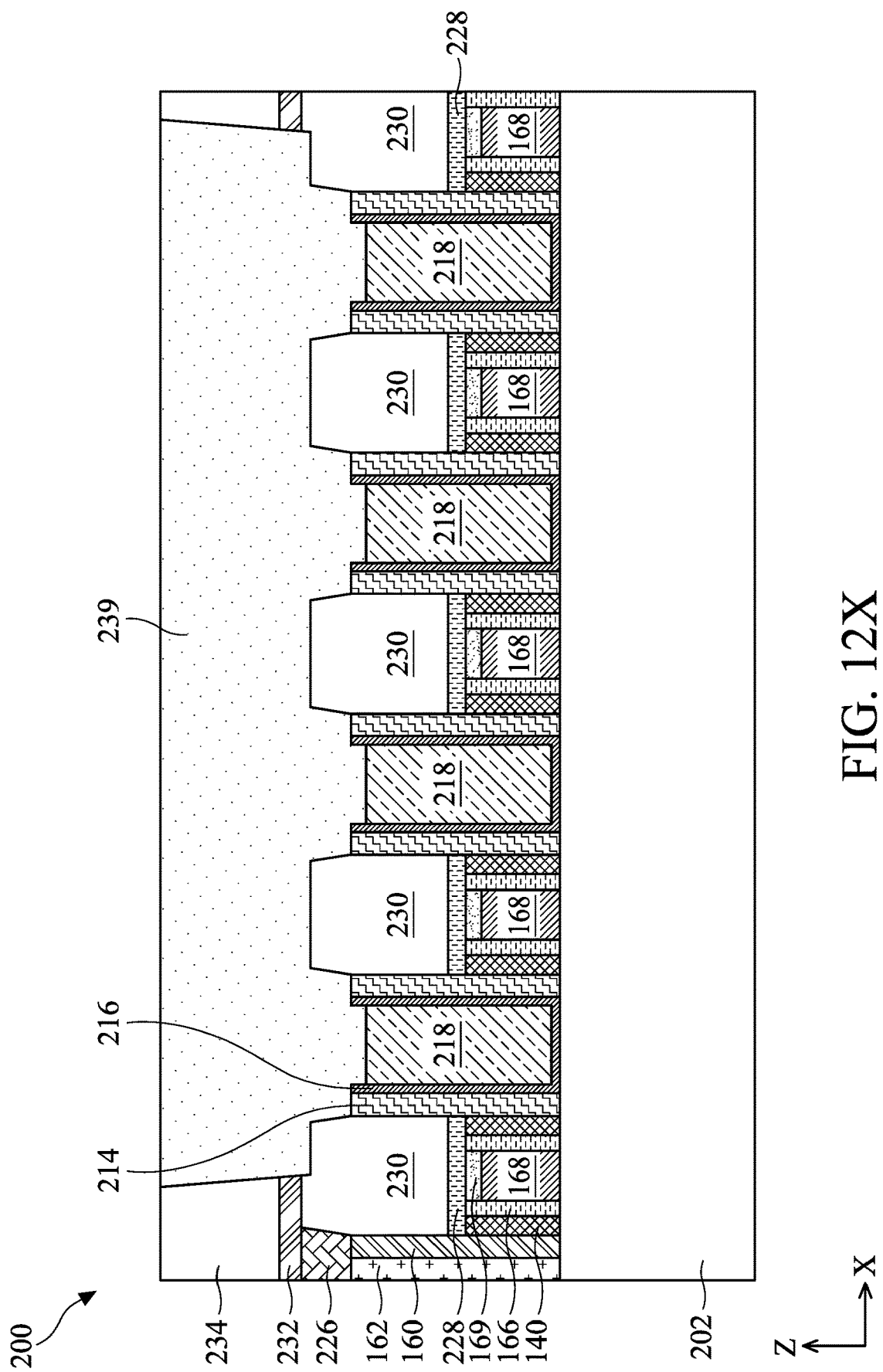
Figure 12Y:
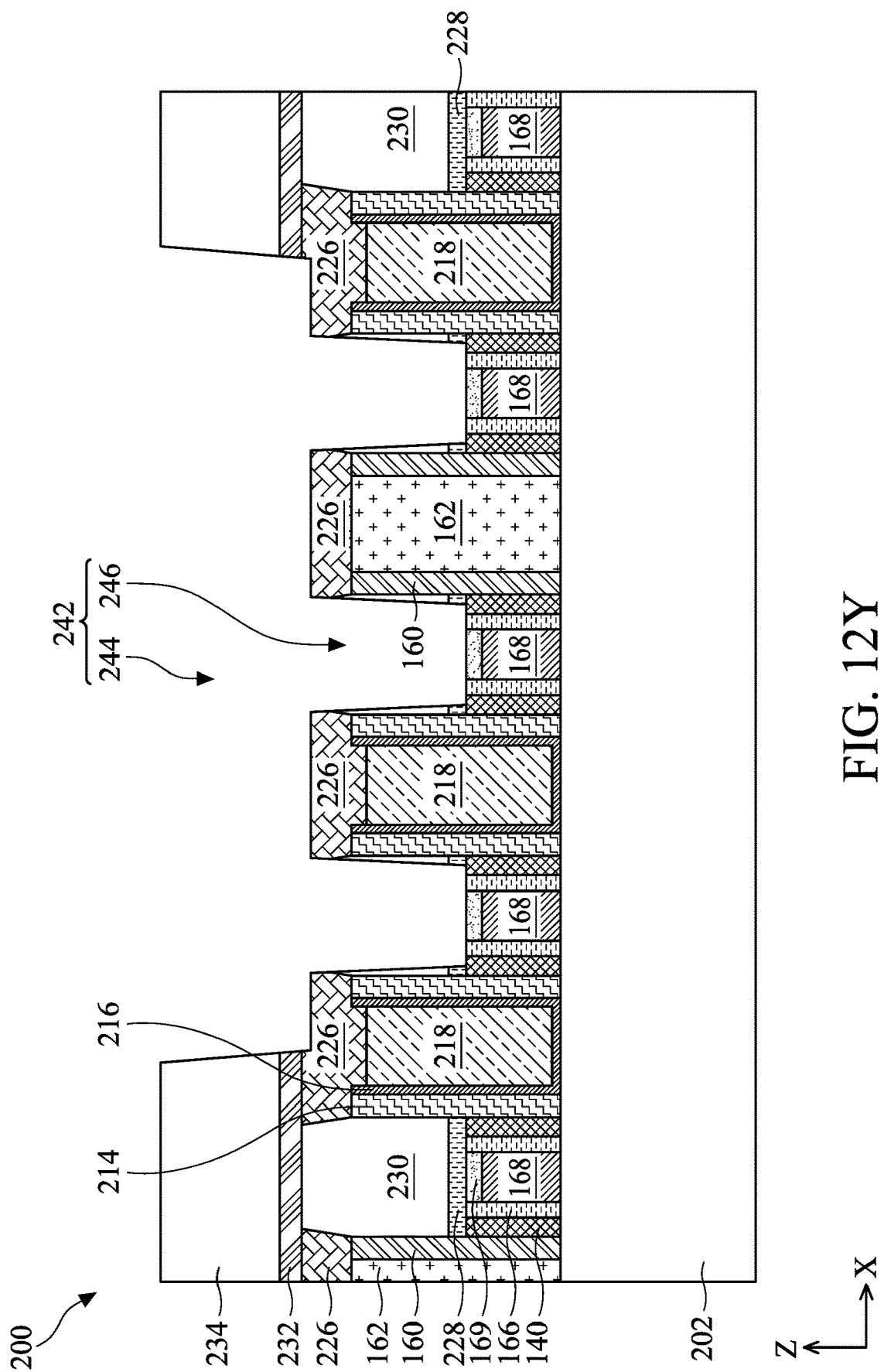
Figure 12Z:
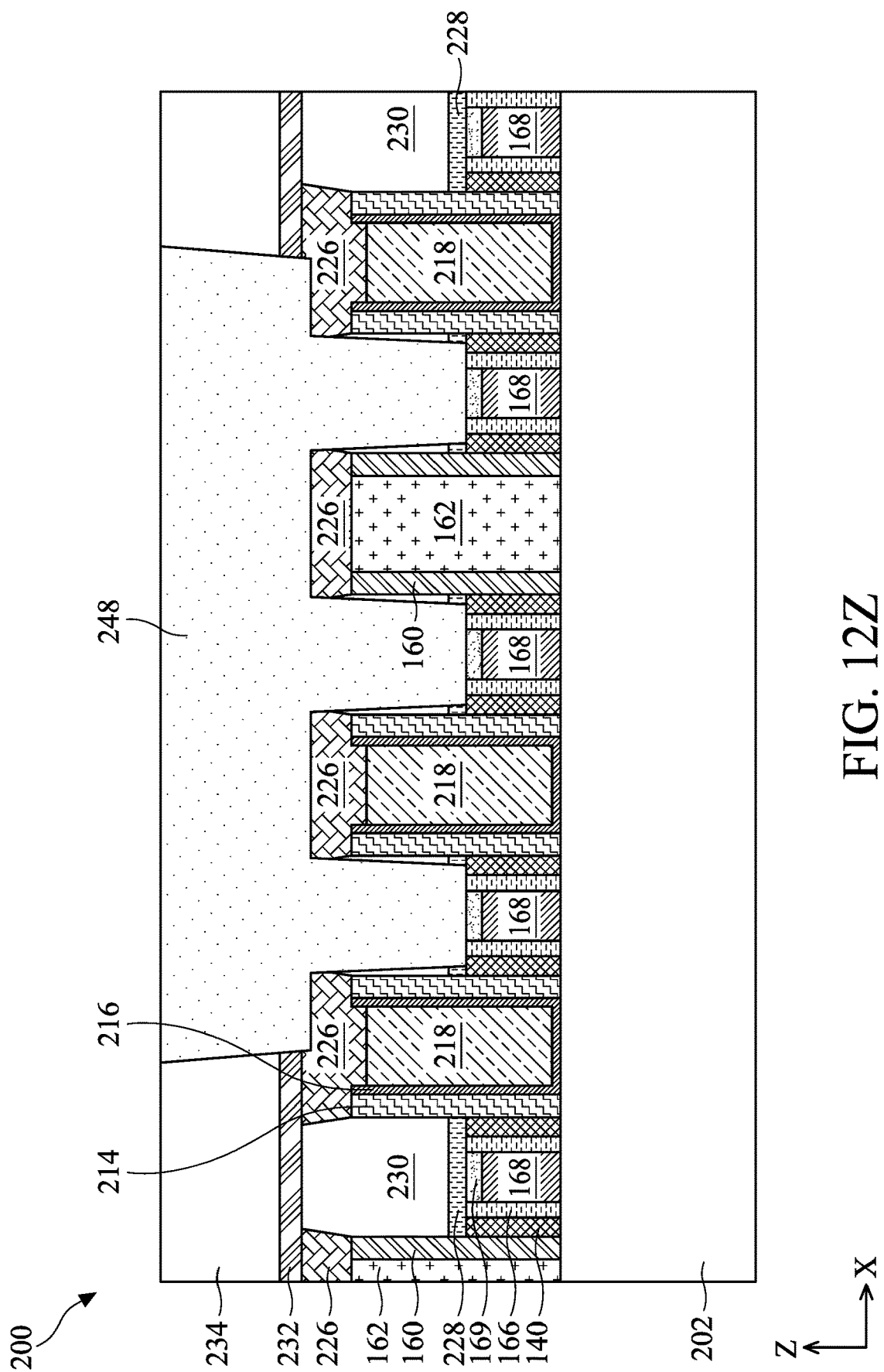

FIGS. 12A-12Z are cross-sectional views of various stages of manufacturing the semiconductor device structure 200 of FIG. 11, in accordance with some embodiments. As shown in FIG. 12A, a second ILD layer 204 is formed on the first ILD layer 162, the mask layer 179, and the CESL 160. The second ILD layer 204 may include the same material as the first ILD layer 162 and may be formed by the same process as the first ILD layer 162. The second ILD layer 204 has a thickness T1 ranging from about 50 nm to about 250 nm. The mask layer 179 has a thickness T2 ranging from about 5 nm to about 60 nm. In some embodiments, as shown in FIG. 12A, the second ILD layer 204 is not formed in the scam 180 due to the small dimensions of the seam 180. In some embodiments, the second ILD layer 204 is formed in the seam 180.

As shown in FIG. 12B, a hard mask layer 206 is formed on the second ILD layer 204. The hard mask layer 206 may include a material that has different etch selectivity than the second ILD layer 204. In some embodiments, the hard mask layer 206 includes silicon or SiN. The hard mask layer 206 has a thickness T3 ranging from about 5 nm to about 20 nm. As shown in FIG. 12C, the hard mask layer 206 is patterned. As a result, one or more openings 208 are formed in the hard mask layer 206. The openings 208 may be formed by any suitable process, such as a dry etch process, a wet etch process, or a combination thereof. The opening 208 has a width W1 ranging from about 0.3 microns to about 2 microns. The opening 208 may be disposed over one or more portions of the first ILD layer 162. In some embodiments, as shown in FIG. 12B, the opening 208 is formed over a portion of the first ILD layer 162 disposed between two adjacent mask layers 179. In some embodiments, the opening 208 is formed over multiple portions of the first ILD layer 162 disposed between multiple adjacent mask layers 179. The opening 208 exposes a portion of the second ILD layer 204.

As shown in FIG. 12D, the opening 208 is enlarged by removing the exposed portion of the second ILD layer 204 and the portion of the first ILD layer 162. In some embodiments, the first and second ILD layers 162, 204 include the same material. As a result, the portions of the first and second ILD layers 162, 204 are selectively removed by a removal process. The removal process may be any suitable process, such as a dry etch process, a wet etch process, or a combination thereof. The removal process does not substantially affect the mask layers 179 and the CESL 160. As a result of the removal process, a portion of each of the adjacent mask layers 179 is exposed, and a portion of the CESL 160 disposed between the adjacent mask layers 179 is exposed. In some embodiments, the seam 180 formed in the mask layer 179 is also exposed. The opening 208 may include a bottom portion 210 and an upper portion 212. The bottom portion 210 may be a trench having a depth D1 and a width W2. In some embodiments, the depth D1 ranges from about 20 nm to about 80 nm, and the width W2 ranges from about 10 nm to about 50 nm.

As shown in FIG. 12E, the exposed portion of the CESL 160 is removed by any suitable process. In some embodiments, the exposed portion of the CESL 160 is removed by a selective etching process that does not substantially affect the mask layer 179, the spacers 140, and the S/D epitaxial features 152 (FIG. 10B) or the S/D epitaxial features 154 (FIG. 10C). As shown in FIG. 12F, a liner 214 is formed in the opening 208. In some embodiments, the liner 214 includes a material having a lower K value than the CESL 160. For example, the liner 214 may include SiC, SiCO, SiCON, SiON, or a low-K dielectric material, which has a lower K value compared to the SiN of the CESL 160. The material of the liner 214 also has different etch selectivity compared to the material of the mask layer 179. In some embodiments, the liner 214 is a conformal layer formed by ALD. The liner 214 may have a thickness ranging from about 1 nm to about 10 nm. In some embodiments, as shown in FIG. 12F, the liner 214 is not formed in the seam 180 due to the small dimensions of the seam 180. In some embodiments, the liner 214 is formed in the seam 180.

As shown in FIG. 12G, portions of the liner 214 are removed. In some embodiments, an anisotropic etching process is performed to remove the portions of the liner 214 disposed on horizontal surfaces, while the portions of the liner 214 disposed on vertical surfaces are not substantially affected. For example, the remaining portions of the liner 214 may be disposed on the side surfaces of the mask layers 179 and side surfaces of the spacers 140. The liner 214 has a lower K value compared to the CESL 160. Thus, parasitic capacitance is reduced. As a result of the anisotropic etching process, the S/D epitaxial features 152 (FIG. 10B) or the S/D epitaxial features 154 (FIG. 10C) are exposed.

As shown in FIG. 12H, a glue layer 216 is formed in the opening 208. In some embodiments, the glue layer 216 includes an electrically conductive material, such as TiN or TaN. In some embodiments, the glue layer 216 is a conformal layer formed by ALD, and the seams 180 are filled with the glue layer 216 due to the ALD process. The glue layer 216 may be also formed on the hard mask layer 206. The glue layer 216 may have a thickness ranging from about 1 nm to about 10 nm. In some embodiments, the glue layer 216 is optional and may not be present. As shown in FIG. 12I, a conductive material 218 is formed in the opening 208 and over the hard mask layer 206. The conductive material 218 may include an electrically conductive material, such as a metal. In some embodiments, the conductive material 218 includes Ru, Co, W, Cu, Mo, or other suitable metal. The conductive material 218 may be formed by any suitable process, such as ECP or PVD.

As shown in FIG. 12J, a planarization process is performed to expose the mask layers 179. The planarization process may be a CMP process. The CMP process may remove the portions of the conductive material 218, the glue layer 216, and the liner 214 disposed over the mask layers 179. In addition, the hard mask layer 206 and the second ILD layer 204 are removed by the CMP process. The remaining conductive material 218 disposed in the bottom portion 210 of the opening 208 (FIG. 12D) may have a top surface at a level below a top surface of the mask layer 179 due to the dishing effect. The remaining conductive material 218 is electrically connected to the S/D epitaxial features 152 (or S/D epitaxial features 154) (FIGS. 10B and 10C), and the remaining conductive material 218 may be a conductive feature, such as a conductive plug or conductive contact.

As shown in FIG. 12K, the mask layers 179 are removed. The mask layers 179 may be removed by any suitable process. In some embodiments, the mask layers 179 are removed by a selective etching process. The selective etching process does not substantially affect the CESL 160, the liner 214, the glue layer 216, and the conductive material 218. The glue layer 216 formed in the seam 180 (FIG. 12G) may be also removed as a result of the removal of the mask layers 179. After the removal of the mask layers 179, the spacers 140, the gate dielectric layers 166, and the cap layers 169 are exposed in openings 220.

As shown in FIG. 12L, a hard mask layer 222 is formed in the openings 220 and on the first ILD layer 162, the CESL 160, the spacers 140, the gate dielectric layers 166, and the cap layers 169. The hard mask layer 222 may include a porous dielectric material, such as porous SiN, SiC, SiCO, SiCON, SiCN, or a low-K dielectric material. In some embodiments, the hard mask layer 222 includes porous SiN. The hard mask layer 222 may be a non-conformal layer having different thicknesses in different areas. For example, in some embodiments, each portion of the hard mask layer 222 disposed on the liner 214, the glue layer 216, the CESL 160, and the first ILD layer 162 has a thickness T4, each portion of the hard mask layer 222 disposed on the spacers 140, the gate dielectric layers 166, and the cap layers 169 has a thickness T5 substantially less than the thickness T4, and each portion of the hard mask layer 222 disposed on the side surfaces of the CESL 160 has a thickness T6 substantially less than the thickness T5. In some embodiments, the thickness T4 ranges from about 5 nm to about 30 nm, the thickness T5 ranges from about 1 nm to about 20 nm, and the thickness T6 ranges from about 1 nm to about 10 nm. The hard mask layer 222 may be formed by a non-conformal process, such as a CVD process.

As shown in FIG. 12M, a treatment process is performed on the portions of the hard mask layer 222. The treatment process may be a plasma treatment process. The plasma treatment process may utilize one or more gases, such as Ar, Ge, B, As, or any suitable gas, to change the physical properties of the treated portions of the hard mask layer 222. The species in the plasma may be implanted or doped into the portions of the hard mask layer 222 disposed on horizontal surfaces as a result of directional plasma treatment process. For example, a bia power may be applied to the substrate 202, and the direction of the species 223 in the plasma is substantially perpendicular to the top surface of the hard mask layer 222. As a result, the portions of the hard mask layer 222 disposed on the liner 214, the glue layer 216, and the conductive material 218, the portions of the hard mask layer 222 disposed on the CESL 160 and the first ILD layer 162, and the portions of the hard mask layer 222 disposed on the spacers 140, the gate dielectric layers 166, and the cap layers 169 are treated, while the portions of the hard mask layer 222 disposed on the side surfaces of the CESL 160 are not treated. After the treatment process, the hard mask layer 222 includes treated portions 226, 228 and untreated portions 224, as shown in FIG. 12M. Each treated portion 226 has the thickness T4, each treated portion 228 has the thickness T5, and each untreated portion 224 has the thickness T6. The untreated portions 224 include a porous dielectric material, such as porous SiN, and the treated portions 226, 228 include a dielectric material implanted with an impurity, such as Ar, Ge, B, As, or any suitable impurity. The treated portions 226, 228 and the untreated portions 224 have different etch selectivity. The treated portions 226, 228 each includes a dielectric material, such as SiN, and is doped with a dopant, such as Ar, Ge, B, or As.

As shown in FIG. 12N, the untreated portions 224 of the hard mask layer 222 are selectively removed. The removal of the untreated portions 224 of the hard mask layer 222 may be performed by any suitable process. In some embodiments, a wet etching process is performed to remove the untreated portions 224. The wet etching process does not substantially affect the treated portions 226, 228 of the hard mask layer 222 and the CESL 160. As shown in FIG. 12O, a hard mask layer 230 is formed in the openings 220 (FIG. 12N) and on the treated portions 226 of the hard mask layer 222. The hard mask layer 230 may include a material different from the treated portions 226, 228 of the hard mask layer 222. In some embodiments, the hard mask layer 230 includes the same material as the first ILD layer 162. The hard mask layer 230 includes SiCO, $SiO_2$, SiC, SiCON, SiN, SiCN, or a low-K dielectric material. In some embodiments, the hard mask layer 230 includes SiCO.

As shown in FIG. 12P, a planarization process is performed to expose the treated portions 226 of the hard mask layer 222. The planarization process may be a CMP process, and the portion of the hard mask layer 230 disposed on the treated portions 226 of the hard mask layer 222 are removed by the CMP process. As a result of the CMP process, the top surfaces 225 of the treated portions 226 and the top surfaces 229 of the hard mask layers 230 may be substantially coplanar. As shown in FIG. 12Q, an etch stop layer 232 is formed on the treated portions 226 and the hard mask layer 230, and an ILD layer 234 is formed on the etch stop layer 232. The etch stop layer 232 may include the same material as the CESL 160, and the ILD layer 234 may include the same material as the first ILD layer 162. In some embodiments, the ILD layer 234 includes the same material as the hard mask layer 230. In some embodiments, the ILD layer 234 includes a material different from the hard mask layer 230 and the treated portions 226, and the etch stop layer 232 is not present, as shown in FIG. 12R.

As shown in FIG. 12S, an opening 236 is formed in the ILD layer 234 and the etch stop layer 232. The openings 236 may be formed by one or more etching processes. For example, the opening 236 may be formed by removing a portion of the ILD layer 234 to expose a portion of the etch stop layer 232 by a first etching process, removing the exposed portion of the etch stop layer 232 to expose portions of the hard mask layer 230 and a treated portion 226 of the hard mask layer 222 by a second etch process, and removing the exposed treated portion 226 by a third etch process. Because the treated portion 226 and the hard mask layer 230 include different materials having different etch selectivity, the third etch process does not substantially affect the exposed portions of the hard mask layer 230. As a result, the opening 236 does not extend to a level close to the gate electrode layer 168. In some embodiments, the opening 236 is formed by a dual-damascene process. For example, the opening 236 includes an upper portion 238 and a lower portion 240. The upper portion 238 may be formed in the ILD layer 234 and the etch stop layer 232, and the upper portion 238 may be a trench. The lower portion 240 may be formed in a portion of the treated portion 226 of the hard mask layer 222, and the lower portion 240 may be a via. The opening 236 exposes the conductive material 218, the glue layer 216, and the liner 214. As shown in FIG. 12T, a conductive material 239 is formed in the opening 236. The conductive material 239 may include the same material as the conductive material 218 and may be formed by the same process as the conductive material 218. The conductive material 239 may be in contact with the conductive material 218, which is electrically connected to the S/D epitaxial feature 152 (FIG. 10B) or the S/D epitaxial features 154 (FIG. 10C). The conductive material 239 provides electrical path for the S/D epitaxial feature 152 (FIG. 10B) or the S/D epitaxial feature 154 (FIG. 10C) to an interconnect structure (not shown) disposed over the semiconductor device structure 200. Because the opening 236 (FIG. 12S) does not extend to a level close to the gate electrode layer 168, the conductive material 239 is not close to the gate electrode layer 168. As a result, the risk of having a short circuit is substantially reduced.

In order to electrically connect the gate electrode layer 168 to the interconnect structure (not shown), an opening 242 is formed in the ILD layer 234, the etch stop layer 232, the hard mask layer 230, and the treated portion 228 of the hard mask layer 222 to expose the cap layer 169, which is in contact with the gate electrode layer 168, as shown in FIG. 12U. The opening 242 and the opening 236 (FIG. 12S) may be offset along the Y-axis. The openings 242 may be formed by one or more etching processes. For example, the opening 242 may be formed by removing a portion of the ILD layer 234 to expose a portion of the etch stop layer 232 by a first etching process, removing the exposed portion of the etch stop layer 232 to expose a portion of the hard mask layer 230 and the treated portions 226 of the hard mask layer 222 by a second etch process, removing the exposed portion of the hard mask layer 230 to expose a treated portion 228 of the hard mask layer 222 by a third etch process, and removing the exposed treated portion 228 of the hard mask layer 222 to expose the cap layer 169 by a fourth etch process. Because the treated portion 226 and the hard mask layer 230 include different materials having different etch selectivity, the third etch process does not substantially affect the exposed treated portions 226 of the hard mask layer 222. Furthermore, because the treated portion 226 is substantially thicker than the treated portion 228, the fourth etch process removes a small portion of the treated portions 226 in addition to removing the treated portion 228. As a result, the opening 242 does not extend to a level close to the conductive material 218. In some embodiments, the opening 242 is formed by a dual-damascene process. For example, the opening 242 includes an upper portion 244 and a lower portion 246. The upper portion 244 may be formed in the ILD layer 234 and the etch stop layer 232, and the upper portion 244 may be a trench. The lower portion 246 may be formed in the hard mask layer 230 and the treated portion 228 of the hard mask layer 222, and the lower portion 246 may be a via. The opening 242 exposes the cap layer 169. As shown in FIG. 12V, a conductive material 248 is formed in the opening 242. The conductive material 248 may include the same material as the conductive material 218 and may be formed by the same process as the conductive material 218. The conductive material 248 may be in contact with the cap layer 169, which is in contact with the gate electrode layer 168. The conductive material 248 may be a gate contact. The conductive material 248 provides electrical path for the gate electrode layer 168 to the interconnect structure (not shown) disposed over the semiconductor device structure 200. Because the opening 242 (FIG. 12U) does not extend to a level close to the conductive material 218, the conductive material 248 is not close to the conductive material 248. As a result, the risk of having a short circuit is substantially reduced.

In some embodiments, the opening 236 exposes a plurality of portions of the conductive material 218, as shown in FIG. 12W. The upper portion 238 formed in the ILD layer 234 and the etch stop layer 232 exposes a plurality of treated portions 226 of the hard mask layer 222, and then portions of the exposed plurality of treated portions 226 are removed to form the plurality of lower portions 240 to expose the plurality of portions of the conductive material 218. As shown in FIG. 12X, the conductive material 239 is in contact with the plurality of portions of the conductive material 218. As a result, multiple S/D epitaxial features 152 (FIG. 10B) or the S/D epitaxial features 154 (FIG. 10C) are electrically connected to the conductive material 239. The conductive material 239 may be a rail type conductive feature.

Similarly, in some embodiments, the opening 242 exposes a plurality the cap layers 169, as shown in FIG. 12Y. The upper portion 244 formed in the ILD layer 234 and the etch stop layer 232 exposes a plurality of portions of the hard mask layer 230, and then portions of the exposed plurality of portions of the hard mask layer 230 are removed to form the plurality of lower portions 246 to expose the plurality of cap layers 169. As shown in FIG. 12Z, the conductive material 248 is in contact with the plurality of cap layers 169. As a result, multiple gate electrode layers 168 are electrically connected to the conductive material 248. The conductive material 248 may be a rail type conductive feature.

The present disclosure in various embodiments provides a semiconductor device structure and methods of forming the same. In some embodiments, the structure includes a treated portion 226 of a hard mask layer 222 disposed over a S/D epitaxial feature 152 (or S/D epitaxial feature 154) and a hard mask layer 230 disposed over a gate electrode layer 168. The treated portion 226 has different etch selectivity compared to the hard mask layer 230. Furthermore, a liner 214 is formed to replace a portion of a CESL 160, and the liner 214 has a lower K value compared to the CESL 160. Some embodiments may achieve advantages. For example, the treated portion 226 and the hard mask layer 230 having different etch selectivity may lead to minimizing a short circuit. In addition, the liner 214 has a lower K value than the CESL 160, and parasitic capacitance may be reduced.

An embodiment is a semiconductor device structure. The structure includes a gate electrode layer disposed over a substrate, a source/drain epitaxial feature disposed over the substrate, a first hard mask layer disposed over the gate electrode layer, and a contact etch stop layer (CESL) disposed over the source/drain epitaxial feature. The contact etch stop layer is disposed adjacent and in contact with the first hard mask layer. The structure further includes a first interlayer dielectric (ILD) layer disposed on the CESL and a first treated portion of a second hard mask layer disposed on the CESL and the first ILD layer. A top surface of the first hard mask layer and a top surface of the first treated portion of the second mask layer are substantially coplanar. The structure further includes an etch stop layer disposed on the first hard mask layer and the first treated portion of the second mask layer.

Another embodiment is a semiconductor device structure. The structure includes a gate electrode layer disposed over a substrate, a first hard mask layer disposed over the gate electrode layer, a first source/drain epitaxial feature disposed over the substrate, and a contact etch stop layer (CESL) disposed over the first source/drain epitaxial feature. The CESL is in contact with the first hard mask layer. The structure further includes an interlayer dielectric (ILD) layer disposed on the CESL and a first treated portion of a second hard mask layer disposed on the CESL and the ILD layer. The first treated portion of the second hard mask layer includes a dielectric material doped with Ar, Ge, B, or As, and the first treated portion of the second hard mask layer is in contact with the first hard mask layer. The structure further includes an etch stop layer disposed on the first hard mask layer and the first treated portion of the second hard mask layer.

A further embodiment is a method. The method includes forming a contact etch stop layer (CESL) over a source/drain epitaxial feature and between two sacrificial gate electrode layers, forming a first interlayer dielectric (ILD) layer on the CESL, replacing the two sacrificial gate electrode layers with two gate electrode layers, removing the first ILD layer, removing the CESL, forming a liner over the source/drain epitaxial feature and between the two gate electrode layers, removing a portion of the liner disposed over the source/drain epitaxial feature, forming a conductive material between remaining portions of the liner, forming a first hard mask layer over the two gate electrode layers, the liner, and the first conductive material, performing a treatment process to form first treated portions of the first hard mask layer, second treated portions of the first hard mask layer, and untreated portions of the first hard mask layer, removing the untreated portions of the first hard mask layer, and forming a second hard mask layer over the gate electrode layers. The second hard mask layer is in contact with the liner, the first treated portions of the first hard mask layer, and the second treated portions of the first hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a contact etch stop layer (CESL) over a source/drain epitaxial feature and between two sacrificial gate electrode layers;
   forming a first interlayer dielectric (ILD) layer on the CESL;
   replacing the two sacrificial gate electrode layers with two gate electrode layers;
   removing the first ILD layer;
   removing the CESL;
   forming a liner over the source/drain epitaxial feature and between the two gate electrode layers;
   removing a portion of the liner disposed over the source/drain epitaxial feature;
   forming a conductive material between remaining portions of the liner;
   forming a first hard mask layer over the two gate electrode layers, the liner, and the conductive material;
   performing a treatment process to form first treated portions of the first hard mask layer, second treated portions of the first hard mask layer, and untreated portions of the first hard mask layer;
   removing the untreated portions of the first hard mask layer; and
   forming a second hard mask layer over the gate electrode layers, wherein the second hard mask layer is in contact with the liner, the first treated portions of the first hard mask layer, and the second treated portions of the first hard mask layer.

2. The method of claim 1, wherein the treatment process comprises a plasma treatment process that forms dopants in portions of the first hard mask layer.

3. The method of claim 2, wherein the plasma treatment process is a directional plasma treatment process.

4. The method of claim 1, wherein the first hard mask layer is a non-conformal layer.

5. A method, comprising:
   depositing a conductive material, wherein the conductive material is electrically connected to a source/drain epitaxial feature;
   recessing the conductive material to form a recessed conductive material;
   depositing a first hard mask layer over a gate electrode layer and the recessed conductive material, wherein the first hard mask layer comprises a first portion formed over the gate electrode layer and a second portion formed over the recessed conductive material, the first portion has a first thickness, and the second portion has a second thickness greater than the first thickness;
   performing a treatment process on the first and second portions of the first hard mask layer;
   removing a third portion of the first hard mask layer; and
   forming a second hard mask layer over first portion of the first hard mask layer, wherein the second hard mask layer has a top surface coplanar with a top surface of the second portion of the first hard mask layer.

6. The method of claim 5, wherein the treatment process comprises a plasma treatment process that forms dopants in the first and second portions of the first hard mask layer.

7. The method of claim 6, wherein the dopants comprise Ar, Ge, B, or As.

8. The method of claim 5, further comprising depositing a liner, wherein the conductive material is deposited over the liner.

9. The method of claim 8, wherein the third portion of the first hard mask layer is adjacent the liner.

10. The method of claim 9, wherein the third portion has a third thickness is less than the second thickness.

11. The method of claim 5, wherein the third portion of the first hard mask layer is removed by a wet etching process.

12. The method of claim 5, wherein the first and second hard mask layers comprise different materials.

13. The method of claim 12, further comprising selectively removing the second portion of the first hard mask layer to expose the conductive material.

14. The method of claim 12, further comprising selectively removing the second hard mask layer to expose the first portion of the first hard mask layer.

15. A method, comprising:
   forming first and second gate electrode layers;
   depositing a first mask layer on the first gate electrode layer and a second mask layer on the second gate electrode layer;
   forming a first opening between the first and second gate electrode layers, wherein the first and second mask layers are exposed;
   forming a first liner adjacent the first mask layer and a second liner adjacent the second mask layer, wherein the first and second liners comprise a first material, and the first and second mask layers comprise a second material different from the first material;
   depositing a conductive material in the opening;
   selectively removing the first mask layer to form a second opening;
   depositing a third mask layer in the second opening;
   performing a treatment process on the third mask layer to form treated portions;
   removing untreated portions of the third mask layer; and
   depositing a fourth mask layer in the second opening.

16. The method of claim 15, wherein the treated portions of the third mask layer and the fourth mask layer comprise different materials.

17. The method of claim 15, further comprising selectively removing a portion of the treated portions of the third mask layer to expose the conductive material.

18. The method of claim 15, further comprising selectively removing the fourth mask layer to expose a portion of the treated portions of the third mask layer.

19. The method of claim 18, further comprising removing the exposed portion of the treated portions.

20. The method of claim 15, wherein the third mask layer is a non-conformal layer.

* * * * *